(12) United States Patent
Gohara et al.

(10) Patent No.: US 12,219,266 B2
(45) Date of Patent: *Feb. 4, 2025

(54) ELECTRONIC DEVICE, IMAGING DEVICE, AND IMAGING ELEMENT FOR CAPTURING AN IMAGE

(71) Applicant: NIKON CORPORATION, Tokyo (JP)

(72) Inventors: Koichi Gohara, Kawasaki (JP); Satoshi Tsuchiya, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/244,539

(22) Filed: Sep. 11, 2023

(65) Prior Publication Data
US 2023/0421911 A1 Dec. 28, 2023

Related U.S. Application Data

(60) Continuation of application No. 16/935,291, filed on Jul. 22, 2020, now Pat. No. 11,785,345, which is a
(Continued)

(30) Foreign Application Priority Data

Nov. 26, 2013 (JP) .................................. 2013-243946
Jan. 20, 2014 (JP) .................................. 2014-007869

(51) Int. Cl.
H04N 23/73 (2023.01)
H01L 27/146 (2006.01)
(Continued)

(52) U.S. Cl.
CPC ....... H04N 23/73 (2023.01); H01L 27/14621 (2013.01); H01L 27/14627 (2013.01);
(Continued)

(58) Field of Classification Search
CPC ........ H04N 23/73; H04N 23/12; H04N 23/63; H04N 23/673; H04N 23/84; H04N 25/134;
(Continued)

(56) References Cited

U.S. PATENT DOCUMENTS 5,329,109 A 7/1994 Kodama
5,452,004 A 9/1995 Roberts
(Continued)

FOREIGN PATENT DOCUMENTS

CN 102104738 A 6/2011
CN 102131051 A 7/2011
(Continued)

OTHER PUBLICATIONS

Feb. 3, 2015 International Search Report issued in International Patent Application No. PCT/JP2014/081275.
(Continued)

Primary Examiner — Padma Haliyur
(74) Attorney, Agent, or Firm — Oliff PLC

(57) ABSTRACT

An electronic device includes: an imaging unit including a region having a pixel group that has a plurality of first pixels, and second pixels that are fewer than the first pixels in the pixel group; and a control unit that reads out the signals based upon exposure of the second pixels during exposure of the plurality of first pixels.

92 Claims, 23 Drawing Sheets

Related U.S. Application Data division of application No. 15/926,466, filed on Mar. 20, 2018, now Pat. No. 10,757,341, which is a division of application No. 15/038,744, filed as application No. PCT/JP2014/081275 on Nov. 26, 2014, now Pat. No. 9,961,271.

(51) Int. Cl.
| | |
|---|---|
| H04N 23/12 | (2023.01) |
| H04N 23/63 | (2023.01) |
| H04N 23/67 | (2023.01) |
| H04N 23/84 | (2023.01) |
| H04N 25/13 | (2023.01) |
| H04N 25/44 | (2023.01) |
| H04N 25/79 | (2023.01) |

(52) U.S. Cl.
CPC .. *H01L 27/14634* (2013.01); *H01L 27/14636* (2013.01); *H01L 27/1464* (2013.01); *H01L 27/14645* (2013.01); *H04N 23/12* (2023.01); *H04N 23/63* (2023.01); *H04N 23/673* (2023.01); *H04N 23/84* (2023.01); *H04N 25/134* (2023.01); *H04N 25/44* (2023.01); *H04N 25/79* (2023.01)

(58) Field of Classification Search
CPC .. H04N 25/44; H04N 25/79; H01L 27/14621; H01L 27/14627; H01L 27/14634; H01L 27/14636; H01L 27/1464; H01L 27/14645
See application file for complete search history.

(56) References Cited

U.S. PATENT DOCUMENTS

| | | |
|---|---|---|
| 7,102,675 B1 | 9/2006 | Tokunaga |
| 2002/0003581 A1 | 1/2002 | Sato et al. |
| 2006/0244841 A1 | 11/2006 | Ikeda |
| 2007/0195182 A1 | 8/2007 | Ito |
| 2008/0043114 A1 | 2/2008 | Sung et al. |
| 2009/0225189 A1 | 9/2009 | Morin |
| 2009/0278966 A1 | 11/2009 | Kusaka |
| 2009/0284633 A1 | 11/2009 | Sakane |
| 2010/0002940 A1 | 1/2010 | Aoki et al. |
| 2010/0053346 A1 | 3/2010 | Mitsunaga |
| 2010/0245647 A1* | 9/2010 | Honda .......... H04N 25/76 348/308 |
| 2011/0037888 A1 | 2/2011 | Onuki |
| 2011/0141333 A1 | 6/2011 | Naruse et al. |
| 2011/0149129 A1 | 6/2011 | Kim et al. |
| 2012/0050559 A1 | 3/2012 | Hasegawa |
| 2012/0169908 A1 | 7/2012 | Kaneo et al. |
| 2012/0262609 A1* | 10/2012 | Kikuchi .......... H04N 25/134 348/E9.037 |
| 2013/0113971 A1* | 5/2013 | Okada .......... H04N 25/767 348/308 |
| 2013/0176468 A1 | 7/2013 | Ono |
| 2013/0293736 A1 | 11/2013 | Kuwazoe |
| 2013/0300905 A1 | 11/2013 | Mabuchi et al. |
| 2013/0308044 A1 | 11/2013 | Mitsunaga |
| 2014/0168463 A1 | 6/2014 | Tamura |
| 2015/0077590 A1 | 3/2015 | Kuriyama et al. |
| 2015/0256745 A1 | 9/2015 | Oniki et al. |
| 2015/0350555 A1 | 12/2015 | Nishi |
| 2015/0381910 A1 | 12/2015 | Kuriyama |
| 2016/0014359 A1 | 1/2016 | Ota |
| 2016/0112644 A1 | 4/2016 | Nishi |
| 2016/0127669 A1 | 5/2016 | Yamazaki |
| 2016/0316132 A1 | 10/2016 | Kinoshita |

FOREIGN PATENT DOCUMENTS

| | | |
|---|---|---|
| EP | 1 641 249 A1 | 3/2006 |
| JP | H05-316432 A | 11/1993 |
| JP | H09-145475 A | 6/1997 |
| JP | H11-205694 A | 7/1999 |
| JP | 2000-078484 A | 3/2000 |
| JP | 2002-027326 A | 1/2002 |
| JP | 2004-048242 A | 2/2004 |
| JP | 2006-049361 A | 2/2006 |
| JP | 2007-228019 A | 9/2007 |
| JP | 2009-246757 A | 10/2009 |
| JP | 2010-016621 A | 1/2010 |
| JP | 2010-166396 A | 7/2010 |
| JP | 2011-50016 A | 3/2011 |
| JP | 2011-071647 A | 4/2011 |
| JP | 2012-54724 A | 3/2012 |
| JP | 2012-175234 A | 9/2012 |
| JP | 2012-204938 A | 10/2012 |
| WO | 2013/164915 A1 | 11/2013 |

OTHER PUBLICATIONS

May 31, 2016 International Preliminary Report on Patentability issued in International Patent Application No. PCT/JP2014/081275.
Jun. 16, 2017 Office Action Issued In U.S. Appl. No. 15/038,744.
Jul. 10, 2017 Search Report issued in European Patent Application No. 14866405.5.
Dec. 12, 2017 Office Action issued in Japanese Patent Application No. 2013-243946.
Feb. 27, 2018 Office Action issued in Japanese Patent Application No. 2014-007869.
Dec. 20, 2017 Notice of Allowance issued in U.S. Appl. No. 15/038,744.
Jun. 5, 2018 Office Action issued in Chinese Patent Application No. 201480074080.3.
Mar. 22, 2019 Office Action issued in Chinese Patent Application No. 201480074080.3.
Sep. 3, 2019 Office Action issued in European Patent Application No. 14866405.5.
Sep. 30, 2019 Office Action issued in Indian Patent Application No. 201617021325.
Oct. 31, 2019 Office Action issued in U.S. Appl. No. 15/926,466.
Sep. 24, 2019 Office Action issued in Chinese Patent Application No. 201480074080.3.
Dec. 3, 2019 Office Action issued in Japanese Patent Application No. 2018-189317.
Apr. 21, 2020 Notice of Allowance issued in U.S. Appl. No. 15/926,466.
Apr. 29, 2020 Office Action issued in European Patent Application No. 14866405.5.
Apr. 9, 2019 Office Action issued in U.S. Appl. No. 15/926,466.
Jul. 23, 2020 Corrected Notice of Allowability issued in U.S. Appl. No. 15/926,466.
Sep. 1, 2020 Office Action issued in Japanese Patent Application No. 2018-189317.
Feb. 22, 2021 Office Action issued in European Patent Application No. 14866405.5.
May 19, 2022 Office Action issued in Chinese Patent Application No. 202010698319.1.
May 24, 2022 Office Action issued in Japanese Patent Application No. 2021-078296.
Aug. 10, 2022 Summons to Attend Oral Proceedings Pursuant to Rule 115(1) EPC issued in European Patent Application No. 14866405.5.
Dec. 15, 2022 Office Action issued in Chinese Patent Application No. 202010698319.1.
Jan. 2, 2023 Office Action issued in European Patent Application No. 14866405.5.
Jun. 7, 2023 Notice of Allowance issued in U.S. Appl. No. 16/935,291.
Mar. 18, 2022 Office Action issued in U.S. Appl. No. 16/935,291.
Mar. 5, 2024 Office Action issued in Japanese Patent Application 2023-022492.

* cited by examiner

FIG.1
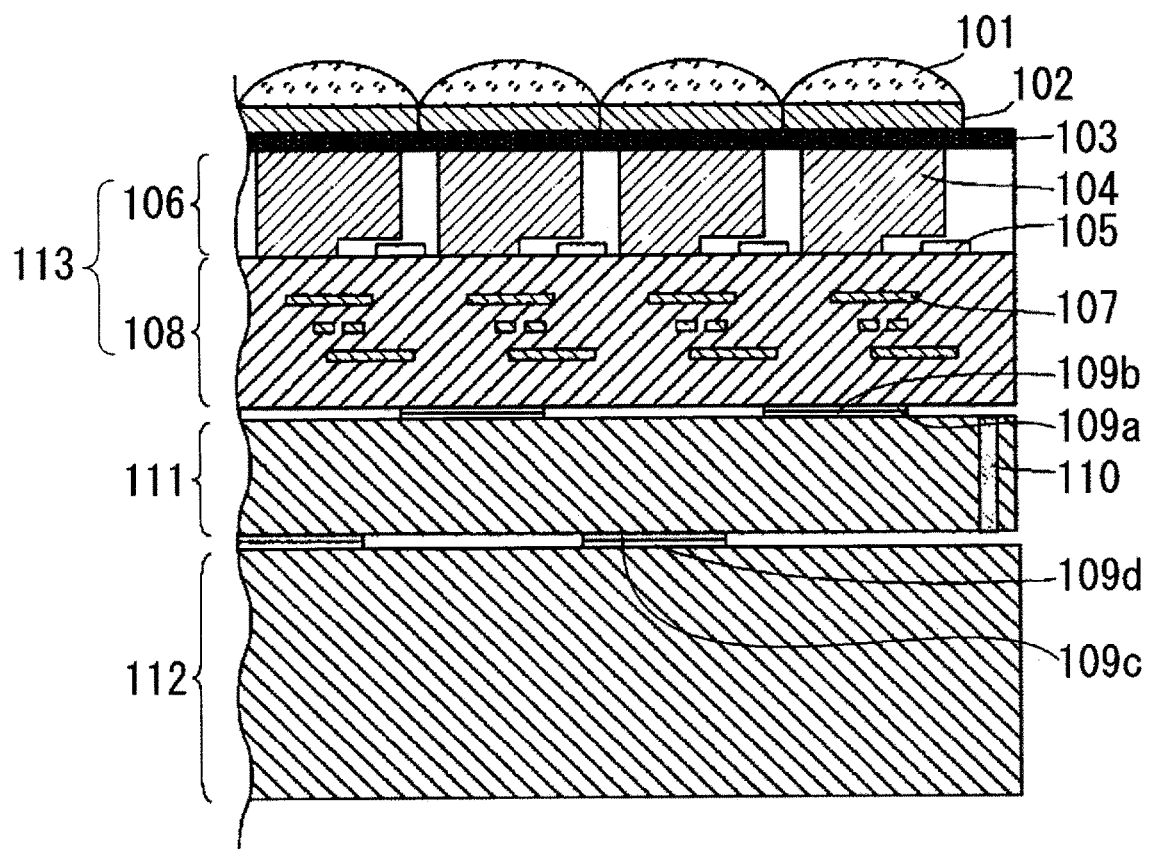
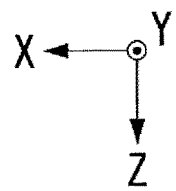

FIG.9
(a)
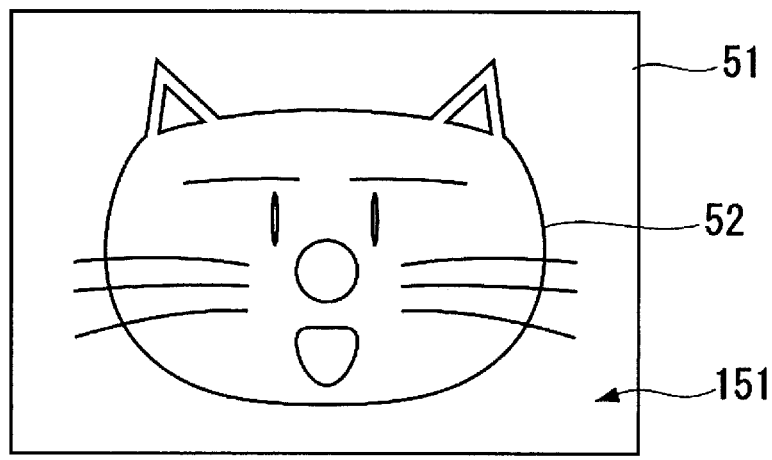
(b)
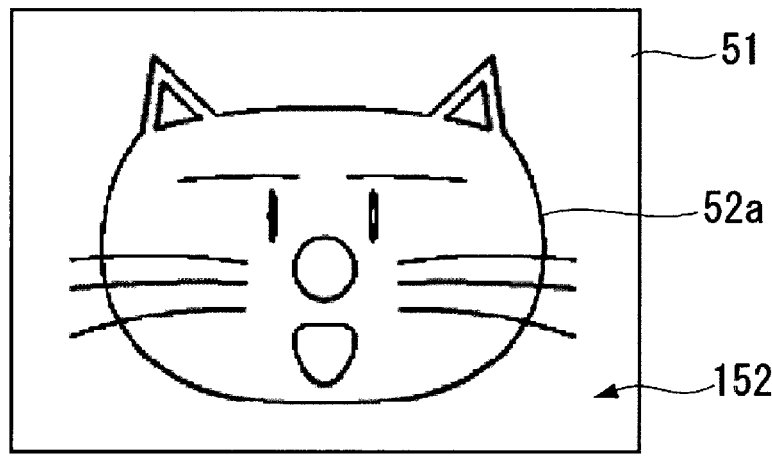

FIG.11
(a)
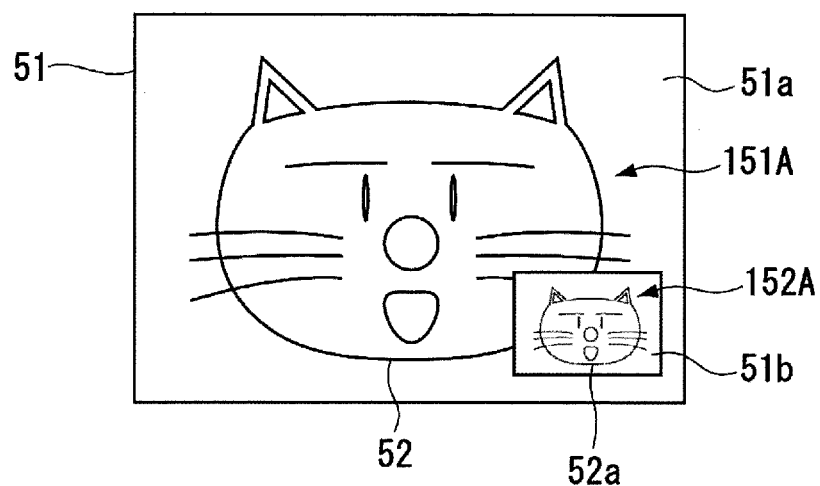
(b)
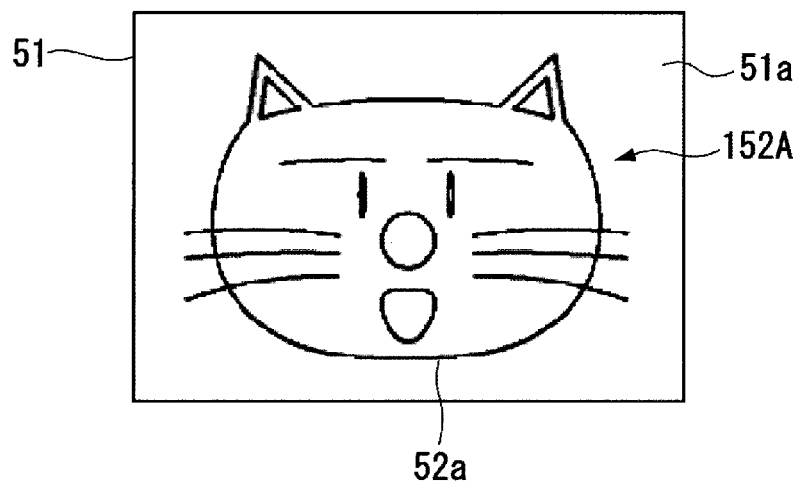

FIG.12
(a)
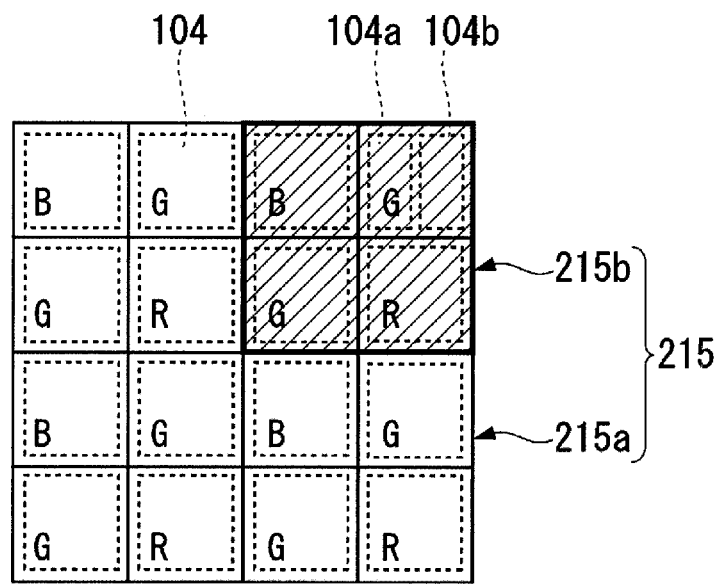
(b)
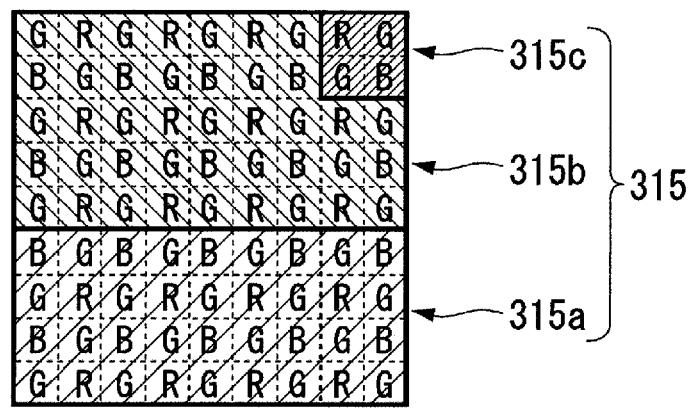

FIG.21

| TIMING | TIME INTERVAL FOR ACCUMULATION BY IMAGE CAPTURE CHIP 113 | SIGNAL FROM DMUX 413 | SIGNAL FROM CALCULATION CIRCUIT 415 |
|---|---|---|---|
| WHEN t1 ELAPSED | (t1−t0) | a | A (=a) |
| WHEN t2 ELAPSED | (t2−t1) | b | B (=a+b) |
| WHEN t3 ELAPSED | (t3−t2) | c | C (=B+c) |
| WHEN t4 ELAPSED | (t4−t3) | d | D (=C+d) |
| ⋮ | ⋮ | ⋮ | ⋮ |
| WHEN t8 ELAPSED | (t8−t7) | h | H (=G+h) |

ELECTRONIC DEVICE, IMAGING DEVICE, AND IMAGING ELEMENT FOR CAPTURING AN IMAGE

CROSS-REFERENCE TO RELATED APPLICATIONS

This is a Continuation of U.S. application Ser. No. 16/935,291 filed on Jul. 22, 2020, which is a Division of application Ser. No. 15/926,466 filed Mar. 20, 2018, which in turn is a Division of application Ser. No. 15/038,744 filed Dec. 20, 2016, which in turn is a National Stage of PCT/JP2014/081275 filed Nov. 26, 2014, which claims the benefit of Japanese Patent Application No. 2014-007869 filed Jan. 20, 2014 and Japanese Patent Application No. 2013-243946 filed Nov. 26, 2013. The disclosures of the prior applications are hereby incorporated by reference herein in their entireties.

TECHNICAL FIELD

The present invention relates to an electronic device, to an imaging device, and to an imaging element.

BACKGROUND ART

An electronic device that incorporates an imaging element in which an image capture chip of the backside-illumination type and a signal processing chip are laminated together (hereinafter, such an imaging element will be termed a "laminated type imaging element") has been proposed (for example, refer to Patent Document #1). In such a laminated type imaging element, the backside-illumination type image capture chip and the signal processing chip are laminated together so as to be connected via micro-bumps into block units each consisting of a plurality of pixels.

Furthermore, an imaging device is per se known (refer to Patent Document #2) in which a photoelectric conversion unit for image acquisition and a photoelectric conversion unit for luminance evaluation are provided to an imaging element, and in which an image signal is output from the photoelectric conversion unit for image acquisition when the total summed value of signals that are repeatedly output from this photoelectric conversion unit for luminance evaluation reaches a predetermined value.

CITATION LIST

Patent Literature

Patent Document #1: Japanese Laid-Open Patent Publication 2006-49361.
Patent Document #2: Japanese Laid-Open Patent Publication 2012-204938.

SUMMARY OF INVENTION

Technical Problem

However, with an electronic device that is equipped with such a prior art laminated type imaging element, there have not been many proposals for acquisition of images by capturing images with the plurality of block units, and, for example, if image capture of a still image or of a movie image or the like is performed by using the entire area of the image capture region, then it has been difficult to generate an image for display. Due to this, the convenience of use of an electronic device equipped with a laminated type imaging element has not been adequate.

Furthermore, with a prior art imaging device, it has been difficult to apply this structure to a case in which the image is divided into blocks each having one or two or more of the regions described above and a captured image for each of these blocks is acquired.

Solution to Technical Problem

According to the 1st aspect of the present invention, an electronic device comprises: an imaging unit including a region having a pixel group that has a plurality of first pixels, and second pixels that are fewer than the first pixels in the pixel group; and a control unit that reads out the signals based upon exposure of the second pixels during exposure of the plurality of first pixels.

According to the 2nd aspect of the present invention, the electronic device according to the 1st aspect may further comprise: a first readout unit that reads out signals from the plurality of first pixels in the pixel group; and a second readout unit that reads out signals from the second pixels.

According to the 3rd aspect of the present invention, it is preferred that in the electronic device according to the 1st or 2nd aspect, the imaging unit includes plurally the regions.

According to the 4th aspect of the present invention, it is preferred that in the electronic device according to any one of the 1st through 3rd aspects, the control unit displays signals read out from the second pixels upon a display unit.

According to the 5th aspect of the present invention, it is preferred that in the electronic device according to the 4th aspect, the image displayed upon the display unit is a live view image.

According to the 6th aspect of the present invention, it is preferred that in the electronic device according to any one of the 1st through 3rd aspect, the control unit controls an exposure time interval of the plurality of first pixels based upon the signals read out from the second pixels.

According to the 7th aspect of the present invention, it is preferred that in the electronic device according to the 6th aspect, the control unit controls the exposure time interval of the plurality of first pixels based upon a luminance obtained from the signals read out from the second pixels.

According to the 8th aspect of the present invention, an electronic device comprises: an imaging unit including a first region having a plurality of pixels, and a second region having at least a single pixel fewer than in the first region; and a control unit that reads out a signal based upon exposure of the pixels in the second region during exposure of the plurality of pixels in the first region.

According to the 9th aspect of the present invention, the electronic device according to the 8th aspect may further comprise: a first readout unit that reads out signals from the plurality of first pixels in the first region; and a second readout unit that reads out signals from the pixels in the second region.

According to the 10th aspect of the present invention, it is preferred that in the electronic device according to the 8th or 9th aspect, the imaging unit has plurally the first regions and plurally the second regions.

According to the 11th aspect of the present invention, it is preferred that in the electronic device according to any one of the 8th through 10th aspects, the control unit displays signals read out from the pixels in the second region upon a display unit.

According to the 12th aspect of the present invention, it is preferred that in the electronic device according to the 11th aspect, the image upon the display unit is a live view image.

According to the 13th aspect of the present invention, it is preferred that in the electronic device according to any one of the 8th through 10th aspect, the control unit controls an exposure time interval of the plurality of pixels in the first region based upon the signals read out from the pixels in the second region.

According to the 14th aspect of the present invention, it is preferred that in the electronic device according to the 13th aspect, the control unit controls the exposure time interval of the plurality of first pixels based upon a luminance obtained from the signals read out from the pixels in the second region.

According to the 15th aspect of the present invention, an electronic device comprises: an imaging unit that is capable of capturing an image from a first region and an image from monitoring regions that are plurally arranged separately along a first direction and along a second direction, with each of the monitoring regions being smaller than the first region; and a control unit that makes timing at which charges accumulated in the first region are read out and timing at which charges accumulated in the monitoring region are read out be different.

According to the 16th aspect of the present invention, it is preferred that in the electronic device according to the 15th aspect, the control unit performs reading out of charge accumulated in the monitoring region in case that reading out of the first region cannot be performed.

According to the 17th aspect of the present invention, it is preferred that in the electronic device according to the 15th or 16th aspect, the control unit performs reading out of charge accumulated in the monitoring region during a reset of the first region.

According to the 18th aspect of the present invention, it is preferred that in the electronic device according to any one of the 15th through 17th aspects, the imaging unit captures an image of a light flux passed through an image capture optical system; and a focus detection pixel that, provided in the monitoring region, detects the focal point of the image capture optical system.

According to the 19th aspect of the present invention, it is preferred that in the electronic device according to any one of the 15th through 18th aspects, the monitoring region has R pixels, G pixels, and B pixels.

According to the 20th aspect of the present invention, the electronic device according to any one of the 15th through 19th aspects may further comprise: a display device that is capable of displaying a first image that is captured by the first region and a second image that is captured by the monitoring region.

According to the 21st aspect of the present invention, the electronic device according to the 20th aspect may further comprise: a display unit that, while the electronic device is performing long timing photography, displays upon the display device a second image that is captured by the monitoring region.

According to the 22nd aspect of the present invention, the electronic device according to the 20th aspect may further comprise: a display control unit that displays a second image that is captured by the monitoring unit as superimposed upon the first image that is being displayed upon the display device.

According to the 23rd aspect of the present invention, it is preferred that in the electronic device according to any one of the 15th through 22nd aspects, each of the monitoring regions is disposed separately with regularity.

According to the 24th aspect of the present invention, it is preferred that in the electronic device according to any one of the 15th through 23rd aspects, the imaging unit is capable of capturing images from the first region and from a second region that is different from the monitoring region; and the electronic device may further comprise: an image capture control unit that is capable of setting image capture conditions individually for each of the first and second regions and the monitoring region.

According to the 25th aspect of the present invention, an imaging device comprises: an imaging unit in which a plurality of photoelectric conversion units are arranged; a control unit that subdivides the imaging unit into a plurality of area blocks each of which includes a plurality of the photoelectric conversion units, that controls the charge accumulation time intervals of the photoelectric conversion units in units of the area blocks, and that is capable of reading out accumulated signals in units of the area blocks; and a first monitoring sensor and a second monitoring sensor that are disposed at least in the first area block and the second area block respectively, and that are capable of reading out amounts of charge accumulation from the photoelectric conversion units.

According to the 26th aspect of the present invention, it is preferred that in the imaging device according to the 25th aspect, the first monitoring sensor and the second monitoring sensor are constituted by photoelectric conversion units, upon which green colored filters are disposed, within the first area block and within the second area block.

According to the 27th aspect of the present invention, it is preferred that in the imaging device according to the 25th or 26th aspect, the first monitoring sensor and the second monitoring sensor are arranged in approximate centers of the first area block and the second area block.

According to the 28th aspect of the present invention, it is preferred that in the imaging device according to any one of the 25th through 27th aspects, in case that the amount of charge accumulation by the first monitoring sensor reaches a predetermined amount of accumulation, the control unit ends the charge accumulation by the photoelectric conversion units included in the corresponding first area block.

According to the 29th aspect of the present invention, it is preferred that in the imaging device according to the 28th aspect, in case that the amount of charge accumulation by the second monitoring sensor reaches a predetermined amount of accumulation, the control unit ends the charge accumulation by the photoelectric conversion units included in the corresponding second area block.

According to the 30th aspect of the present invention, it is preferred that in the imaging device according to the 28th or 29th aspect, the control unit reads out the accumulated signals from the photoelectric conversion units in which the charge accumulation has ended by units of the area blocks.

According to the 31st aspect of the present invention, it is preferred that in the imaging device according to the 28th aspect, the control unit reads out the amount of charge accumulation from the first monitoring sensor and from the second monitoring sensor in response to release actuation.

According to the 32nd aspect of the present invention, it is preferred that in the imaging device according to the 29th aspect, for a third area block that does not include either the first monitoring sensor or the second monitoring sensor, the control unit ends the charge accumulation by the photoelectric conversion units included in the third area block on the basis of the amount of charge accumulation of at least one of the first monitoring sensor and the second monitoring sensor.

According to the 33rd aspect of the present invention, it is preferred that in the imaging device according to the 25th aspect, the first monitoring sensor and the second monitoring sensor are constituted by a plurality of the photoelectric conversion units, upon which color filters of different colors are disposed, within the first area block and within the second area block.

According to the 34th aspect of the present invention, it is preferred that in the imaging device according to the 33rd aspect, in case that the amount of charge accumulation of the first monitoring sensor reaches the predetermined amount of accumulation, the control unit ends the charge accumulation by the photoelectric conversion, which has a color filter with the same color as the color filter of the first monitoring sensor is disposed, among the photoelectric conversion units included in the first area block.

According to the 35th aspect of the present invention, an imaging element in which a plurality of photoelectric conversion units is arrayed in an imaging unit, wherein: charge accumulation time intervals of the photoelectric conversion units can be controlled in units of a plurality of area block into which the imaging unit is subdivided so that the photoelectric conversion units are plurally included in the area block; the signals accumulated in the photoelectric conversion units can be read out in units of the area block; a first monitoring sensor and a second monitoring sensor are provided to at least a first area block and to a second area block respectively; and an amount of charge accumulation obtained by the photoelectric conversion units in the first area block, and an amount of charge accumulation obtained by the photoelectric conversion units in the second area block, can be read out from the first monitoring sensor and from the second monitoring sensor, respectively.

Advantageous Effects of Invention

According to the first aspect of the present invention, it is possible to provide an electronic device whose convenience of use is good. Moreover, according to another aspect of the present invention, an appropriate exposure is obtained for each area of the image.

BRIEF DESCRIPTION OF DRAWINGS

FIG. 1 is a sectional view showing an imaging element according to an embodiment;
FIG. 9 is a figure showing an example of a screen that is displayed upon a display unit;
FIG. 11 is a figure showing an example of a screen that is displayed upon the display unit;
FIG. 12 is a figure showing a plurality of regions within a block region according to a variant embodiment;
FIG. 21 is a figure for explanation of read out timings, charge accumulation time intervals, and pixel signals read out from the imaging element via a calculation circuit.

DESCRIPTION OF EMBODIMENTS

Embodiment #1

Figure 2:
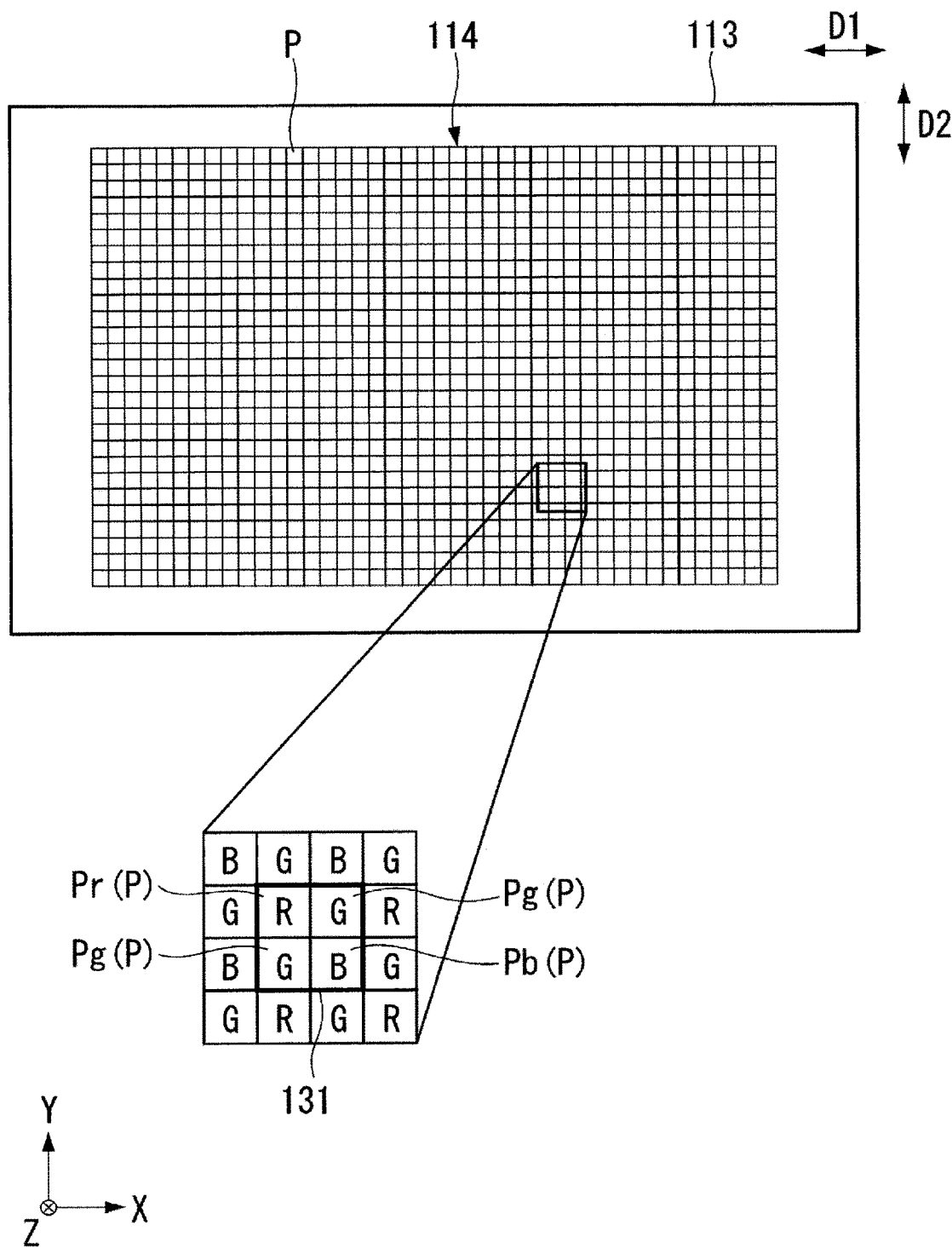
FIG. 2 is a figure for explanation of an arrangement of pixels on an image capture chip and of unit groups thereof.

In the following, a first embodiment of the present invention will be explained with reference to the drawings. However, the present invention is not to be considered as being limited thereby. Moreover, in the drawings, in some cases, in order to explain the embodiment, the scale of some portions may be changed by showing them as enlarged or accentuated or the like. It should be understood that, in the following embodiments, a lens interchangeable type digital camera will be cited as an example of an electronic device.

FIG. 1 is a sectional view showing an example of an imaging element 100. As shown in FIG. 1, this imaging element 100 comprises an image capture chip 113 that outputs pixel signals corresponding to incident light, a signal processing chip 111 that processes pixel signals output from the image capture chip 113, and a memory chip 112 that stores pixel signals that have been processed by the signal processing chip 111. The image capture chip 113, the signal processing chip 111, and the memory chip 112 are laminated together. And the image capture chip 113 and the signal processing chip 111 are electrically connected together by electrically conductive bumps 109a, 109b that are made from Cu or the like. Moreover, the signal processing chip 111 and the memory chip 112 are electrically connected together by electrically conductive bumps 109c, 109d that are made from Cu or the like.

In the following explanation of the imaging element 100, reference is made to a rectangular XYZ coordinate system that is set up as shown in FIG. 1, and the positional relationships of the various parts will be explained with reference to this rectangular XYZ coordinate system. Here, the direction in which the light is incident is taken as being the Z-axis direction, one direction within a plane orthogonal to this Z-axis direction is taken as being the X-axis direction, and the direction within this plane that is orthogonal to that X-axis direction is taken as being the Y-axis direction. It should be understood that the coordinate axes of FIG. 1 are employed as reference in FIG. 2 and in some of the subsequent figures, and that these coordinate axes are shown so that the orientations of the various figures can be determined.

The example of an image capture chip 13 in this example is an MOS image sensor of the backside-illumination type. A PD layer 106 is disposed on the rear surface of a wiring layer 108. This PD layer 106 comprises a plurality of photodiodes 104 (herein abbreviated as "PD"s) that are arranged in a two-dimensional array and that accumulate electric change according to incident light, and transistors 105 that are provided to correspond to these PDs 104.

Color filters 102 are provided upon the light-incident side of the PD layer 106 with a passivation layer 103 interposed between them. These color filters 102 are filters that pass specified wavelength regions of visible light. The color filters 102 are of a plurality of types that pass mutually different wavelength bands, and are disposed in a specific arrangement that corresponds to the arrangement of the PDs 104. The arrangement of the color filters 102 will be explained hereinafter. Each group including one of the color filters 102, one of the PDs 104, and one of the transistors 105 constitutes one pixel.

Micro-lenses 101 are provided upon the sides of the color filters 102 upon which light is incident, and correspond to the abovementioned pixels. These micro-lenses 101 condense the incident light upon their corresponding PDs 104.

The wiring layer 108 includes wiring 107 that transmits the pixel signals from the PD layer 106 to the signal processing chip 111. This wiring 107 may be multi-layered, and also could be provided with passive elements and active elements. A plurality of bumps 109a are disposed upon the front surface of the wiring layer 108. This plurality of bumps 109a are positionally aligned with a plurality of bumps 109b that are provided on the opposing face of the signal processing chip 111. And the bumps 109a and the corresponding bumps 109b that are positionally aligned therewith are joined together and are electrically connected together by the image capture chip 113 and the signal processing chip 111 being pressurized together, or the like.

In a similar manner, pluralities of bumps 109c and 109d are disposed upon the mutually opposing faces of the signal processing chip 111 and of the memory chip 112. The bumps 109c and the bumps 109d are mutually positionally aligned. And the bumps 109c and the corresponding bumps 109d that are positionally aligned therewith are joined together and are electrically connected together by the signal processing chip 111 and the memory chip 112 being pressurized together, or the like.

It should be understood that the joining between the bumps 109a and the bumps 109b, and the joining between the bumps 109c and the bumps 109d, is not limited to being Cu bump joining by solid phase diffusion; it would also be acceptable to arrange to employ micro-bump connection by solder melting. Furthermore, for example, it would also be possible to provide at least one set of bumps 109a through 109d for a single unit group that will be described hereinafter. Accordingly, it would be acceptable for the sizes of the bumps 109a through 109d to be set to be larger than the pitch of the PDs 104. Moreover it would also be possible, in peripheral regions other than the pixel region in which pixels are disposed (i.e. the image capture region 114 shown in FIG. 1), to provide larger bumps than the bumps 109a through 109d corresponding to the pixel region.

The signal processing chip 111 has a TSV 110 (Through-Silicon Via) that mutually connects together circuits provided upon its front surface and upon its rear surface respectively. This TSV 110 is provided at a peripheral region. Moreover, such a TSV 110 may be provided at a peripheral region of the image capture chip 113 and/or at an edge region of the memory chip 112.

FIG. 2 is a figure for explanation of the arrangement of pixels on the image capture chip 113, and for explanation of unit groups of those pixels. In FIG. 2, a situation is shown in which the image capture chip 113 is viewed from its rear surface side (i.e. its surface in the —Z direction).

As shown in FIG. 2, an image capture region 114 is provided upon the image capture chip 113. A plurality (for example, 20,000,000 or more) pixels P are arranged in this image capture region 114 in a matrix configuration along the X direction and the Y direction. In the following, the direction along the X direction in which the pixels P are arranged will be termed the "first direction D1", while the direction along the Y direction will be termed the "second direction D2".

An enlarged view of part of the image capture region 114 is shown in a portion of FIG. 2. As shown in this partially enlarged view, red colored pixels Pr (i.e., R pixels), green colored pixels Pg (i.e. G pixels), and blue colored pixels Pb (i.e. B pixels) are included in the image capture region 114. These three types of pixels P (i.e. the red colored pixels Pr, the green colored pixels Pg, and the blue colored pixels Pb) are arranged so as to form a so-called Bayer array.

The red colored pixels Pr are pixels having red colored filters as their color filters 102. Thus, these red colored pixels Pr receive light in the red colored wavelength band. The green colored pixels Pg are pixels having green colored filters as their color filters 102. Thus, these green colored pixels Pg receive light in the green colored wavelength band. And the blue colored pixels Pb are pixels having blue colored filters as their color filters 102. Thus, these blue colored pixels Pb receive light in the blue colored wavelength band.

As shown in FIG. 2, in the image capture region 114, four adjacent pixels in a 2×2 arrangement constitute a single unit group 131. As an example, in FIG. 2, a single red colored pixel Pr, two green colored pixels Pg, and a single blue colored pixel Pb are included in each unit group 131. It should be understood that the number of pixels that make up each unit group 131 is not particularly limited; for example, it would also be acceptable to arrange for sixteen adjacent pixels in a 4×4 arrangement to constitute a single unit group 131, or for 1024 adjacent pixels in a 32×32 arrangement to constitute a single unit group 131. Moreover, it should be understood that the number of pixels that make up each unit group 131 could also be greater than the above or less than the above.

Figure 3:
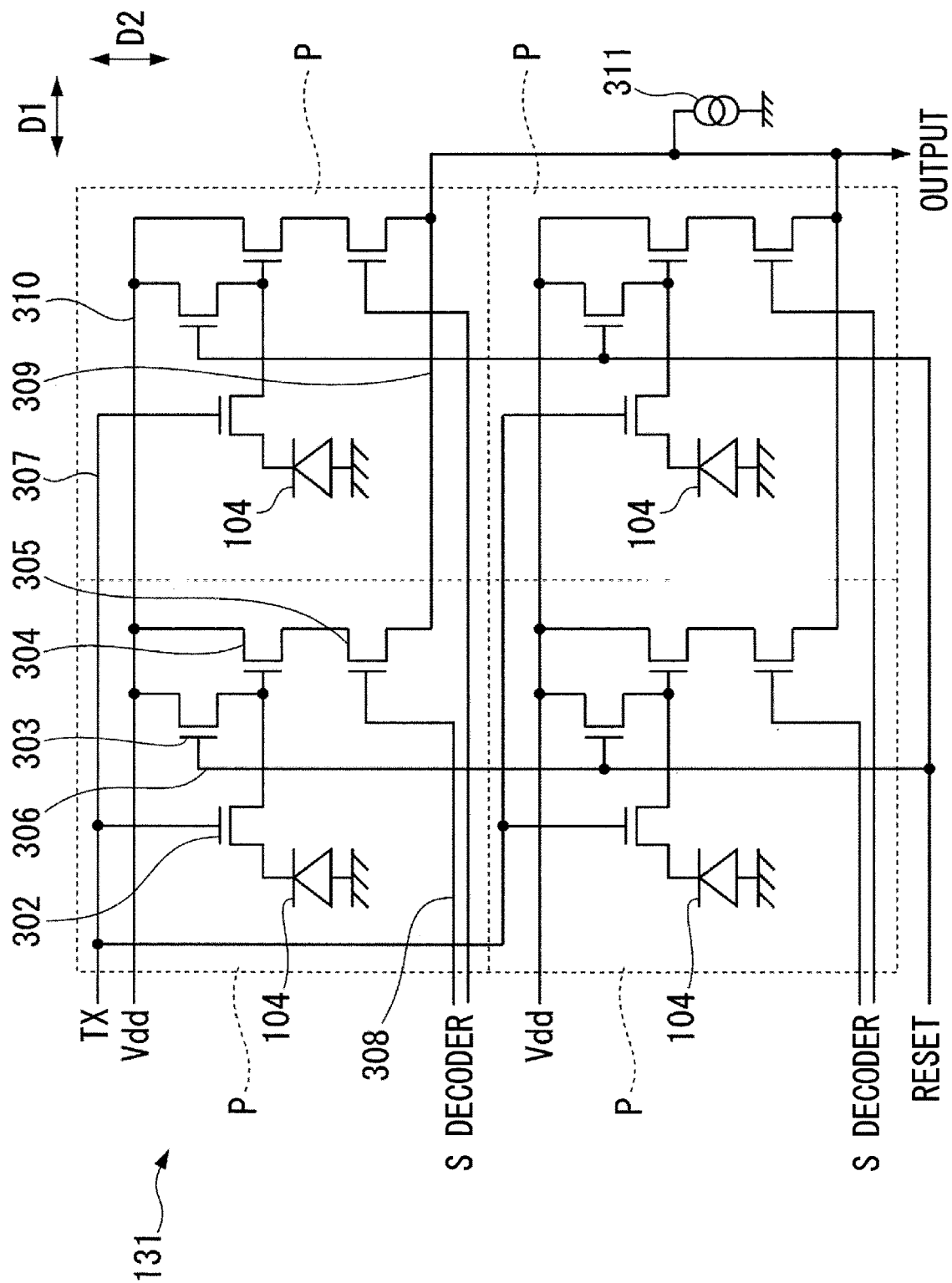
FIG. 3 is a circuit diagram corresponding to a unit group of the image capture chip.

FIG. 3 is a circuit diagram corresponding to one unit group 131 of the image capture chip 113. In FIG. 3, each rectangle surrounded by a dotted line indicates a circuit that corresponds to a single pixel P. It should be understood that, in the following explanation, at least some of the transistors correspond to the transistors 105 of FIG. 1.

As described above, the unit group 131 is formed from four pixels P. Each of the four PDs 104 that correspond respectively to these pixels P is connected to a corresponding transfer transistor 302. TX wiring 307 (a transfer section control line) that controls the transfer transistors 302 is connected to the gate of each of these transfer transistors 302. Transfer pulses are supplied to this TX wiring 307. In this embodiment, the TX wiring 307 is connected to all of the four transfer transistors 302 in common.

The drain of each of the transfer transistors 302 is connected to the source of a corresponding reset transistor 303. And a so-called floating diffusion FD (i.e. a charge detection unit) is defined between the drain of each of the transfer transistors 302 and the source of the corresponding reset transistor 303. This floating diffusion FD is connected to the gate of an amplification transistor 304.

The drain of each of the reset transistors 303 is connected to Vdd wiring 310. Power supply voltage is supplied to this Vdd wiring 310. And the gate of each of the reset transistors 303 is connected to reset wiring 306. Reset pulses are supplied to this reset wiring 306. In this embodiment, the reset wiring 306 is connected to all of the four reset transistors 303 in common.

The drain of each of the amplification transistors 304 is connected to the Vdd wiring 310 described above. Moreover, the source of each of the amplification transistors 304 is connected to the drain of the corresponding one of the selection transistors 305.

The gate of each of the selection transistors 305 is connected to decoder wiring 308. Selection pulses are supplied to this decoder wiring 308. In this embodiment, the decoder wiring 308 is provided to each of the four selection transistors 305 independently. The sources of the selection transistors 305 are connected to output wiring 309 in common.

A load current source 311 supplies current to the output wiring 309. In other words, the output wiring 309 for the selection transistors 305 is constituted by a source follower. It should be understood that this load current source 311 could also be provided on the side of the image capture chip 113, or on the side of the signal processing chip 111.

Now, the flow of operation from the start of charge accumulation until pixel output after accumulation has ended will be explained. A reset pulse is supplied to the reset transistor 303 via the reset wiring 306. Simultaneously therewith, a transfer pulse is supplied to the transfer transistor 302 via the TX wiring 307. Due to this, the potentials of the PD 104 and of the floating diffusion FD are reset.

When supply of the transfer pulse to the PD 104 is cancelled, the incident light is converted into electrical charge and is accumulated. And, when subsequently a transfer pulse is supplied for a second time in the state in which no reset pulse is being supplied, the charge that has been accumulated by the PD 104 is transferred to the floating diffusion FD, and reading out of this charge is performed. Due to this, the potential of the floating diffusion FD changes from the reset potential to the signal potential after charge accumulation. And, when a selection pulse is supplied to the selection transistor 305 via the decoder wiring 308, change of the signal potential of the floating diffusion FD is transmitted to the output wiring 309 via the amplification transistor 304 and the selection transistor 305. Due to this type of operation of the circuits, a pixel signal corresponding to the reset potential and to the signal potential is output from this unit pixel to the output wiring 309.

As shown in FIG. 3, in this embodiment, the reset wiring 306 and the TX wiring 307 are provided in common for the four pixels P that make up the unit group 131. Due to this, the reset pulse and the transfer pulse are applied simultaneously to all of these four pixels P. Accordingly, all of the pixels P that make up the unit group 131 start accumulation of charge at the same timing and stop accumulation of charge at the same timing. However, due to the fact that the selection pulses are applied sequentially to each of the selection transistors 305, the pixel signals corresponding to the charges that have been accumulated are sequentially output in series to the output wiring 309 for each pixel P. Moreover, the reset wiring 306, the TX wiring 307, and the output wiring 309 are provided separately for each of the unit groups 131.

It is possible to control the charge accumulation interval for each of the unit groups 131 by building the circuitry while taking the unit groups 131 as reference in this manner. And, for different ones of the unit groups 131, it is possible to output pixel signals based upon charge accumulation intervals that are mutually different. Furthermore, while charge accumulation is being performed one time for one of the unit groups 131, by repeating charge accumulation for another unit group 131 any appropriate number of times and by outputting pixel signals each time, it is possible to output frames for video use at frame rates that are different between these unit groups 131.

Figure 4:
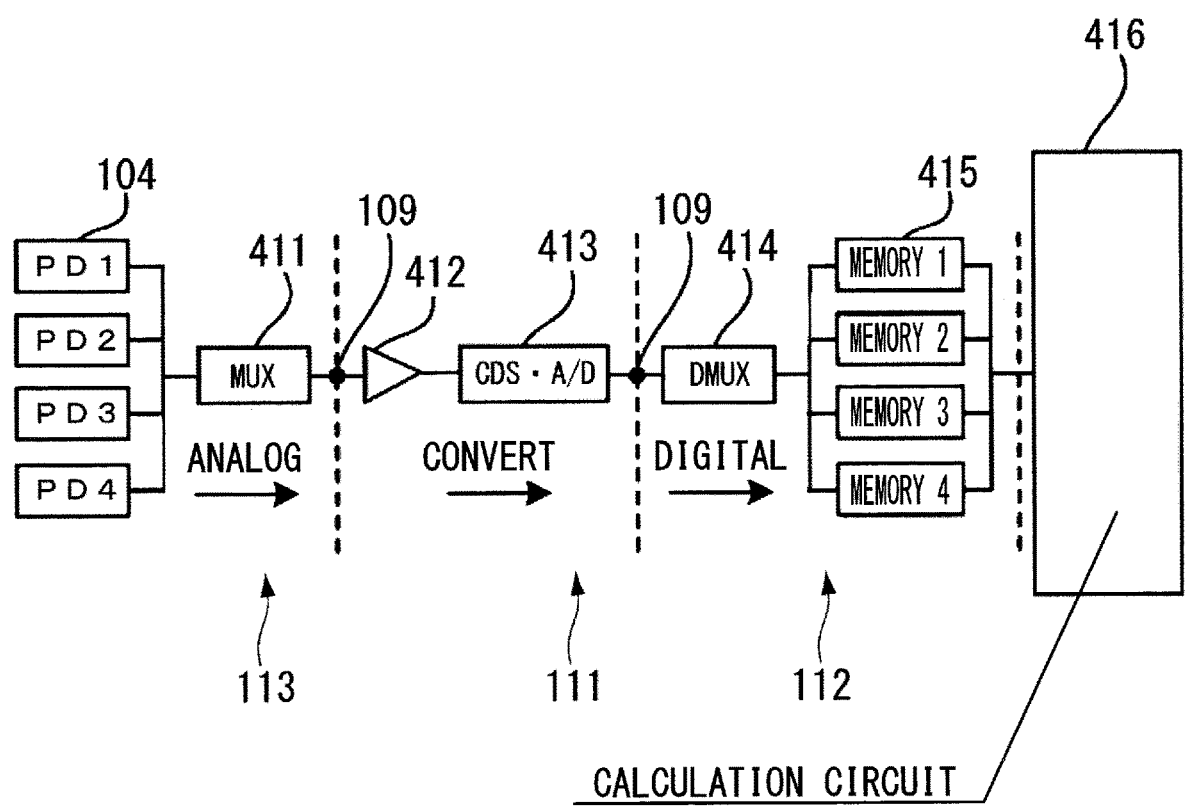
FIG. 4 is a block diagram showing the functional structure of this imaging element.

FIG. 4 is a block diagram showing the functional structure of this imaging element. An analog multiplexer 411 selects the four PDs 104 that make up the unit group 131 in order. And the multiplexer 411 outputs pixel signals from each of these four PDs 104 to the output wiring 309 that is provided corresponding to that unit group 131. The multiplexer 411 is formed upon the image capture chip 113 along with the PDs 104.

The analog pixel signals output via the multiplexer 411 are amplified by an amp 412 that is formed upon the signal processing chip 111. And both correlated double sampling signal processing and A/D conversion (conversion from analog signals to digital signals) are performed upon these pixel signals that have been amplified by the amp 412 by a signal processing circuit 413 that is formed upon the signal processing chip 111 and that performs correlated double sampling (CDS) and analog to digital (analog/digital) conversion. Noise in the pixel signals is reduced by correlated double sampling signal processing being performed upon the pixel signals by the signal processing circuit 413. After the above described A/D conversion, the pixel signals are forwarded to a demultiplexer 414, and are stored in pixel memories 415 that correspond to each pixel. The demultiplexer 414 and the pixel memories 415 are formed upon the memory chip 112.

A calculation circuit 416 performs processing upon the pixel signals stored in the pixel memories 415 and transfers the result to a image processing unit in a subsequent stage. This calculation circuit 416 may be provided upon the signal processing chip 111, or may be provided upon the memory chip 112. It should be understood that while, in FIG. 4, the connections of a single unit group 131 are shown, actually such connections are provided for each of the unit groups 131, and they all operate in parallel. However, it would also be possible for calculation circuits 416 not to be present for each of the unit groups 131. For example, it would also be acceptable to arrange for the processing to be performed sequentially by a single calculation circuit 416 which refers to the values in the pixel memories 415 corresponding to each of the unit groups 131 in order.

As described above, output wiring 309 is provided to correspond to each of the unit groups 131. In this imaging element 100, the image capture chip 113, the signal processing chip 111, and the memory chip 112 are laminated together. Due to this, it is possible to route the wiring without making the chips large in their surface directions by employing electrical connections between the chips using the bumps 109 for the output wiring 309.

Figure 5:
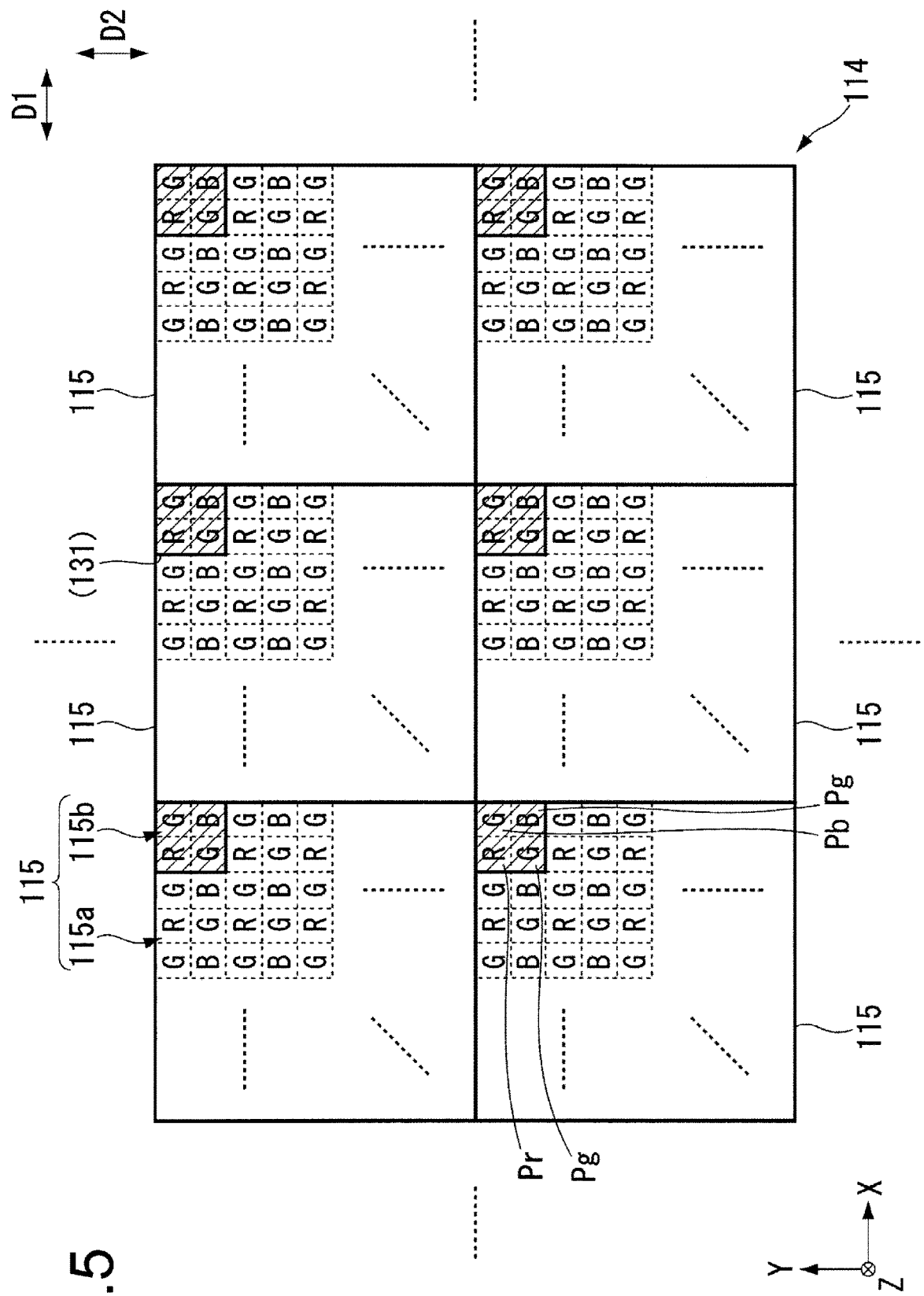
FIG. 5 is a figure showing a block region and a plurality of regions within that block region.

FIG. 5 is a figure showing an example of the image capture region 114, for which control of various types is performed by a system control unit 70 (an image capture control unit 72) that will be described hereinafter. As shown in FIG. 5, the image capture region 114 is partitioned into a plurality of block regions 115. For example, each of these block regions 115 may be formed as rectangular. The plurality of block regions 115 are arranged so that a plurality thereof are arranged along a first direction D1 of the image capture region 114 and also a plurality thereof are arranged along a second direction D2 of the image capture region. While each of the block regions is set to be of the same area and of the same shape, this is not to be construed as being limitative; they could be set to any desired areas and shapes. At least a single unit group 131 is included in each of the block regions 115. Although, for example, in each of the block regions 115 the number of pixels P and the arrangement of the red colored pixels Pr, the green colored pixels Pg, and the blue colored pixels Pb are the same, this also is not to be construed as being limitative; it would be acceptable to arrange for the arrangement to be different between the various block regions 115.

The system control unit 70 is capable of controlling the pixels P included in the image capture region 114 while employing control parameters that are different for each of the block regions 115. In other words, for the pixel groups that are included within some block region 115, and for the pixel groups that are included within some other block region 115, pixel signals for which the control parameters are different are capable of being acquired. As such control parameters, for example, the time interval for charge accumulation or the number of times of charge accumulation, the frame rate, the gain, the pixel sub-sampling ratio (i.e. the thinning down ratio), the number of rows or columns of pixel signals to be added together (i.e. the number of pixels to be totaled), the number of bits for digitization, and so on may be cited. Furthermore, such control parameters could also be parameters for the image processing that is performed after acquisition of image signals from the pixels.

A first region 115*a* and a monitoring region 115*b* are established in each of the block regions 115. The first regions 115*a* and the monitoring regions 115*b* are regions that are set up so that reading out of their charges at mutually different timings is possible. Each of the first regions 115*a* and each of the monitoring regions 115*b* is set so as to include one or more pixels P. The monitoring regions 115*b* are set so as to be smaller than the first regions 115*a*. In this case, the number of pixels P included in each of the monitoring regions 115*b* is lower than the number of pixels P included in the corresponding first region 115*a*.

For example, a monitoring region 115*b* may consist of a single unit group 131. Accordingly, four pixels P are included in this monitoring region 115*b*: one red colored pixel Pr, two green colored pixels Pg, and one blue colored pixel Pb. Since one or more red colored pixels Pr, one or more green colored pixels Pg, and one or more blue colored pixels Pb are included in each of the monitoring regions 115*b* in this manner, accordingly it is possible to obtain a full color image when image capture is performed using only the monitoring regions 115*b*. Moreover, among the plurality of pixels P that are included in the block regions 115, the first regions 115*a* includes pixels P other than the pixels P that are included in the monitoring regions 115*b*. For example, the first regions 115*a* may be made up of a plurality of unit groups 131.

In this manner, each of the first regions 115*a* and each of the monitoring regions 115*b* is constituted by one or a plurality of unit groups 131. In this embodiment, the system control unit 70 that will be described hereinafter is capable of varying the reading out of charge for each of the unit groups 131. Due to this, the system control unit 70 becomes capable of making the timings at which the charges are read out be different for the first regions 115*a* and for the monitoring regions 115*b*. It should be understood that the format of the pixels P that are included in the first regions 115*a* and in the monitoring regions 115*b* is not to be considered as being limited to that described above; any format will be acceptable, provided that the system control unit 70 is capable of making the timings at which the charges are read out be different for the first regions 115*a* and for the monitoring regions 115*b*. For example, the monitoring regions 115*b* may be made up of a plurality of unit groups 131. Moreover, it would also be acceptable, for example, to arrange for the first regions 115*a* and the monitoring regions 115*b* each to include a predetermined number of red colored pixels Pr, green colored pixels Pg, and blue colored pixels Pb, without any relationship to the unit groups 131.

In each of the block regions 115, among the four corner portions of the block region 115, the monitoring region 115*b* may, for example, be arranged at the corner portion at the +X side and the +Y side. By doing this, a plurality of the monitoring regions 115*b* may be provided in the image capture region 114. And each of the monitoring regions 115*b* is arranged separately in a regular manner along the first direction D1 and the second direction D2. It should be understood that the arrangement of the monitoring regions 115*b* is not to be considered as being limited to this type of configuration in which they are arranged in a regular manner along the first direction D1 and the second direction D2.

Next, the control parameters will be explained. The time interval for charge accumulation is the time period from when accumulation of charge by a PD 104 starts until it stops. This charge accumulation interval is also sometimes termed the exposure time or the shutter speed. Moreover, the number of times of charge accumulation is the number of times that a PD 104 accumulates charge in a unit time interval. And the frame rate is a value that, for a movie image, specifies the number of frames that are processed (i.e. displayed or recorded) in a unit time interval. The unit of frame rate is expressed as fps (Frames Per Second). The higher the frame rate becomes, the smoother the movement of the photographic subject (in other words, of the subject whose image is being captured) in the movie becomes.

Furthermore, the gain is the gain ratio of the amps 412 (i.e., their amplification ratio). By changing this gain, it is possible to change the ISO speed. This ISO speed is a standard for photographic film that is defined by ISO, and represents the lowest light level at which a photographic film is capable of recording. However, generally, ISO speed is also used for expressing the sensitivity of an imaging element 100. In this case, the ISO speed is a value that represents the capability of the imaging element 100 for capturing light. If the gain is increased, then the ISO speed is also enhanced. For example, when the gain is doubled, the signals (i.e. the pixel signals) also become doubled in magnitude, so that, even if the amount of incident light is halved, its brightness is still adequate. However since, when the gain is increased, the noise included in the signal is also amplified, accordingly the noise also becomes greater, and this is undesirable.

And further, the sub-sampling ratio is the proportion of the number of pixels in some predetermined region for which reading out of the pixel signals is not performed, with respect to the total number of pixels in that region. For example, if the sub-sampling ratio in the predetermined region is zero, this means that reading out of the pixel signals from all of the pixels in the predetermined region is performed. Moreover, if the sub-sampling ratio in the predetermined region is 0.5, this means that reading out of the pixel signals from half of the pixels in the predetermined region is performed. For example, if the unit group 131 is a Bayer array, then it is possible to set every second pixel of the Bayer array unit in the vertical direction, in other words each two pixels alternatingly (i.e. each two rows) of the pixel unit, as being pixels whose signals are to be read out and pixels whose signals are not to be read out. It should be understood that the resolution of the image is reduced when such sub-sampling by reading out pixel signals is being performed. However, since 20,000,000 or more pixels are disposed upon the imaging element 100, accordingly, even if for example sub-sampling at a sub-sampling ratio of 0.5 is performed, it is still possible to display an image that is made up from or more pixels.

Yet further, the number of rows to be added together is, if the pixel signals of pixels that are adjacent in the vertical direction are to be added together, the number of pixels in the vertical direction (i.e. the number of rows) to be employed in this addition. Moreover, the number of columns to be added together is, if the pixel signals of pixels that are adjacent in the horizontal direction are to be added together, the number of pixels in the horizontal direction (i.e. the number of columns) to be employed in this addition. This type of addition processing may, for example, be performed by the calculation circuit 416. By the calculation circuit 416 performing processing to add together the pixel signals from a predetermined number of pixels that are adjacent in the vertical direction or in the horizontal direction, the same type of beneficial effects are obtained as in the case of processing to read out the pixel signals by sub-sampling at some predetermined sub-sampling ratio. It should be understood that it would also be acceptable, in the addition processing described above, to arrange for an average value to be calculated by dividing the total value by the number of rows or the number of columns that have been added together by the calculation circuit 416.

And finally, the number of bits for digitization is the number of bits that is output when the analog signal is converted into a digital signal during the A/D conversion performed by the signal processing circuit 413. The greater is the number of bits in the digital signal, the finer is the detail for expressing changes of luminance or color or the like.

In this embodiment, the term "accumulation conditions" means conditions that are related to accumulation of charge by the imaging element 100. In concrete terms, the accumulation conditions include the charge accumulation time interval or the number of times of charge accumulation, the frame rate, and the gain among the control parameters described above. Since the frame rate can change according to the charge accumulation time interval or the number of times of charge accumulation, therefore the frame rate is included in the accumulation conditions. Moreover, the amount of light that is appropriate for exposure changes according to the gain, and the charge accumulation time interval or the number of times of charge accumulation can also change according to the amount of light that is appropriate for exposure. Due to this, the gain is also included in the accumulation conditions.

Moreover, since the amount of light that is appropriate for exposure changes according to the charge accumulation time interval or the number of times of charge accumulation, the frame rate, and the gain, accordingly in some cases, in this embodiment, the accumulation conditions are alternatively termed "exposure conditions" (i.e., conditions related to exposure).

Furthermore, in this embodiment, "image capture conditions" means conditions relating to capture of an image of a photographic subject. In concrete terms, the image capture conditions are control parameters that include the accumulation conditions described above. Apart from the control parameters for controlling the imaging element 100 (for example, the charge accumulation time interval or the number of times of charge accumulation, the frame rate, and the gain), the image capture conditions also include control parameters for controlling reading out of the signals from the imaging element 100 (for example, the sub-sampling ratio and the number of rows or the number of columns whose pixel signals are to be added together) and control parameters for processing the signal from the imaging element 100 (for example, the number of bits for digitization, and control parameters referred to by an image processing unit 30 that will be described hereinafter in order to perform image processing).

Figure 6:
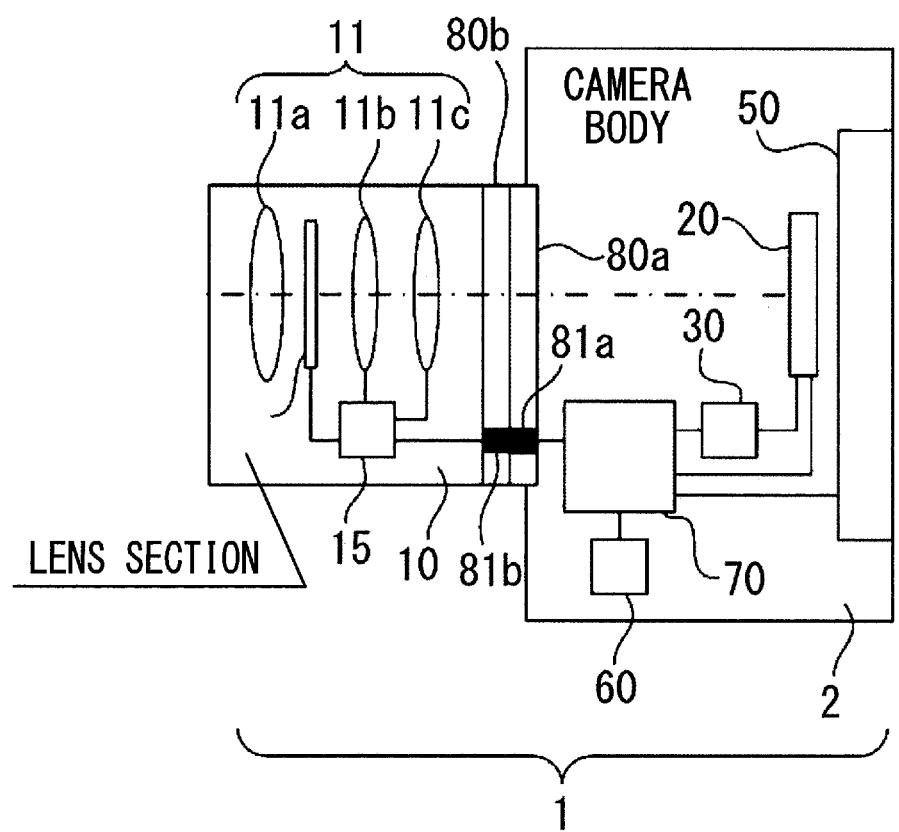
FIG. 6 is a horizontal sectional view showing the general structure of a digital camera that is one example of an electronic device.

FIG. 6 is a horizontal sectional view showing the general structure of a digital camera 1 that is an example of an electronic device. And FIG. 7 is a block diagram showing an example of this digital camera 1.

Figure 7:
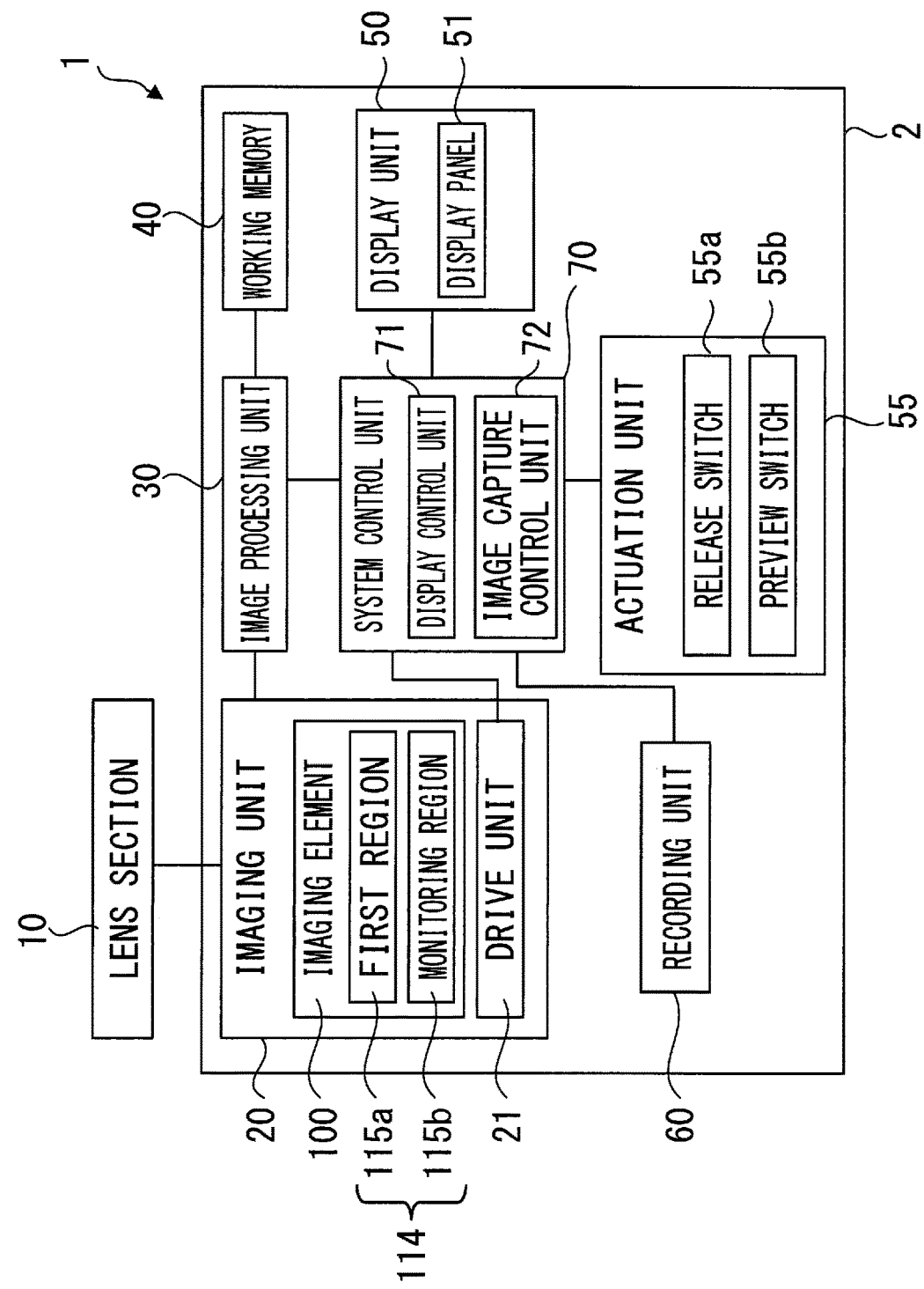
FIG. 7 is a block diagram showing the structure of a digital camera according to an embodiment.

As shown in FIGS. 6 and 7, the digital camera 1 of this embodiment comprises a lens unit 10 and a camera body 2.

The lens unit 10 is an interchangeable lens. It should be understood that it would also be acceptable for the digital camera 1 not to include any separate lens unit 10. I.e., the lens unit 10 could also be formed as an integral portion of the digital camera 1. In the state in which this lens unit 10 is connected to the camera body 2, it conducts a light flux from a photographic subject to an imaging unit 20.

A lens side mounting portion 80b is provided to the lens unit 10. This lens side mounting portion 80b is detachably installed to a body side mounting portion 80a that is provided to the camera body 2. The lens unit 10 is installed to the camera body 2 by the user joining the body side mounting portion 80a and the lens side mounting portion 80b together. When the lens unit 10 is thus installed to the camera body 2, electrical contact points 81a that are provided to the body side mounting portion 80a and electrical contact points 81b that are provided to the lens side mounting portion 80b become electrically connected together.

The lens unit 10 comprises an image capture optical system 11, an iris aperture 14, and a lens drive control device 15. A lens 11a, a lens 11b for zooming, and a lens 11c for focusing are included in the image capture optical system 11. The lens drive control device 15 comprises a lens side CPU (Central Processing Unit), a memory, and a drive control circuit. The lens drive control device 15 is electrically connected to a system control unit 70 on the camera body 2 side via the electric contact points 81a and 81b, and performs transmission of lens information related to the optical characteristics of the image capture optical system 11 included in the lens unit 10 and reception of control information for driving the zooming lens 11b, the focusing lens 11c, and the iris aperture 14.

On the basis of control information transmitted from the system control unit 70, the lens side CPU of the lens drive control device 15 performs control for driving the focusing lens 11c with a drive control circuit, in order to perform focus adjustment of the image capture optical system 11. And, on the basis of control information transmitted from the system control unit 70, the lens side CPU of the lens drive control device 15 performs control for driving the zooming lens 11b with a drive control circuit, in order to perform zooming adjustment. Moreover, the iris aperture 14 is disposed upon the optical axis of the image capture optical system 11. This iris aperture 14 defines an aperture that is centered upon the optical axis and whose diameter can be varied in order to adjust the amount of light and the amount of blurring. And, on the basis of control information transmitted from the system control unit 70, the lens side CPU of the lens drive control device 15 performs control for driving the iris aperture 14 with a drive control circuit, in order to perform adjustment of the diameter of the iris aperture 14.

Next, the camera body 2 comprises the imaging unit 20, an image processing unit a working memory 40, a display unit 50, an actuation unit 55, a recording unit 60, and the system control unit 70. As shown in FIG. 7, the imaging unit 20 comprises an imaging element 100 and a drive unit 21. The imaging element 100 comprises an image capture region 114 that photoelectrically converts a light flux emitted from the image capture optical system 11 of the lens unit 10 pixel by pixel, and thereby generates pixel signals (the pixel signals are included in image data). First regions 115a and monitoring regions 115b are included in the image capture region 114. The imaging unit 20 is capable of capturing images in the first regions 115a and in the monitoring regions 115b.

The drive unit 21 is a control circuit that controls driving of the imaging element 100 according to commands from the system control unit 70. Here, the drive unit 21 is capable of controlling the timings (or the periods of the timings) at which reset pulses and transfer pulses are supplied to the various reset transistors 303 and to the various transfer transistors 302 respectively. Due to this control, it is possible to control the time interval for charge accumulation or the number of times of charge accumulation, which are control parameters, and also the timings at which the charges are read out. The drive unit 21 can drive the first regions 115a and the monitoring regions 115b independently of one another. Accordingly, it becomes possible to read out the charges from the first regions 115a and from the monitoring regions 115b at mutually different timings.

Furthermore, the drive unit 21 controls the frame rate by controlling the timings (or the periods of the timings) at which the reset pulses, the transfer pulses, and the selection pulses are supplied to the various reset transistors 303, to the various transfer transistors 302, and to the various selection transistors 305 respectively. Moreover, the drive unit 21 controls the sub-sampling ratio by setting the pixels to which the reset pulses, the transfer pulses, and the selection pulses are supplied.

Yet further, the drive unit 21 controls the ISO speed of the imaging element 100 by controlling the gain of the amps 412. And, by sending commands to the calculation circuits 416, the drive unit 21 sets the number of rows or the number of columns for which the pixel signals are to be added together. Even further, by sending commands to the signal processing circuits 413, the drive unit 21 sets the number of bits for digitization. Still further, in the image capture region 114 of the imaging element 100, the drive unit 21 sets regions by block units. In this manner, the drive unit 21 plays the role of an imaging element control unit that makes the imaging element 100 capture images and output pixel signals under image capture conditions that are mutually different for each of the plurality of blocks. And the system control unit 70 issues commands to the drive unit 21 for specifying the positions, shapes, ranges and so on of the blocks. It should be understood that the imaging unit 20 sends RAW data consisting of the pixel signal for each pixel to the image processing unit 30 (i.e., RAW data is also included in the image data).

The image processing unit 30 performs image processing of various types upon the RAW data consisting of the pixel signals that have been generated by the imaging unit 20, and generates image data in a predetermined file format (for example, the JPEG format or the like). It should be understood that in some cases "image data" means "image signal". Moreover, still images, movie images, live view images, and partial images are included in the meaning of the term "image". Live view images are images consisting of image data generated by the image processing unit 30, which are output in series to the display unit and are displayed upon the display unit 50. Such live view images are employed by the user in order to check the image of the photographic subject that is being captured by the imaging unit 20. Live view images are also sometimes called "through images" or "preview images".

Furthermore, the image processing unit 30 performs the following image processing. For example, the image processing unit 30 may generate an RGB image signal by performing color signal processing (color compensation) upon the signal that has been obtained from the Bayer array. Moreover, the image processing unit 30 may perform image processing such as white balance adjustment, sharpness adjustment, gamma correction, tone adjustment and so on upon this RGB image signal. Yet further, according to requirements, the image processing unit 30 may perform processing to compress the RGB image signal according to some predetermined compression format (such as the JPEG format, the MPEG format, or the like). The image processing unit 30 outputs the image data that it has thus generated to the recording unit 60. Moreover, the image processing unit 30 outputs the image data that it has thus generated to the display unit 50.

Parameters that are referred to by the image processing unit 30 while performing image processing are also included as control parameters (i.e., image capture conditions). For example, parameters for color signal processing (color compensation), white balance adjustment, tone adjustment, compression ratio, and so on are included as being control parameters. The signal that is read out from the imaging element 100 changes according to the charge accumulation time interval and so on, and the parameters that are referred to while performing image processing also change according to change of this signal. The image processing unit 30 sets control parameters that are mutually different for each of the block units, and performs image processing such as signal processing and so on based upon these control parameters.

In this embodiment, as shown in FIG. 7, the image processing unit 30 includes an image generation unit and a detection unit not shown in the figures. The image generation unit generates image data by performing image processing of various kinds upon the RAW data consisting of the pixel signals from the pixels output from the imaging unit 20. In this embodiment, the image generation unit not only generates image data for movie images (including live view images) and for still images, but also is capable of generating image data for partial view images as mentioned above. And the detection unit detects the photographic subject from the image data that has been generated by the image generation unit. In this embodiment, the detection unit has the function of comparing together a plurality of sets of image data (i.e. frames) that have been obtained successively in time series from the image generation unit, and of detecting a photographic subject that shifts (i.e. a shifting photographic subject). Moreover, the detection unit has the function of specifying the boundary of the photographic subject on the basis of changes of contrast and/or color of light portions and dark portions in the image data, and thereby detecting the photographic subject. It should be understood that it would also be acceptable to arrange for the detection unit to detect human bodies included in the image data as photographic subjects, as for example described in Japanese Laid-Open Patent Publication 2010-16621 (US 2010/0002940).

Here, there is no limitation to the case in which only one photographic subject captured by the imaging unit 20 is present in the image data; in other cases, a plurality thereof may be present. Furthermore, among these photographic subjects, the photographic subject that the user (i.e. the photographer) is giving his attention to, or that it is estimated that the user is giving his attention to, is termed the "main photographic subject". There is also no limitation to the case in which only one main photographic subject is present in the image data; in other cases, a plurality thereof may be present.

The working memory 40 temporarily stores image data and so on while image processing is being performed by the image processing unit 30. And the display unit 50 displays images captured by the imaging unit 20 (still images, movie images, live view images, and/or partial view images) and information of various kinds. This display unit 50 may, for example, include a display panel 51 such as a liquid crystal display panel or the like. It would also be acceptable for a touch panel to be provided upon the display panel 51 of the display unit 50. In this case, when the user performs actuation to select an item from a menu or the like, the touch panel outputs to the system control unit 70 a signal specifying the position that the user has touched.

The actuation unit 55 includes a release switch 55a (i.e. a switch that is pressed when photographing a still image) and a preview switch 55b (i.e. a switch that is pressed when performing preview display of a still image or of a movie image) that are actuated by the user, a movie image switch (a switch that is pressed during operation for movie photography), and operating switches of various types and so on. The release switch 55a is capable both of being half press actuated and being full press actuated. The preview switch 55b may be set up upon a touch panel (not shown in the figures), or may be provided as a button upon the camera body 2. The actuation unit 55 outputs signals to the system control unit 70 corresponding to actuation by the user.

The recording unit 60 has a card slot in which a storage medium such as a memory card or the lot can be installed. This recording unit 60 stores image data generated by the image processing unit 30 and data of various other types upon a recording medium that is installed in the card slot. Moreover, the recording unit 60 has an internal memory. The recording unit 60 is also capable of recording image data generated by the image processing unit 30 and data of various other types in this internal memory.

The system control unit 70 controls the overall processing and operation of the digital camera 1. This system control unit 70 includes a body side CPU (Central Processing Unit). Moreover, as shown in FIG. 7, the system control unit 70 comprises a display control unit 71 and an image capture control unit 72. The display control unit 71 performs control for outputting image data that has been generated by the image processing unit 30 to the display unit 50, and also performs control for causing images (still images, movie images, live view images, and/or partial view images) to be displayed upon the display panel 51 of the display unit 50. The display control unit 71 can also cause a plurality of such images to be displayed upon the display panel 51 as superimposed one over the another.

And the image capture control unit 72 sets image capture conditions for the image capture region 114 of the imaging element 100 (i.e. control parameters for color signal processing, white balance adjustment, tone adjustment, compression ratio, and so on). This image capture control unit 72 is capable of setting image capture conditions separately and individually for the first regions 115a and for the monitoring regions 115b. Moreover, the image capture control unit 72 performs control for image data generated by the image generation unit 31 for movie images, still images, and partial video images to be recorded by the recording unit 60.

It should be understood that the system control unit 70 is capable of acquiring images at different charge accumulation intervals (or different numbers of times of charge accumulation), different frame rates, and different gains for each one of the block regions 115 in the image capture region 114 of the imaging element 100 (i.e. of the image capture chip 113). In this case, the system control unit 70 issues commands to the drive unit 2 for specifying the positions, shapes, ranges of the blocks, and the accumulation conditions to be used for each of the blocks. Moreover, the system control unit 70 may acquire images at sub-sampling ratios, numbers of rows or of columns whose pixel signals are to be added together, and numbers of bits for digitization that are different for each of the block regions 115. For doing this, the system control unit 70 issues commands to the drive unit 21 for specifying the image capture conditions to be employed for each block region 115 (i.e. the sub-sampling ratio, the number of rows or of columns whose pixel signals are to be added together, and the number of bits for digitization). And the system control unit 70 issues commands to the image processing unit 30 for specifying the image capture conditions to be employed for each block region 115 (i.e. conditions for color signal processing, white balance adjustment, tone adjustment, compression ratio, and so on).

Furthermore, the system control unit 70 causes the recording unit 60 to record the image data that has been generated by the image processing unit 30. Moreover, by outputting to the display unit 50 image data that has been generated by the image processing unit 30, the system control unit 70 causes that image to be displayed upon the display unit 50. Yet further, by reading out image data recorded by the recording unit 60 and outputting that image data to the display unit 50, the system control unit 70 causes the corresponding image to be displayed upon the display unit 50. Still images, movie images, live view images, and partial view images are included as images that can be displayed upon the display unit 50.

Even further, on the basis of the fact that half press actuation of the release switch has been performed, the control unit 70 performs focus adjustment processing (i.e. AF processing) by a so-called contrast detection method, so that the contrast of the photographic subject becomes maximum. In concrete terms, the system control unit 70 causes the lens drive control device 15 to shift the focusing lens 11c by transmitting control information to the lens drive control device 15 via the electric contact points 81a, 81b. Moreover, the system control unit 70 acquires from the image processing unit 30 a contrast signal that specifies the contrast of the image of the photographic subject that is being captured by the imaging unit 20 (here, if a main photographic subject has been detected by the image processing unit 30, then this is the evaluated value of the contrast of the image of this main photographic subject). On the basis of this contrast signal from the image processing unit 30, while shifting the focusing lens 11c, the system control unit 70 detects the position of the focusing lens 11c at which the contrast of the image of the photographic subject becomes the highest as being the focusing position. And the system control unit 70 transmits a control signal to the lens drive control device 15 so as to cause the focusing lens 11c to shift to this focus position that has thus been detected.

The system control unit 70 also performs drive control for adjusting the diameter of the iris aperture 14 by transmitting to the lens drive control device 15 control information specifying an iris aperture value that corresponds to an appropriate exposure. Moreover, the system control unit 70 also outputs a command signal to the drive unit 21 for specifying a shutter speed (i.e. a charge accumulation interval), a frame rate, and a gain (i.e. an ISO speed) that correspond to this appropriate exposure. And the drive unit 21 controls the driving of the imaging element 100 according to the shutter speed, the frame rate, and the gain that are commanded by this command signal. It should be understood that the system control unit 70 is implemented by the body side CPU executing processing on the basis of a control program.

—An Example of Photographic Operation—

Figure 8:
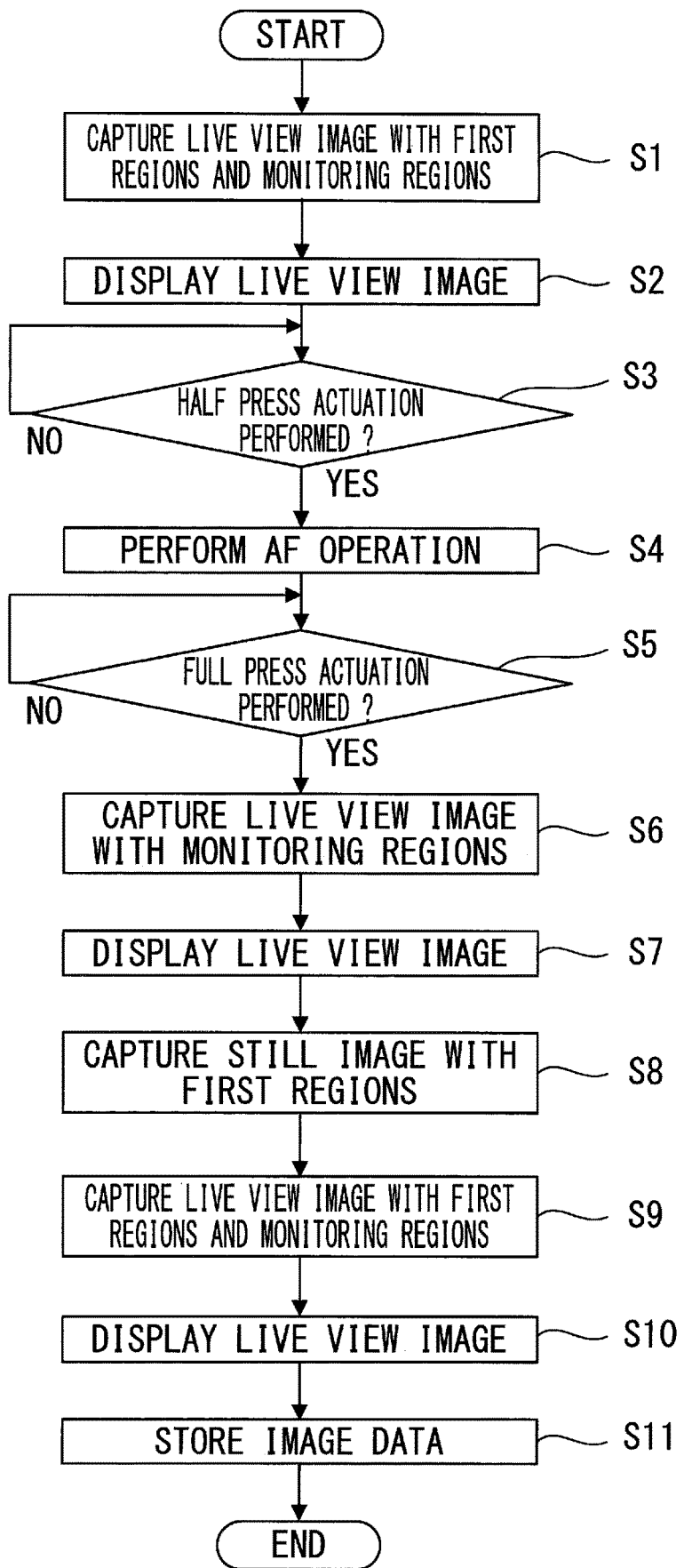
FIG. 8 is a flow chart for explanation of an example of photographic operation according to an embodiment.

FIG. 8 is a flow chart for explanation of an example of the photographic operation performed by the system control unit 70 of the first embodiment. When the power supply to the digital camera 1 is turned on by the user and a predetermined actuation is performed upon the actuation unit 55 or the like in order to start photography, the system control unit performs image capture operation with the imaging unit 20. First, the system control unit 70 performs driving of the imaging element 100 with the drive unit 21. On the basis of this control, the drive unit 21 captures a live view image using both the first regions 115a and also the monitoring regions 115b in the image capture region 114 (step S1). In this step S1, the system control unit 70 performs accumulation of charges in the first regions 114a and in the monitoring regions 115b and reading out of the accumulated charges at a predetermined frame rate. The pixel signals from the pixels P of the first regions 115a and of the monitoring regions 115b are output to the image processing unit Image data is generated from these pixel signals by the image processing unit 30, and this image data is output in series to the display unit 50. Due to this, as shown in FIG. 9(a), a live view image 151 is displayed upon the display panel 51 (step S2). For example, the face 52 of an animal may be captured as this live view image 151.

Next, the system control unit 70 determines with the image capture control unit 72 whether or not half press actuation of the release switch 55a (i.e. actuation of a switch SW1) has been performed by the user (step S3). If the system control unit 70 decides that half press actuation has been performed (YES in step S3), then AF operation is performed by employing a contrast detection method (step S4). The system control unit 70 is capable of displaying a display upon the display panel 51 in order for the user to select whether or not AF operation is to be performed. In this case, the system control unit 70 performs AF operation if the user has performed actuation for AF operation to be performed. It should be understood that, if the system control unit 70 has determined that half press actuation of the release switch 55a is not being performed, then the flow of control returns back to step S3 again, and the decision as to whether half press actuation has been performed is repeated. Moreover, it should be understood that it would also be acceptable for AF operation not to be performed.

After AF operation has been performed, the system control unit 70 determines with the image capture control unit 72 whether or not full press actuation of the release switch 55a (i.e. actuation of a switch SW2) has been performed by the user (step S5). If the system control unit 70 decides that full press actuation has been performed (YES in step S5), then image capture of a live view image is performed with the monitoring regions 115b (step S6), and this live view image that has thus been captured is displayed over the entire surface of the display panel 51 (step S7).

Due to this, the state of the display upon the display panel 51 changes over from the state in which the live view image 151 that is captured both with the first regions 115a and with the monitoring regions 115b is displayed upon the display panel 51, to the state in which a live view image 152 that is captured only with the monitoring regions 115b is displayed upon the display panel 51, as shown in FIG. 9(b). In this case, although the resolution on the display panel 51 becomes lower than that of the live view image 151 (refer to FIG. 9(a)), still the face 52a of the animal, which is the same subject, is displayed continually as the live view image 152. It should be understood that, if the system control unit 70 has determined that full press actuation of the release switch 55a is not being performed (NO in step S5), then the flow of control returns back to step S5 again, and the decision as to whether full press actuation has been performed is repeated. At this time it would also be acceptable, if full press actuation is not performed during a predetermined time period after the end of AF operation, to arrange for the system control unit 70 to return the flow of control back to step S3, so as to perform the operations of steps S3 through S5 again.

Next, the system control unit 70 performs capture of a still image by using the first regions 115a (step S8). In this capturing of a still image, the system control unit 70 sets image capture conditions such as the charge accumulation interval and so on for only the first regions 115a, and controls the drive unit 21 so as to perform image capture under these image capture conditions that have thus been set. Due to this, the charges that have been accumulated by the pixels P of the first regions 115a are reset, and exposure of the first regions 115a is performed and their charges are accumulated by the first region 115a. At this time, it would also be acceptable to arrange for the system control unit 70 to determine with the image capture control unit 72 whether or not long timing photography is being performed by the user, and for AF operation to be continually performed if it is determined that long timing photography is being performed. In this case, for example, by performing long timing photography of a photographic subject that is shifting, it is possible to implement AF operation so as to track the photographic subject. It should be understood that the system control unit 70 may, for example, determine whether or not the charge accumulation interval that has been set is longer than some predetermined threshold value (for example, 1 second), and may determine that long timing photography is being performed if the charge accumulation interval is longer than this predetermined threshold value. Next, reading out of the charges accumulated by the pixels P is performed, the pixel signals for the pixels P are generated, and these pixel signals are transmitted to the image processing unit 30. After reading out of the charges that have been accumulated in the first regions 115a has been performed, reset signals are supplied to the pixels P in the first regions 115a.

It should be understood that, while the image capture operation described above is being performed, along with repeatedly performing accumulation and reading out of charges at the predetermined frame rate from each of the monitoring regions 115b, the system control unit 70 also causes the live view image 152 captured by the monitoring regions 115b to be displayed upon the display panel 51 (refer to FIG. 9(b)). Accordingly, during the image capture operation, the live view image 152 continues to be displayed upon the display panel 51.

For the regions in the image capture region 114 that are used for capture of a still image, for example, reading out of charges ceases to be possible in the interval in which the charges are being reset or the like. Due to this, if for example capture of a still image were to be performed by using the entire image capture region 114, then it would not be possible to perform display of a live view image 151 during such an interval in which the charges were being reset.

By contrast since, with this embodiment, the first regions 115a are used for the operation of capturing a still image, and these only constitute a portion of the image capture region 114, accordingly, during the interval in which the first regions 115a are being reset, reading out of the charges in the first regions 115a ceases to be possible. On the other hand, reading out of charges independently from the first regions 115a and the monitoring regions 115b of the image capture region 114 is possible. Moreover, the system control unit 70 is capable of making the timings of the reading out of the charges accumulated in the first regions 115a and the timings of the reading out of the charges accumulated in the monitoring regions 115b be different from one another. Thus the system control unit 70 is able to perform the reading out of the charges accumulated in the monitoring regions 115b when it is not possible to perform reading out of the charges in the first region 115a, as for example when the first regions 115a are being reset or the like as explained above. Due to this, the system control unit 70 is able to photograph the live view image 152 and to display it upon the display panel 51 by using only, for example, the monitoring regions 115b. Accordingly, the system control unit 70 is capable of displaying the live view image 152 without interruption, even during capture of a still image. Since the user is able to check the state of the photographic subject on the display panel 51 even during capture of a still image, accordingly the convenience is enhanced when performing sequential shooting or the like. It should be understood that it would also be acceptable, if the user is performing sequential shooting, to arrange for the system control unit 70 to capture a still image with the monitoring regions 115b, and to display this still image that has thus been captured upon the display panel 51. Furthermore it would also be acceptable, when the photographic operation described above which consists of performing long timing photography is being performed, to arrange for the display control unit 71 to display the live view image 152 captured by the monitoring regions 115b upon the display panel 51.

After the reset signals have been supplied to the first regions 115a and the image capture operation has ended, it becomes possible to read out the charges in the first regions 115a. Thus, the system control unit 70 changes over from the state in which the live view image 152 is being captured to the state in which the live view image 151 is being captured using both the first regions 115a and also the monitoring regions 115b (step S9). In this case, the system control unit 70 repeatedly performs accumulation and reading out of charges at the predetermined frame rate both for the first regions 115a and also for the monitoring regions 115b. And the system control unit 70 displays upon the display panel 51 the live view image 151 that has been captured both by the first regions 115a and also by the monitoring regions 115b (step S10).

After the live view image displayed upon the display panel 51 has been changed over, the system control unit 70 stores the image data for the still image that has been generated by the image processing unit 30 with the recording unit 60 (step S11). Due to this, the still image that has been captured is recorded by the recording unit 60 as image data. It should be understood that it would also be acceptable to arrange for the system control unit 70 to display upon the display panel 51 a display for enabling the user to select whether or not the image processing unit 30 should record or should delete the still image that has been captured. In this case it would be acceptable, if the user has selected that the still image is to be recorded, to arrange for the system control unit 70 to store the image data with the recording unit 60. Moreover it would be acceptable to arrange for the system control unit 70 to delete the image data, if the user has selected that the still image is to be deleted.

As described above, according to this embodiment, since there are provided the imaging unit 20 that is capable of performing image capture with the first regions 115a and with the monitoring regions 115b, and the system control unit 70 that is capable of employing different timings for reading out of the charges accumulated in the first regions 115a and for reading out of the charges accumulated in the monitoring regions 115b, accordingly, even if it is not possible to perform reading out of charges from one of the first regions 115a and the monitoring regions 115b, it is still possible to perform reading out of charges from the other thereof.

For example, even during an interval in which it is not possible to read out the charges from the first regions 115a, it is still possible to perform reading out of charges from the monitoring regions 115b. Due to this, while for example capture of a still image is being performed by the first regions 115a, even during an interval in which the first regions 115a are being reset, the system control unit 70 is able to perform image capture of the live view image 152 by using only the monitoring regions 115b, and to display this image upon the display panel 51. Accordingly, it is possible to cause the live view image 152 to be displayed without interruption, even during capture of the still image. Due to this, it is possible to supply a digital camera 1 whose convenience of use is good.

—A Second Example of Photographic Operation—

Figure 10:
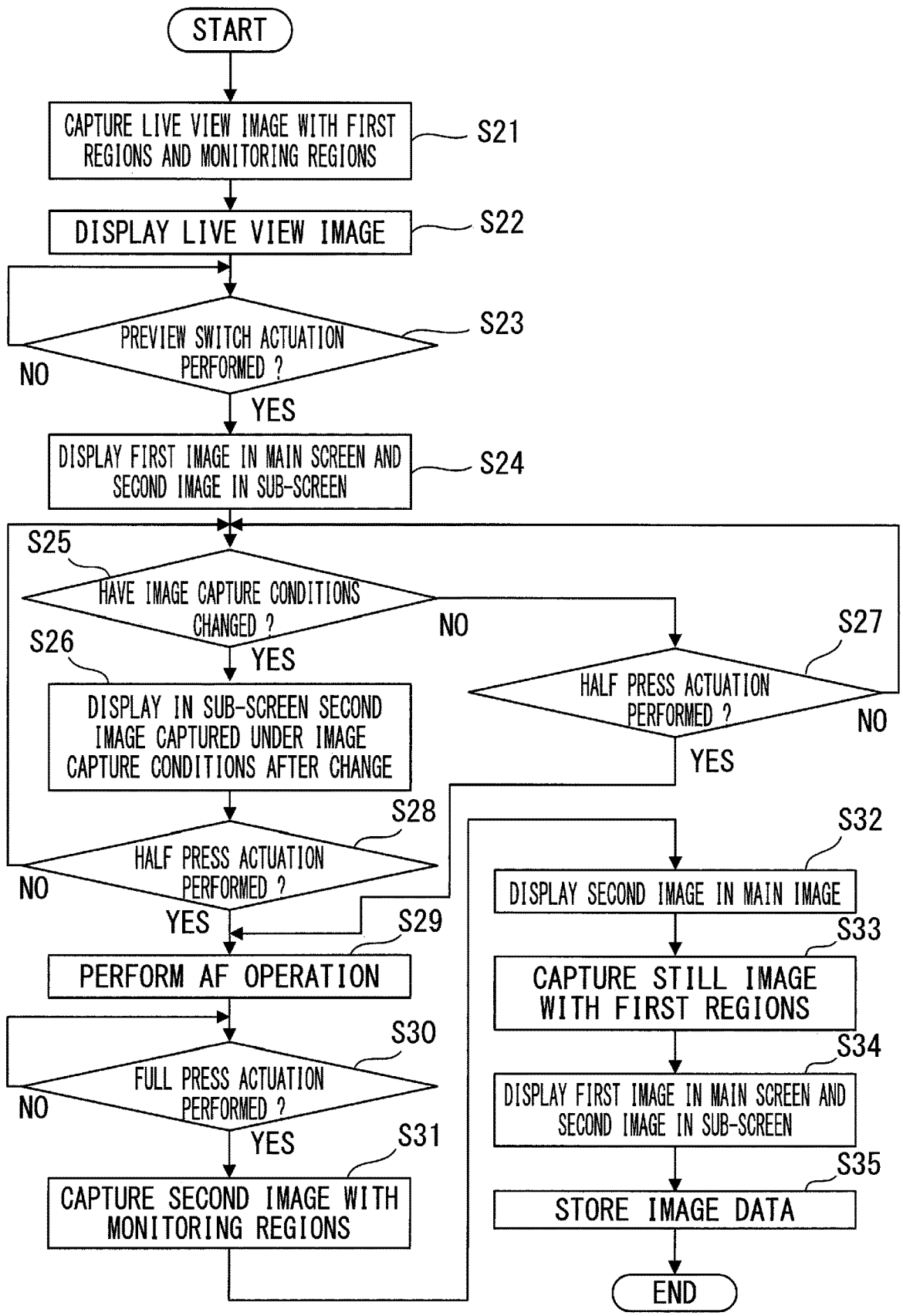
FIG. 10 is a flow chart for explanation of another example of photographic operation according to an embodiment.

FIG. 10 is a flow chart for explanation of another example of photographic operation performed by the system control unit 70 of this first embodiment. In this example, a case will be described and explained of operation in which a plurality of screens are set up on the display panel 51, and a live view image is displayed upon each of those screens. First, when the power supply to the digital camera 1 is turned on by the user and a predetermined actuation is performed upon the actuation unit 55 or the like in order to start photography, in a similar manner to step S1 described above, the system control unit 70 performs image capture operation with the imaging unit 20, and, along with capturing a live view image using both the first regions 115a and also the monitoring regions 115b (step S21), also displays the live view image that has thus been captured upon the display unit 51 (step S22).

Next, the system control unit 70 makes a decision as to whether or not actuation of the preview switch 55b by the user has been performed (step S23). If it is determined that actuation of the preview switch 55b has been performed (YES in step S23), then, as shown in FIG. 11(*a*), the system control unit 70 displays the live view image both in a main screen 51*a* of the display panel 51 and also in a sub-screen 51*b* thereof (step S24). In this case, the system control unit 70 displays the image 151A captured by the first regions 115*a* of the image capture region 114 (hereinafter this will be termed the "first image") in the main screen 51*a*. Moreover, the system control unit 70 (i.e. the display control unit 71) displays the image 152A captured by the monitoring regions 115*b* of the image capture region 114 (hereinafter this will be termed the "second image") in the sub-screen 51*b*. In this manner, the display control unit 71 displays the second image 152A as superimposed over the first image 151A that is displayed upon the display panel 51. The first image 151A and the second image 152A are both live view images that have been captured of the same subject (faces of an animal 52 and 52*a*). It should be understood that, for example, it would also be acceptable for the second image 152A to be a captured image of a region that corresponds to a portion of the first image 151A (i.e. a partial image). The first image 151A has a higher resolution, as compared to that of the second image 152A.

Due to this, the user is able visually to compare the first image 151A that is displayed in the main screen 51*a* and the second image 152A that is displayed in the sub-screen 51*b*. For example, if the user changes the image capture conditions (including the shutter speed, the gain, the frame rate, the white balance, the tone, and color compensation), then operation becomes possible to display a first image 151A in the main screen 51*a* that has been captured under the image capture conditions before change, and to display a second image 152A in the sub-screen 51*b* that reflects the image capture conditions after change. If this type of actuation is to be performed, then first the system control unit 70 determines whether or not the image capture conditions have been changed by the user (step S25). And, if it has been determined that the image capture conditions have been changed (YES in step S25), then the system control unit 70 captures the second image 152A with, for example, the monitoring regions 115*b* under the image capture conditions after change, and displays this second image 152A in the sub-screen 51*b* (step S26). By looking at the first image 151A in the main screen 51*a* and also the second image 152A in the sub-screen 51*b*, the user is able to compare together images that have been captured before and after change of the image capture conditions. Thereafter, the system control unit 70 may set the image capture conditions after change for the first regions 115*a*.

It should be understood that, if it is determined that actuation of the preview switch has not been performed (NO in step S25), then the system control unit 70 determines whether or not half press actuation of the release switch 55*a* has been performed by the user (step S27). If it is determined that such half press actuation has been performed (YES in step S27), then the operations of step S29 that will be described hereinafter and subsequent steps are performed. But if it is determined that such half press actuation has not been performed (NO in step S27), then the operations of step S25 and subsequent steps are repeated.

Next, the system control unit 70 determines with the image capture control unit 72 whether or not half press actuation of the release switch 55*a* (i.e. actuation of SW1) has been performed by the user (step S28). If it is determined that such half press actuation has been performed (YES in step S28), then the system control unit 70 performs AF operation (step S29). This step S29 executes the same operation as that of the step S4 shown in the flow chart of FIG. 8. It should be understood that, if the system control unit 70 determines that such half press actuation of the release switch 55*a* has not been performed (NO in step S28), then the flow of control returns to step S25 again, and the operations of steps S25 through S28 are repeated.

After AF operation has been performed, the system unit 70 makes a decision with the image capture control unit 72 as to whether or not full press actuation of the release switch 55*a* (i.e. actuation of SW2) has been performed by the user (step S30). If it is determined that such full press actuation has been performed (YES in step S30), then the system control unit 70 performs image capture of the second image 152A with the monitoring regions 115*b* (step S31). And, as shown in FIG. 11(*b*), along with deleting the display in the sub-screen 51*b*, the system control unit 70 also displays this second image 152A in the main screen 51*a* of the display panel 51 (step S32). It should be understood that, if it is determined that full press actuation has not been performed (NO in step S30), then the system control unit 70 returns back to the step S5, and repeatedly decides whether or not full press actuation has been performed. At this time it would also be acceptable, if full press actuation is not performed during a predetermined time period after the end of AF operation, to arrange for the system control unit 70 to return the flow of control back to step S25, so as to perform the operation of steps S25 through S29 again.

Next, the system control unit 70 performs capture of a still image using the first regions 115*a* (step S33). At this time, it would also be acceptable to arrange for the system control unit 70 to determine with the image capture control unit 72 whether or not long timing photography is being performed by the user, and for AF operation to be continually performed if it is determined that long timing photography is being performed.

It should be understood that, while the image capture operation described above is being performed, the system control unit 70 continuously displays the second image 152A produced from the monitoring regions 115*b* on the main screen 51*a*. Accordingly, during the image capture operation, the system control unit 70 displays the second image 152A captured by the monitoring regions 115*b* upon the main screen 51*a*. Furthermore it would also be acceptable, when long timing photography is being performed in the photographic operation described above, to arrange for the display control unit 71 to display the live view image 152 that has been captured by the monitoring regions 115*b* on the main screen 51*a*.

After the still image capture operation has ended, the system control unit 70 starts image capture of the first image 151A with the first regions 115*a*. And the system control unit 70 changes over from the state in which the second image 152A is being displayed in the main screen 51*a* as shown in FIG. 11(*b*) to the state in which the first image 151A is being displayed in the main screen 51*a* and the second image 152A is being displayed in the sub-screen 51*b* (step S34).

After changing over of the display has been performed, the system control unit 70 stores the image data for the still image that has been generated by the image processing unit 30 with the recording unit 60 (step S35). Due to this, the still image that has been captured is stored by the recording unit 60.

In this manner, in this example, since it is arranged for the system control unit 70 to display the first image that is captured by the first regions 115*a* in the main screen 51*a* of the display panel 51 and also to display the second image that is captured by the monitoring regions 115*b* in the sub-screen 51*b* of the display panel 51, accordingly the user is able to compare and observe together the first image in the main screen 51a and the second image in the sub-screen 51b. Moreover, since it is arranged for the system control unit 70 to capture two images under mutually different image capture conditions, i.e. the image capture conditions for the first regions 115a and the image capture conditions for the monitoring regions 115b, and to display these two images that have thus been captured in the main screen 115a and in the sub-screen 51b which is superimposed thereupon, accordingly it is possible to compare together two images in which the same subject is captured under mutually different image capture conditions. In this case it becomes possible to compare together, for example, the depiction of movement due to shutter speed, the brightness, the white balance, and the effects upon the image.

It should be understood that while, in this example, a case was cited and explained in which the system control unit 70 superimposed the second image 152A by displaying it in the single sub-screen 51b, this should not be construed as being limitative. For example, it would also be acceptable to arrange for the system control unit 70 to superimpose several second images 152A upon the first image 151A by displaying them in two or more sub-screens 51b. Moreover, while an example was cited and explained in which the system control unit 70 caused the second image 152A to be displayed in the sub-screen 51b, this should not be considered as being limitative. For example it would also be acceptable to arrange for the system control unit 70, in step S22, to display in the sub-screen 51b a still image that has been stored. In this case, for example, it would be possible to arrange for the system control unit 70 to display the newest still image in a single sub-screen 51b, while updating it; or, alternatively, it would be possible to provide a plurality of sub-screens 51b, and to arrange to display them sequentially in a row. Furthermore while, in this embodiment, an example was cited and explained in which a still image was captured, a similar explanation would hold in a case in which a movie image was captured. Yet further, if a movie image is captured, then it would also be acceptable to arrange to obtain a still image by extracting a portion of the movie image.

The technical scope of the present invention is not to be considered as being limited to the embodiment described above; provided that the gist of the present invention is not departed from, various appropriate changes and modifications may be added. For example while, in the embodiment described above, an example was cited in which the AF operation was performed by a contrast detection method, this is not to be construed as being limitative of the present invention; it would also be acceptable to arrange to perform the AF operation by a phase difference detection method.

FIG. 12(a) is a figure for explanation of an example of the monitoring regions. As shown in FIG. 12(a), a first region 215a and a monitoring region 215b are provided within each block region 215. The first region 215a has the same structure as the first region 115a in the embodiment described above. And the monitoring region 215b includes a single red colored pixel Pr, two green colored pixels Pg, and a single blue colored pixel Pb. One of the two green colored pixels Pg1, Pg2 (for example, the green colored pixel Pg2) may be used as a focus detection pixel Pf. Moreover, the pixels in the monitoring region 215b other than this focus detection pixel Pf, i.e. the red colored pixel Pr, the other green colored pixel Pg, and the blue colored pixel Pb, may be used for capture of a live view image or the like.

The focus detection pixel Pf is used for detecting the focal point of the image capture optical system 11. Two photodiodes (PD 104a, 104b) are provided to this focus detection pixel Pf. The PDs 104a and 104b may, for example, be arranged along the X direction, and reading out of their charges can be performed independently. A focus detection pixel Pf of this type is provided in each of the monitoring pixel regions 215b. Moreover, for example, separator lenses (not shown in the figures) may be provided and may form images upon the two PDs 104a, 104b of the photographic subject that have passed through the image capture system 11.

With this structure, the amount of focus deviation is detected by obtaining the gap between the two images of the photographic subject that have passed through the image capture optical system 11 and have been created separately upon the two PDs 104a, 104b by the separator lenses. For example, in the focus adjusted state (i.e. the focused state), the gap between the two images is equal to a predetermined value. Furthermore, if the surface upon which the focus is adjusted is more toward the side of the focus detection pixels Pf than the imaging plane, then the gap between the two images is smaller than the predetermined value. Moreover, if the surface upon which the focus is adjusted is more toward the side of the image capture optical system 11 than the imaging plane, then the gap between the two images is greater than the predetermined value. Accordingly, the system control unit 70 is able to adjust the focus of the image capture optical system 11 by shifting the focusing lens 11c so that the gap between the two images detected by the PDs 104a, 104b of the focus detection pixel Pf becomes equal to the predetermined value.

It should be understood that the focus detection pixels Pf are not limited to being employed for detection of the focus of the image capture optical system 11; for example, it would also be possible to employ them for image capture, in a similar manner to the other pixels P. In this case, it would be possible for the system control unit 70 to change over the pixels Pf for focus detection either to being used for focus detection or to being used for image capture, as appropriate. For example, when AF operation according to a phase difference detection method is being performed, then the pixels Pf for focus detection may be used for focus detection, whereas, when AF operation according to the phase difference detection method is not being performed, then the pixels Pf for focus detection may be changed over to being used for image capture.

Moreover while, in the embodiment described above, an example has been cited and explained in which first regions 115a and monitoring regions 115b are provided to each of the block regions 115, this is not to be considered as being limitative. FIG. 12(b) is a figure showing another example of one of the block regions 315. As shown in this FIG. 12(b), it is also possible to provide a structure in which a first region 315a, a second region 315b, and a monitoring region 315c are provided to each of the block regions 315. With the structure shown in FIG. 12(b), it is possible to read out the charges from the first region 315a, from the second region 315b, and from the monitoring region 315c at mutually different timings. Moreover, the image capture control unit 72 of the system control unit 70 (refer to FIG. 7) is capable of setting different image capture conditions individually for each of the first region 315a, the second region 315b, and the monitoring region 315c.

According to this structure, by receiving the light flux from the photographic subject upon the first regions 315a and the second regions 315b, and by performing image capture under mutually different conditions for the first regions 315a and the second regions 315b, it is possible to perform image capture with a single block region 315 according to a plurality of different image capture conditions, so that it is possible to perform photometry at high accuracy. Due to this, it becomes possible to capture an image over a broad dynamic range. Furthermore, since it is possible to perform image capture according to image capture conditions in which the evaluated value of the contrast of the image of the photographic subject becomes higher, accordingly, in a case in which AF processing is performed according to a contrast detection method, the accuracy of adjustment of the focusing position is enhanced.

Moreover, for example, while in the example described above it was arranged for the system control unit 70 to perform AF processing on the basis of the fact that half press actuation of the release switch 55a had been performed, this should not be construed as being limitative. For example, it would be acceptable to arrange for the system control unit 70 to perform AF processing during photography of a live view image and also during photography of a movie image.

Furthermore while, in the embodiment described above, an example was cited and explained in which the plurality of monitoring regions 115b were of mutually equal dimensions and shapes, this is not to be construed as being limitative; it would also be acceptable for the dimensions or the shape of at least a single one of the monitoring regions 115b to be different. Moreover, while an example was cited and explained in which the monitoring regions 115b were arranged regularly and systematically, this is not to be construed as being limitative; it would also be acceptable for the monitoring regions 115b to be arranged irregularly.

Yet further while, with the structure described above, the monitoring regions 115b were made up of red colored pixels Pr, green colored pixels Pg, and blue colored pixels Pb, this is not to be considered as being limitative; it will be sufficient for each of the monitoring regions 115b to include one or more pixels of at least one type, i.e. red colored pixels Pr, green colored pixels Pg, and blue colored pixels Pb.

Even further, in the structure described above, it would also be acceptable to arrange for the image processing unit 30 to generate an image by supplementing the portions among the first regions 115a corresponding to the monitoring regions 115b on the basis of the pixel signals from regions surrounding the monitoring regions 115b. By doing this, it would be possible to prevent reduction of the quality of the image captured by the first regions 115a, since it would be possible to suppress the loss of the pixels in the first regions 115a due to the provision of the monitoring regions 115b.

Still further while, in the embodiment described above, an example was cited and explained of a case in which the system control unit 70 displayed upon the display panel 51 a live view image captured by the monitoring regions 115b when full press actuation of the release switch 55a was performed, this is not to be construed as being limitative. For example, it would also be acceptable to arrange to display the live view image from the monitoring regions 115b upon the display panel 51 when half press actuation of the release switch 55a has been performed.

Embodiment #2

—Explanation of a Laminated Type Imaging Element—

Figure 13:
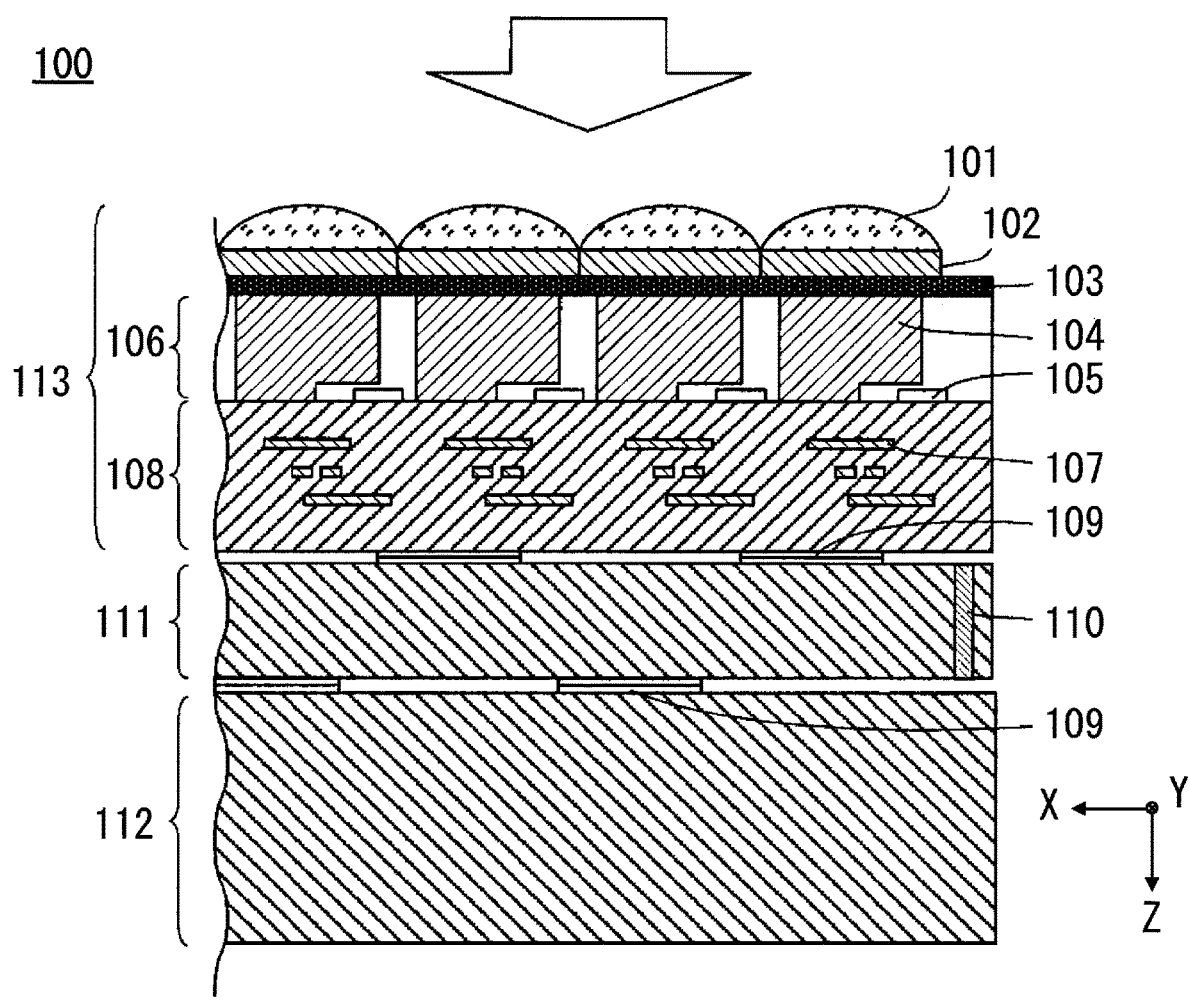
FIG. 13 is a sectional view of a laminated type imaging element.

First, a laminated type imaging element 100 will be explained that is mounted to an electronic device (for example, to an imaging device 1) according to a second embodiment of the present invention. It should be understood that this laminated type imaging element 100 is one described in Patent Application 2012-139026 previously filed by the applicant of the present application. FIG. 13 is a sectional view of this laminated type imaging element 100. The imaging element 100 comprises a backside-illumination type image capture chip 113 that outputs pixel signals corresponding to incident light, a signal processing chip 111 that processes the pixel signals, and a memory chip 112 that stores the pixel signals. The image capture chip 113, the signal processing chip 111 and the memory chip 112 are laminated together, and are mutually electrically connected together by electrically conductive bumps made from Cu or the like.

It should be understood that, as shown in the figure, incident light is principally incident towards the +Z axis direction shown by the outlined white arrow sign. In this embodiment, the surface of the image capture chip 113 upon which the incident light is incident is termed its "rear surface". Moreover, as shown by the coordinate axes, the leftward direction on the drawing paper orthogonal to the Z axis is taken as being the +X axis direction, while the direction perpendicular to the Z axis and the X axis towards the viewer is taken as being the +Y axis direction. In some of the following figures the coordinate axes of FIG. 13 are employed as reference, and are shown so that the orientations of those figures can be determined.

The example of an image capture chip 113 in this example is an MOS image sensor of the backside-illumination type. A PD layer 106 is disposed on the rear surface of a wiring layer 108. This PD layer 106 comprises a plurality of PDs (i.e. photo-diodes) 104 that are arranged in a two-dimensional array and that accumulate electric change according to incident light, and transistors 105 that are provided to correspond to these PDs 104.

Color filters 102 are provided upon the light-incident side of the PD layer 106 with a passivation layer 103 interposed between them. These color filters 102 are of a plurality of types that pass mutually different wavelength bands, and are disposed in a specific arrangement that corresponds to the arrangement of the PDs 104. The arrangement of the color filters 102 will be explained hereinafter. Each group that includes one of the color filters 102, one of the PDs 104, and one of the transistors 105 constitutes one pixel.

Micro-lenses 101 are provided upon the sides of the color filters 102 upon which light is incident, and correspond to the abovementioned pixels. These micro-lenses 101 condense the incident light upon their corresponding PDs 104.

The wiring layer 108 includes wiring 107 that transmits the pixel signals from the PD layer 106 to the signal processing chip 111. This wiring 107 may be multi-layered, and also could be provided with passive elements and active elements.

A plurality of bumps 109 are disposed upon the front surface of the wiring layer 108. This plurality of bumps 109 are positionally aligned with a plurality of bumps 109 that are provided on the opposing face of the signal processing chip 111, and these mutually positionally aligned bumps 109 are joined together and are electrically connected together by the image capture chip 113 and the signal processing chip 111 being pressurized together, or the like.

In a similar manner, the plurality of bumps 109 and are disposed upon the mutually opposing faces of the signal processing chip 111 and of the memory chip 112. These bumps 109 are mutually positionally aligned, and the mutually aligned bumps 109 are joined together and are electrically connected together by the signal processing chip 111 and the memory chip 112 being pressurized together, or the like.

It should be understood that the joining between the bumps 109 is not limited to being Cu bump joining by solid phase diffusion; it would also be acceptable to arrange to employ micro-bump connection by solder melting. Furthermore, for example, it would also be possible to provide at least one set of bumps 109 for a single unit region that will be described hereinafter. Accordingly, it would be acceptable for the sizes of the bumps 109 to be set to be larger than the pitch of the PDs 104. Moreover it would also be possible, in peripheral regions other than the pixel region in which pixels are disposed, to provide larger bumps than the bumps 109 that correspond to the pixel region.

The signal processing chip 111 has a TSV 110 (through silicon electrode) that mutually connects together circuitry provided upon its front surface and upon its rear surface respectively. This TSV 110 is desirably provided at a peripheral region. Moreover, such a TSV 110 may also be provided at a peripheral region of the image capture chip 113 and/or at the memory chip 112.

Figure 14:
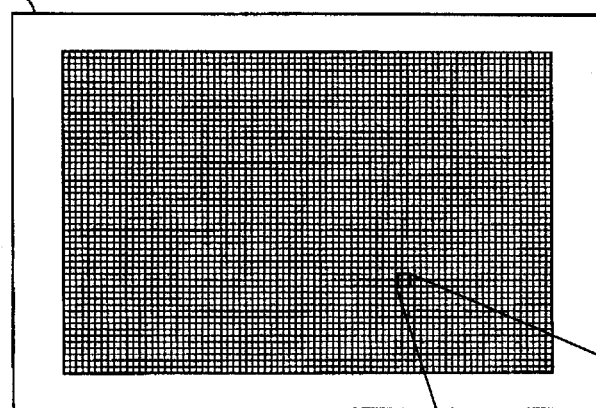
FIG. 14 is a figure for explanation of a pixel array and unit blocks upon an image capture chip.

FIG. 14 is a figure for explanation of the arrangement of pixels on the image capture chip 113, and for explanation of unit groups 131 of those pixels. In particular, this figure shows a situation in which the image capture chip 113 is viewed from its rear surface side. For example, 20,000,000 or more pixels may be arranged in this image capture region 114 in a matrix configuration. In this embodiment, for example, a single block 131 may be constituted by 64 adjacent pixels in an 8×8 arrangement. The lattice lines in the figure show the concept of grouping together adjacent pixels and thereby defining the blocks 131. The number of pixels that make up each of the blocks 131 is not to be considered as being particularly limited; for example, a block could be 32 pixels×64 pixels, or larger or smaller. In this embodiment, no circuit or wiring or the like is provided between the plurality of blocks 131, so that the plurality of blocks can be arranged closely together, and thereby a reduction of the space occupied is implemented.

As shown in the partial enlarged view of the pixel region, a block 131 includes 16 so-called Bayer arrays arranged vertically and horizontally, each formed by four pixels, i.e. two green colored pixels Gb and Gr, a blue colored pixel B, and a red colored pixel R. The green colored pixels are pixels having green colored filters as their color filters 102, and thus receive light of the green colored wavelength band in the incident light. In a similar manner, the blue colored pixels are pixels having blue colored filters as their color filters 102, and thus receive light of the blue colored wavelength band in the incident light, and the red colored pixels are pixels having red colored filters as their color filters 102, and thus receive light of the red colored wavelength band in the incident light.

In this embodiment, a plurality of the blocks 131 are defined so that at least one group of two green colored pixels Gb and Gr, a blue colored pixel B and a red colored pixel R is included in one block 131, and, in each of these blocks 131, the pixels included in the blocks 131 can be controlled with mutually different control parameters. In other words, it is possible to acquire image capture signals from pixel groups included in some block 131 and from pixel groups included in another block 131, for which the image capture conditions are mutually different. Examples of control parameters are: the frame rate, the gain, the sub-sampling ratio, the number of rows or columns of pixel signals to be added together, the time interval for charge accumulation or the number of times of charge accumulation, the number of bits for digitization, and so on. Furthermore, such control parameters could also be parameters for the image processing that is performed after acquisition of image signals from the pixels.

Figure 15:
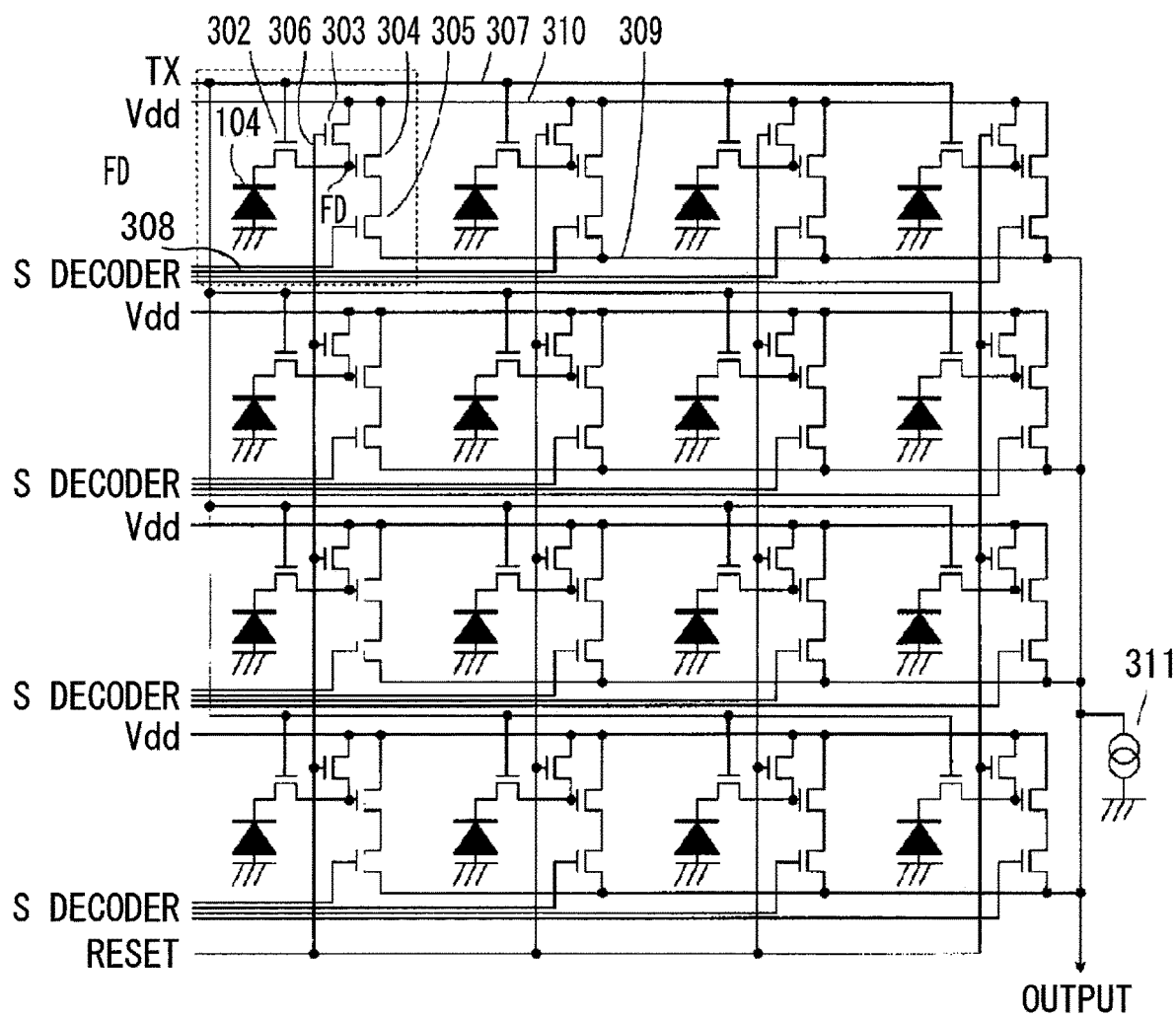
FIG. 15 is a circuit diagram for explanation of the blocks upon the image capture chip.

FIG. 15 is a circuit diagram corresponding to one block 131 of the image capture chip 113. In FIG. 15, the representative rectangle surrounded by a dotted line indicates a circuit that corresponds to a single pixel. In the example of FIG. 15, 16 pixels among the 64 pixels that constitute the block 131 are shown by way of example. It should be understood that, in the following explanation, at least some of the transistors correspond to the transistors 105 of FIG. 1.

Each of the PDs 104 for these pixels is connected to a corresponding transfer transistor 302, and TX wiring 307 (a transfer section control line) to which transfer pulses are supplied is connected to the gates of these transfer transistors 302. In this embodiment, the TX wiring 307 is connected to all of the 64 transfer transistors 302 in common.

The drain of each of the transfer transistors 302 is connected to the source of a corresponding reset transistor 303, and a so-called floating diffusion FD is defined between the drain of each of the transfer transistors 302 and the source of the corresponding reset transistor 303, and is connected to the gate of an amplification transistor 304. The drain of each of the reset transistors 303 is connected to Vdd wiring 310 to which power supply voltage is supplied, and its gate is connected to reset wiring 306, with reset pulses being supplied to this gate. In this embodiment, the reset wiring 306 is connected to all of the 64 reset transistors 303 in common.

The drain of each of the amplification transistors 304 is connected to the Vdd wiring 310 to which the power supply voltage is supplied. Moreover, the source of each of the amplification transistors 304 is connected to the drain of the corresponding one of the selection transistors 305. The gate of each of the selection transistors 305 is connected to decoder wiring 308 to which selection pulses are supplied. In this embodiment, the decoder wiring 308 is provided to each of the 64 selection transistors 305 independently. The sources of the selection transistors 305 are connected to output wiring 309 in common. A load current source 311 supplies current to the output wiring 309. In other words, the output wiring 309 for the selection transistors 305 is constituted as a source follower. It should be understood that this load current source 311 could also be provided on the side of the image capture chip 113, or on the side of the signal processing chip 111.

Now, the flow of operation from the start of charge accumulation until pixel output after accumulation has ended will be explained. A reset pulse is supplied to the reset transistor 303 via the reset wiring 306, and, simultaneously therewith, a transfer pulse is supplied to the transfer transistor 302 via the TX wiring 307, so that the potentials of the PD 104 and of the floating diffusion FD are reset.

When supply of the transfer pulse to the PD 104 is cancelled, the incident light is converted to electrical charge and is accumulated. And, when subsequently a transfer pulse is supplied for a second time in the state in which no reset pulse is being supplied, the charge that has been accumulated is transferred to the floating diffusion FD, and the potential of the floating diffusion FD changes from the reset potential to the signal potential after charge accumulation. And, when a selection pulse is supplied to the selection transistor 305 via the decoder wiring 308, change of the signal potential of the floating diffusion FD is transmitted to the output wiring 309 via the amplification transistor 304 and the selection transistor 305. Due to this, a pixel signal corresponding to the reset potential and to the signal potential is output from this unit pixel to the output wiring 309.

As shown in FIG. 15, in this embodiment, the reset wiring 306 and the TX wiring 307 are provided in common for the 64 pixels that make up the block 131. In other words, the reset pulse and the transfer pulse are applied simultaneously to all of these 64 pixels. Accordingly, all of the pixels that make up the block 131 start accumulation of charge at the same timing and stop accumulation of charge at the same timing. However, due to the fact that the selection pulses are applied sequentially to each of the selection transistors 305, the pixel signals corresponding to the charges that have been accumulated are selectively output to the output wiring 309 for each pixel P. Moreover, the reset wiring 306, the TX wiring 307, and the output wiring 309 are provided separately for each of the blocks 131.

It is possible to control the charge accumulation interval for each of the blocks 131 by building the circuit while taking the blocks 131 as reference in this manner. To put this in another way, for different ones of the blocks 131, it is possible to output pixel signals based according to frame rates that are mutually different. Furthermore, while charge accumulation is being performed one time for one of the blocks 131, by repeating charge accumulation for another of the blocks 131 any appropriate number of times and by outputting pixel signals each time, it is possible to output frames for movie use at frame rates that are different between these blocks 131.

Figure 16:
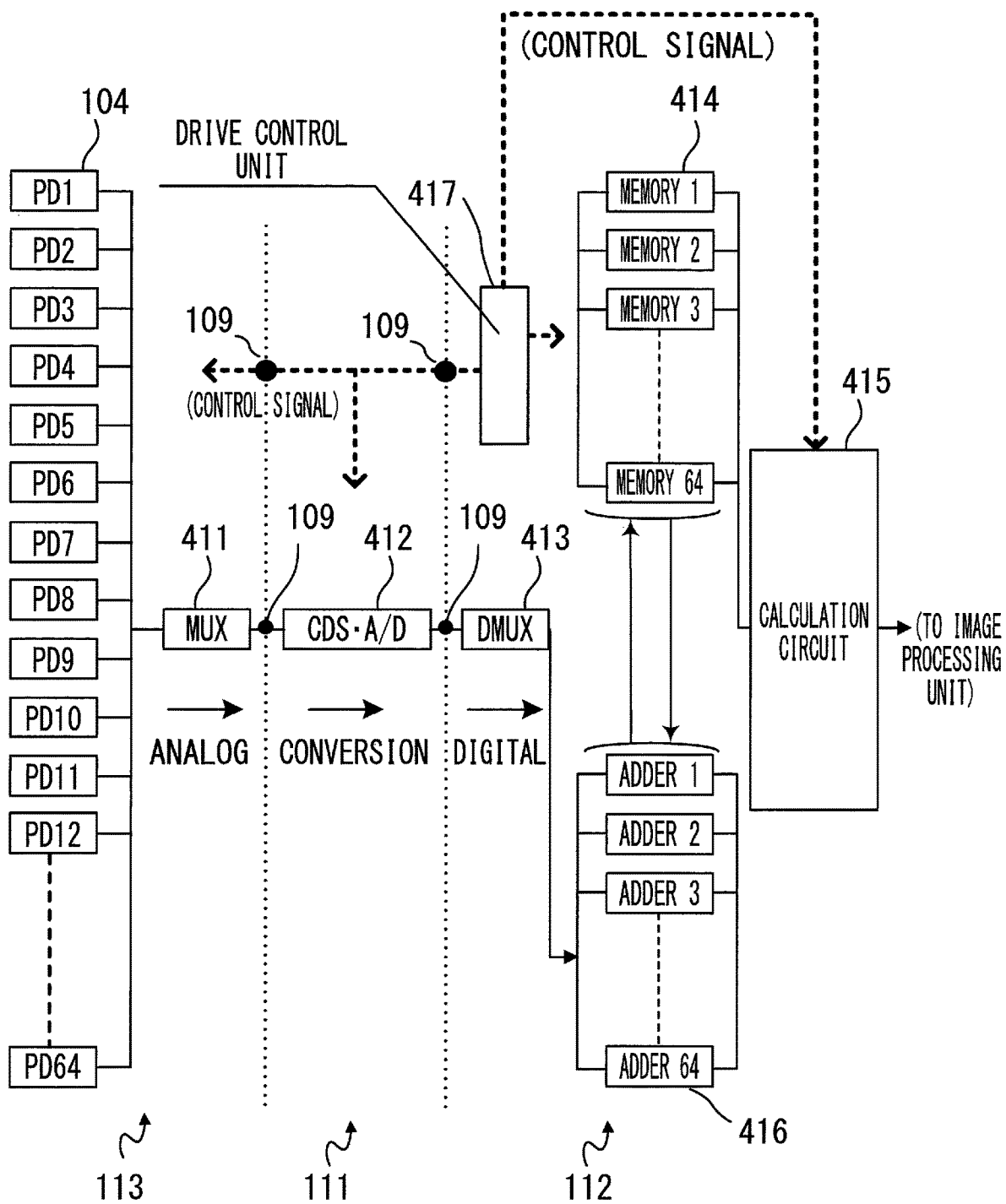
FIG. 16 is a block diagram showing the functional structure of the imaging element.

FIG. 16 is a block diagram showing the functional structure of the imaging element 100. An analog multiplexer 411 selects the 64 PDs 104 that make up the block 131 in order, and outputs their respective pixel signals to the output wiring 309 that is provided to correspond to that block 131. The multiplexer 411 is formed upon the image capture chip 113 along with the PDs 104.

The pixel signals output via the multiplexer 411 are subjected to correlated double sampling (CDS) and analog/digital (A/D) conversion by a signal processing circuit 412 that is formed upon the signal processing chip 111, and thereby are subjected to CDS and A/D conversion. After the above described A/D conversion, the pixel signals are input to adders 416 that correspond respectively to each of the pixels. The adders 416, which respectively correspond to the pixels, add together the pixel signals outputted from the demultiplexer 413 and pixel signals that are read out from pixel memories 414, and output the pixels signals after addition back to the pixel memories 414 for a second time.

The pixel memories 414 store the pixel signals from the adders 416. Each of the pixel memories 414 has a capacity that is capable of storing the pixel signals after addition. The demultiplexer 413, the adders 416, and the pixel memories 414 are formed upon the memory chip 112.

Figure 17:
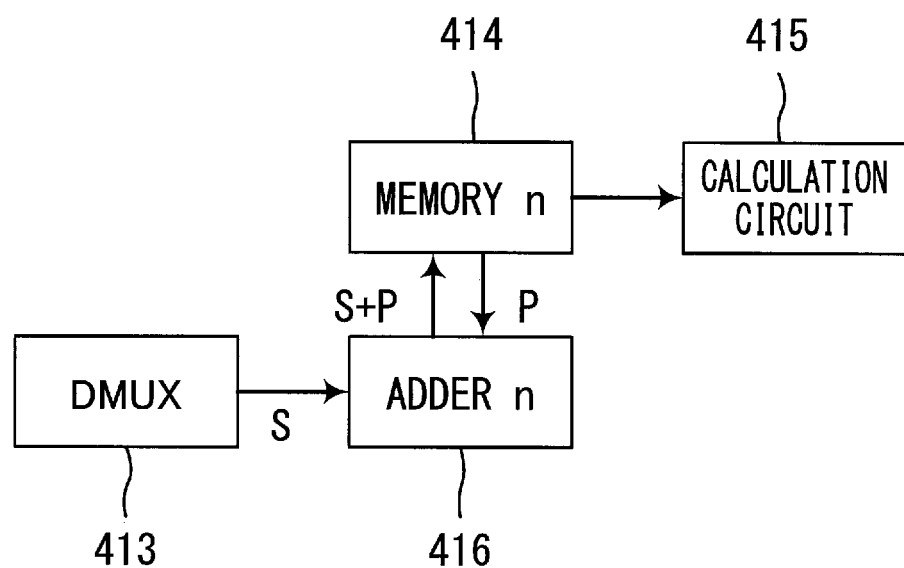
FIG. 17 is a figure for explanation of the flow of the pixel signal for one pixel.

FIG. 17 is a figure for explanation of the flow of the pixel signal for one pixel. In FIG. 17, the pixel signal S that is output from the demultiplexer 413 is input to an adder n, which corresponds to one of the adders 416. At this time, the pixel signal P that is stored in the corresponding memory n, which corresponds to one of the pixel memories 414, is read out from that memory n and is also inputted to the adder n.

The adder n adds together the pixel signal S and the pixel signal P that are input, and outputs the pixel signal S+P after addition to the pixel memory n. And the pixel memory n stores this pixel signal S+P that has been input, and waits for it to be read out to the calculation circuit 415. Here, when addition is performed by the adder n, it is possible to output only the pixel signal S that has been input to the adder n just as it is from the adder n to the pixel memory n, by controlling the pixel memory 414 so that the pixel signal P that is being stored in the pixel memory n is not read out. In other words, it is also possible for addition not to be performed by the adder n, and for the pixel signal S from the image capture chip 113 to be read out to the calculation circuit 415 from the memory n just as itis.

The calculation circuit 415 processes the pixel signal stored in the pixel memory 414 and transfers it to a subsequent stage image processing unit. The calculation circuit 415 may be provided upon the signal processing chip 111, or may be provided upon the memory chip 112.

A drive control unit 417 generates timing control signals for synchronizing the timings at which the pixel signals are sent from the image capture chip 113 to the signal processing chip 111 and to the memory chip 112, the timings at which the pixel signals in the pixel memories 414 are read out and are stored therein, the pixel signal addition timings for the adders 416, and the timings at which the pixel signals are transferred to the calculation circuit 415.

It should be understood that while, in FIG. 16, the connections for a single one of the blocks 131 are shown, actually these connections are present for each of the blocks 131, and operate in parallel. However, it is not necessary for a calculation circuit 415 to be provided for each of the blocks 131; for example, it would also be acceptable to arrange for processing to be performed sequentially while a single calculation circuit 415 refers in order to the values in the pixel memories 414 corresponding to each of the blocks 131.

As described above, output wiring 309 is provided to correspond to each of the blocks 131. Since, in this imaging element 100, the image capture chip 113, the signal processing chip 111, and the memory chip 112 are laminated together, accordingly, by using electrical connections between these chips that employ the bumps 109 in the output wiring 309, it is possible to extend the wiring without making the chips larger in their planar direction.

—Explanation of the Imaging Device—

Figure 18:
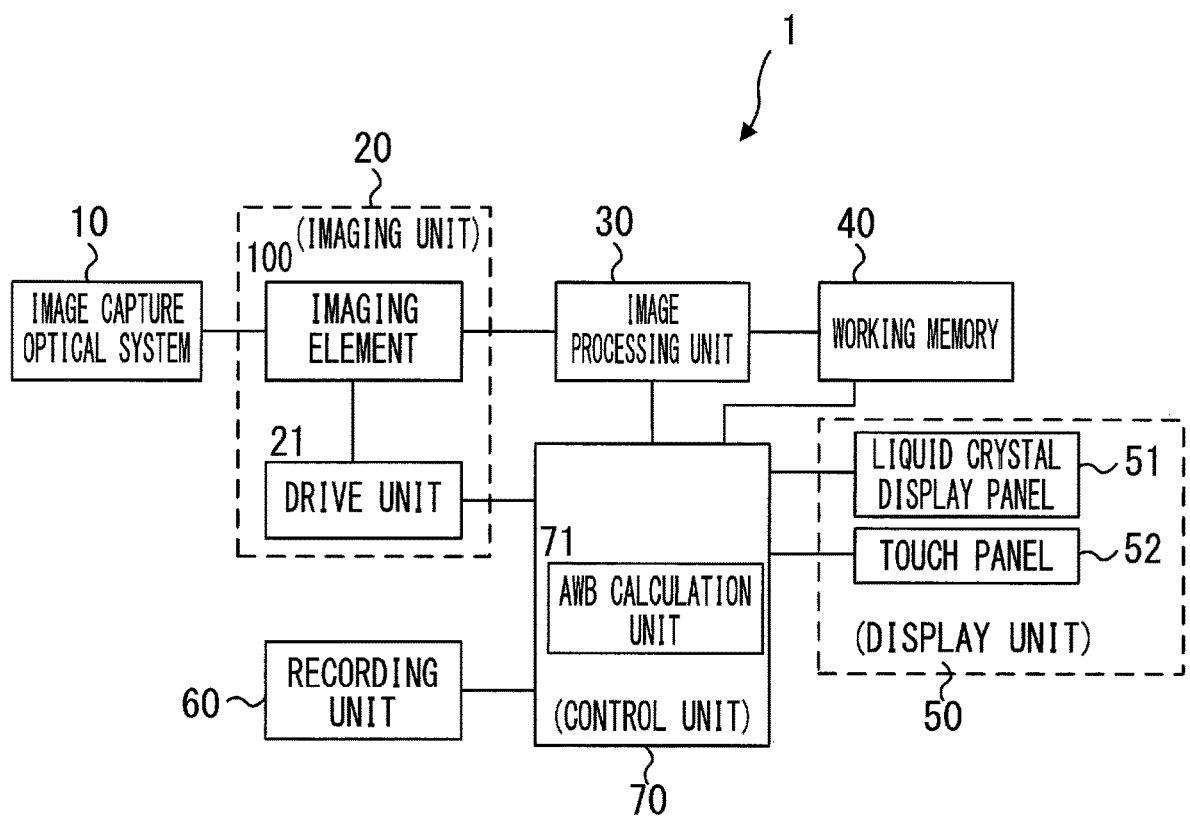
FIG. 18 is a block diagram showing an example of the structure of an imaging device that includes the above imaging element.

FIG. 18 is a block diagram showing an example of the structure of an imaging device 1 that includes the imaging element 100 described above. In FIG. 18, the imaging device 1 comprises an image capture optical system 10, an imaging unit 20, an image processing unit 30, a working memory 40, a display unit 50, a recording unit 60, and a control unit 70.

The image capture optical system 10 consists of a plurality of lenses, and conducts a light flux from the photographic field to the imaging unit 20. This image capture optical system 10 may be built integrally with the imaging device 1, or may be built so as to be detachable from the imaging device 1. Moreover, it would also be acceptable to house a focus lens within the image capture optical system 10, or to house a zoom lens therein.

The imaging unit 20 comprises the imaging element 100 mentioned above and a drive unit 21 that drives the imaging element 100. By the imaging element 100 being drive controlled by control signals output by the drive unit 21, control can be executed for charge accumulation to be performed by each of the blocks 131 described above. Command of the drive unit 21 for control of charge accumulation is performed by the control unit 70.

In cooperation with the working memory 40, the image processing unit 30 performs image processing upon image data captured by the imaging unit 20. In this embodiment, apart from temporarily storing image data and so on before and after JPEG compression and/or before and after MPEG compression, the working memory 40 is also used as a buffer memory for images captured by the imaging unit 20. The display unit 50 may include, for example, a liquid crystal display panel 51, and displays images (still images and movie images) captured by the imaging unit 20 and information of various kinds, as well as displaying a screen for operational input. In the structure of this display unit 50, a touch panel 52 is laminated over the display surface of the liquid crystal display panel 51. The touch panel 52 outputs a signal specifying the position at which the user has touched the liquid crystal display panel 51.

The recording unit 60 stores data of various types upon a storage medium such as a memory card or the like, such as image data acquired in response to an image capture command (i.e. in response to release actuation that will be described hereinafter) and so on. And the control unit 70 includes a CPU, and controls the overall operation of the imaging device 1. For each block 131 of the imaging element 100 (i.e. of the image capture chip 113), the control unit 70 issues commands for various control parameters to the drive unit 21 so as to causes an image to be acquired at a predetermined frame rate (i.e., with a predetermined charge accumulation time interval) and at a predetermined gain, and reading out control of the acquired image data to be performed.

Moreover, on the basis of the image data, the control unit 70 performs white balance adjustment with an AWB calculation unit 71. And furthermore, the control unit 70 generates an image for replay display on the basis of the pixel signals, and displays this image upon the display unit 50.

—The Monitoring Sensor—

Figure 19:
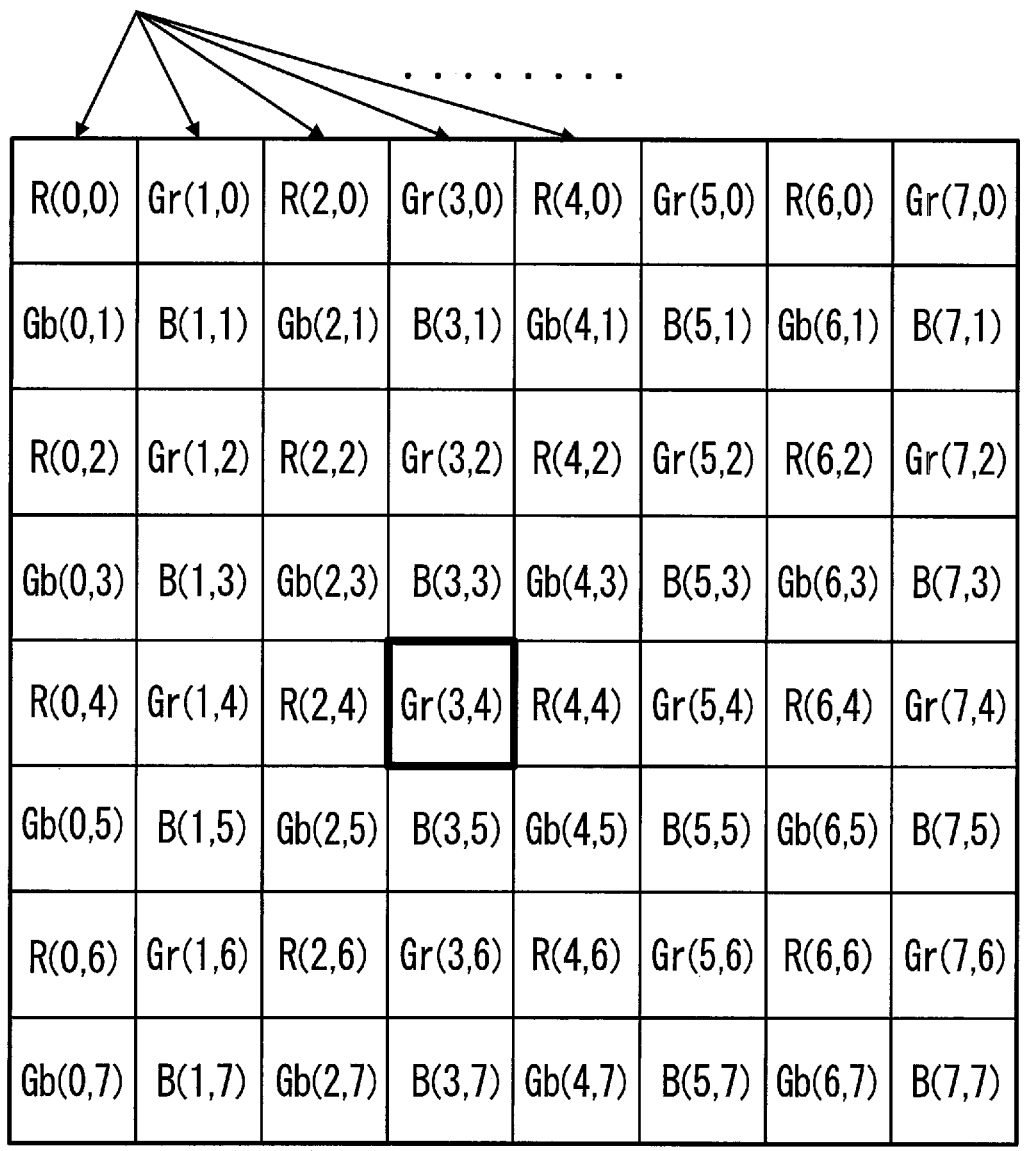
FIG. 19 is a figure for explanation of the arrangement of a plurality of pixels in a block.

In this embodiment, the charge accumulation time interval for all of the pixels included in each of these blocks 131 is determined on the basis of the charge accumulation amount measured by a monitoring sensor. Here, the sensor that determines the charge accumulation amount of the pixels is termed a "monitoring sensor". FIG. 19 is a figure for explanation of the arrangement of the plurality of pixels in one of the blocks 131. In this imaging device 1, a single green colored pixel Gr(3,4) that is positioned at the approximate center of the block 131 is made to function as a monitoring sensor that is representative of this block 131.

During photography of, for example, a still image, the control unit 70 sends commands to the drive unit 21 for reading out pixel signals from each of the blocks 131 of the imaging element 100 (i.e. of the image capture chip 113) at predetermined time intervals that are determined in advance. For example, the pixel signals are read out at a plurality of separated time points t1, t2, t3, . . . , t7, t8.

And, among the pixel signals that have thus been read out, the control unit 70 checks the pixel signal levels from the monitoring sensors (i.e. from the green colored pixels Gr(3, 4)). Moreover, at the time point (for example, the time point t5) that the integrated value of the pixel signals that have been read out has exceeded a decision threshold value that is determined in advance, the time interval until the time point one before that time point (i.e. until the time point t4) is determined as being the charge accumulation time interval for all of the pixels in the corresponding block 131. In this case, the reading out of the pixel signals from this block 131 after the time point t6 is cancelled.

Figure 20:
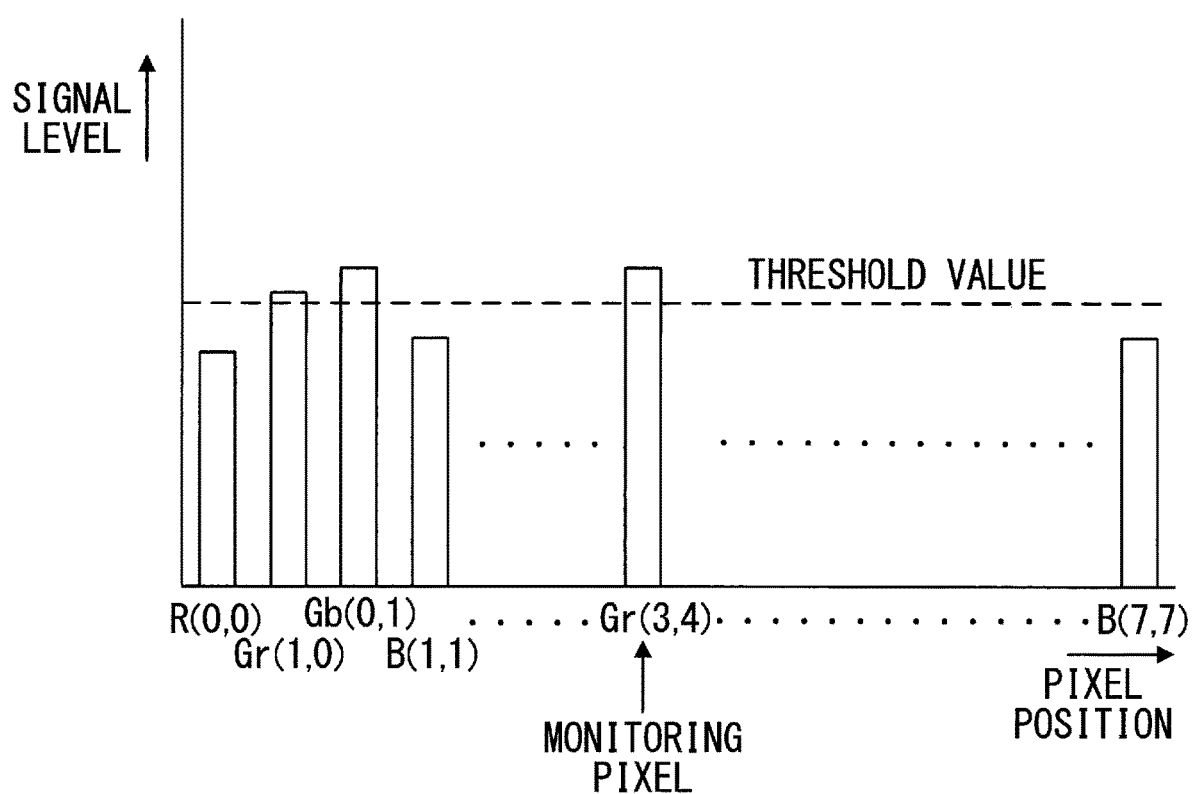
FIG. 20 is a figure showing, for a block, the relationship between the pixel positions and their pixel signal levels.

FIG. 20 is a figure showing, for the block 131, the relationship between all the pixel positions and their pixel signal levels. If the pixel signal level from the monitoring sensor (i.e. the green colored pixel Gr(3,4)) exceeds the decision threshold value, then the control unit 70 stops the accumulation of charge for all of the pixels within this block 131, even if the pixel signal levels from other pixels are smaller than the decision threshold value. Conversely, if the pixel signal level from the monitoring sensor (i.e. the green colored pixel Gr(3,4)) has not exceeded the decision threshold value, then the control unit 70 continues the accumulation of charge for all of the pixels within this block 131, even if the pixel signal levels from other pixels are greater than the decision threshold value.

However, the control unit 70 takes the time period until the time point t8 as being the upper limit for the charge accumulation time interval, even if at this time point t8 the pixel signal level from the monitoring sensor (i.e. the green colored pixel Gr(3,4)) that is read out has not exceeded the decision threshold value described above.

—An Example of Reading Out the Pixel Signals—

The reading out of the pixel signals from a block 131 will now be explained with reference to FIG. 21, which explains the timings for reading out the pixel signals, the charge accumulation time interval of the image capture chip 113, and the pixel signals that are read out from the imaging element 100 via the calculation circuit 415.

The drive unit 21 controls the imaging element 100 in the following manner. That is, the first charge accumulation time interval is taken as being from the time point t0 at which accumulation is started until the time point t1, and the second charge accumulation time interval is taken as being from the time point t0 until the time point t2. The drive unit 21 starts charge accumulation for the pixels included in the block 131 at the time point to. And, at the time point t1, the pixel signals from the block 131 are output while controlling the pixel memories 414 so that the pixel signal which is stored in the pixel memory n, in the example shown in FIG. 17, is not read out. Due to this, the pixel signal a accumulated during the first charge accumulation time interval (from the time point t0 to the time point t1) is output from the demultiplexer 413, and is output via the calculation circuit just as it is as a signal A. This pixel signal A (=a) is also stored in the pixel memory n.

When performing the reading out of the pixel signal described above at the time point t1, the drive unit 21 also immediately starts charge accumulation by the pixels included in the block 131. And the pixel signals from the block 131 are output at the time point t2, while controlling the pixel memories 414 so as to read out the pixel signal a stored in the pixel memory n shown by way of example in FIG. 17. Due to this, the pixel signal b accumulated from the time point t1 until the time point t2 is output from the demultiplexer 413, and this pixel signal b and the pixel signal a read out from the pixel memory n are added together by the adder n. The pixel signal a+b after addition is output via the calculation circuit 415 as a signal B. This pixel signal B is stored in the pixel memory n. Since the pixel signal B (=a+b) is the sum of the pixel signals accumulated from the time point t0 to the time point t1, and from the time point t1 to the time point t2, accordingly it is equivalent to the pixel signal accumulated during the second charge accumulation time interval (i.e. from the time point t0 to the time point t2).

In a similar manner, when performing the reading out of the pixel signal described above at the time point t2, the drive unit 21 also immediately starts charge accumulation by the pixels included in the block 131. And the pixel signals from the block 131 are output at the time point t3, while controlling the pixel memories 414 so as to read out the pixel signal B stored in the pixel memory n shown by way of example in FIG. 17. Due to this, the pixel signal c accumulated from the time point t2 until the time point t3 is output from the demultiplexer 413, and this pixel signal c and the pixel signal B read out from the pixel memory n are added together by the adder n. The pixel signal B+c after addition is output via the calculation circuit 415 as a signal C. This pixel signal C is also stored in the pixel memory n. Since the pixel signal C (=B+c) is the sum of the pixel signals accumulated from the time point t0 to the time point t2, and from the time point t2 to the time point t3, accordingly it is equivalent to the pixel signal accumulated during the third charge accumulation time interval (i.e. from the time point t0 to the time point t3).

Subsequently, in a similar manner, by reading out the pixel signals from the time point t4 to the time point t8, it is possible to obtain the pixel signals accumulated during each of the fourth charge accumulation time interval (from the time point t0 to the time point t4), the fifth charge accumulation time interval (from the time point t0 to the time point t5), the sixth charge accumulation time interval (from the time point t0 to the time point t6), the seventh charge accumulation time interval (from the time point t0 to the time point t7), and the eighth charge accumulation time interval (from the time point t0 to the time point t8). It should be understood that, as described above, the accumulation of charge up to the eighth charge accumulation time interval only takes place if the integrated value of the pixel signal from the monitoring sensor (i.e. the green colored pixel Gr(3,4)) does not exceed the decision threshold value which has been determined in advance.

—The Normalization Processing—

As explained above, if the amount of incident light is different between different ones of the blocks 131 when determining the charge accumulation time interval for each of the blocks 131, then in some cases the charge accumulation time intervals differ between the various blocks 131. Due to this, the control unit 70 creates an image by performing normalization processing related to the charge accumulation time intervals between the blocks 131.

Figure 22:
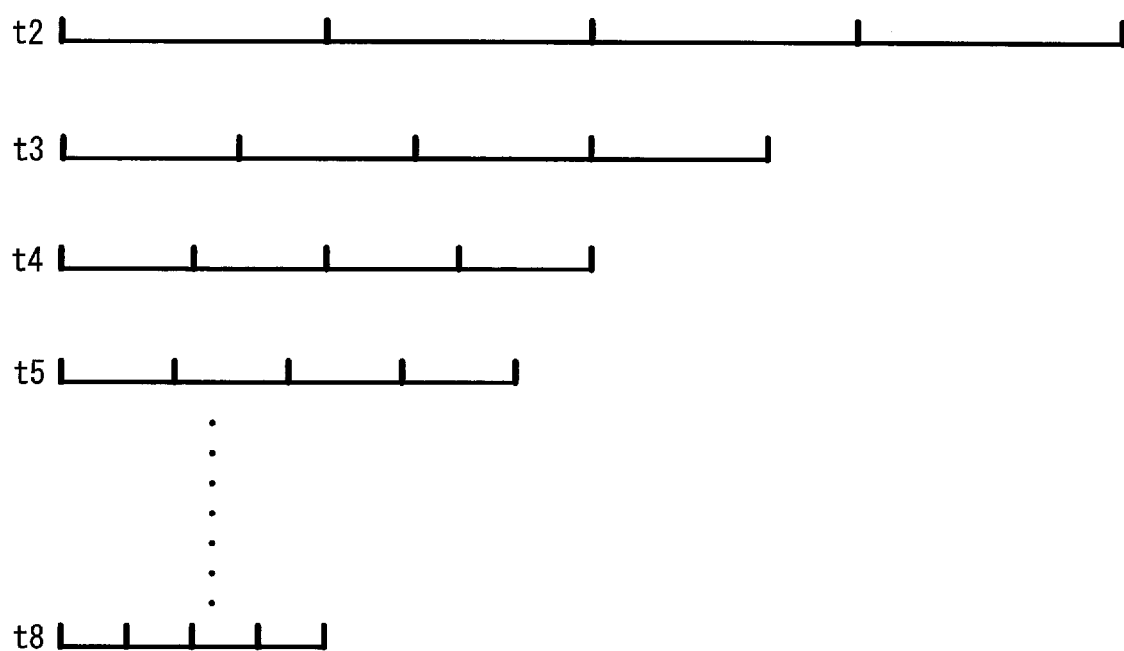
FIG. 22 is a figure for explanation of normalization processing.

FIG. 22 is a figure for explaining this normalization processing. For example, if the pixel signal values of the block 131, when the charge accumulation time interval is the eighth charge accumulation time interval (from the time point t0 to the time point t8), are taken as a reference, then, for a block 131 for which the charge accumulation time interval is the second charge accumulation time interval (from the time point t0 to the time point t2), the pixel signal values are calculated by being quadrupled (=8/2). Moreover, for a block 131 for which the charge accumulation time interval is the fourth charge accumulation time interval (from the time point t0 to the time point t4), the pixel signal values are calculated by being doubled (=8/4). And, for a block 131 for which the charge accumulation time interval is the fifth charge accumulation time interval (from the time point t0 to the time point t5), the pixel signal values are calculated by being multiplied by 8/5. The same holds for the other charge accumulation time intervals.

The control unit 70 normalizes the pixel signal values to a predetermined bit length (for example, 14 bits) after having adjusted the pixel signal values according to the differences between the charge accumulation time intervals for the various blocks, as described above. Due to this, an image is obtained having a wide dynamic range, in which the magnitudes of the signal values originating in discrepancies in the charge accumulation time interval between the different blocks 131 have been corrected. The control unit 70 performs white balance adjustment with the AWB calculation unit 71 on the basis of the pixel signals after normalization processing has been performed in this manner.

—Explanation of the Flow Chart—

Figure 23:
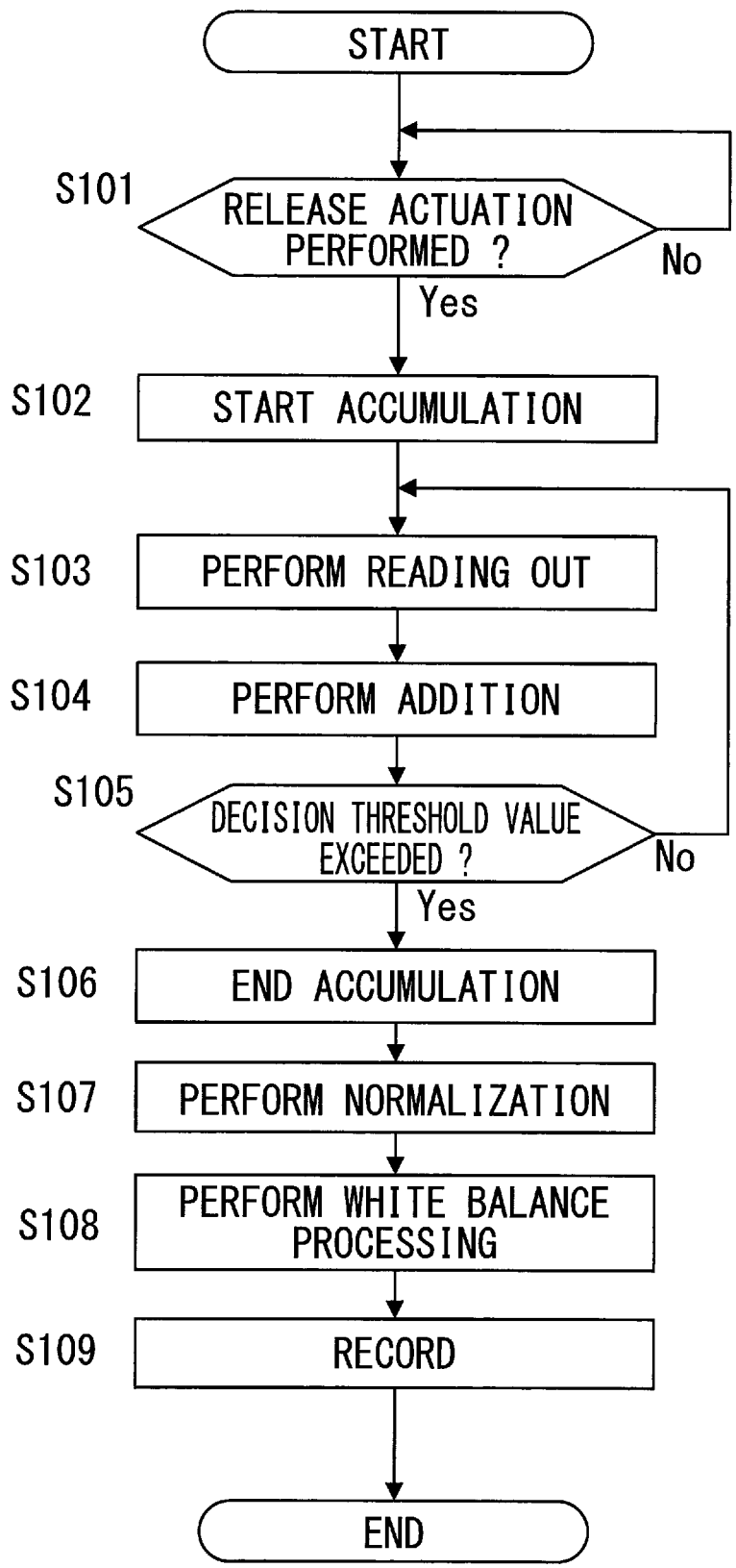
FIG. 23 is a flow chart for explanation of the flow of photographic operation executed by a control unit.

FIG. 23 is a flow chart for explanation of the flow of photographic operation performed by the control unit 70 of the imaging device 1. When an on-off switch not shown in the figures is actuated to turn the power supply on, power is supplied to the various sections of the imaging device 1, and repetition of the processing in FIG. 23 is started. And, even if a release button not shown in the figures has been half press actuated, the control unit starts the processing in FIG. 23. Half press actuation is an actuation mode in which the release button is pressed downward to a shallower extent than during full press actuation.

In step S101 of FIG. 23, the control unit 70 makes a decision as to whether or not release actuation (in other words, full press actuation of the release button) has been performed. If an actuation signal that specifies that the release button has been full press actuated is input, then the control unit 70 reaches an affirmative decision in step S101, and the flow of control proceeds to step S102. On the other hand, if the full press actuation described above has not been performed, then the control unit 70 reaches a negative decision in step S101, and the above decision processing is repeated.

In step S102, the control unit 70 sends a command to the drive unit 21 and starts accumulation of charge for all of the blocks 131 of the imaging element 100, and then the flow of control proceeds to step S103 (this corresponds to the time point t0 described above). In step S103, the pixel signals are read out from the image capture chip 113 in units of the blocks 131. Then in step S104 the adders 416 add together the pixel signals that have been read out corresponding to each of the pixels and the pixel signals that are stored in the pixel memories 414. The pixel signals after addition are then again stored in the pixel memories 414.

In step S105, for each of the blocks 131, in relation to the pixel signals from the monitoring sensors, the control unit 70 makes a decision as to whether or not the integrated value after addition has exceeded the decision threshold value that has been set in advance. And, for those blocks 131 for which the decision threshold value has been exceeded, the control unit 70 reaches an affirmative decision in this step S105, and the flow of control proceeds to step S106. However, for those blocks 131 for which the decision threshold value has not been exceeded, the control unit 70 reaches a negative decision in this step S105, and the flow of control returns to step S103. If the flow of control returns to step S103, then the processing described above for that block 131 is continued.

In step S106, the control unit 70 sends a command to the drive unit 21 to terminate charge accumulation for the corresponding block 131 that is the current subject, and then the flow of control proceeds to step S107. In step S107, the control unit 70 performs normalization processing in relation to the charge accumulation charge intervals between the blocks 131, as described above, and then the flow of control proceeds to step S108.

In step S108, the control unit 70 sends a command to the AWB calculation unit 71 and performs white balance processing, and then the flow of control proceeds to step S109. In step S109, the control unit 70 sends a command to the recording unit 60 and records the image data upon a storage medium such as a memory card or the like, and then the processing of FIG. 23 terminates.

According to this second embodiment as explained above, the following beneficial operational effects are obtained.

(1) It is arranged for the imaging device 1 to comprise: the image capture chip 113 upon which the plurality of PDs 104 are arranged; the control unit 70 that subdivides the image capture chip 113 into a plurality of area blocks 131 each of which includes a plurality of PDs 104, that controls the charge accumulation time intervals of the PDs 104 by units of area blocks 131, and that moreover is capable of reading out the accumulated signals by units of area blocks 131; and at least a first monitoring sensor Gr(3,4) and a second monitoring sensor Gr(3,4) that are respectively provided to a first area block 131 and a second area block 131, and that are capable of reading out charge accumulation amounts from their corresponding PDs 104. Due to this, it is possible to obtain an appropriate exposure for each area of the image corresponding to each block 131. For example, even in the case of backlit photography, without saturating the background, it is possible to obtain an adequate exposure also for the main photographic subject. Moreover it is unnecessary to redo photographic operation, since it is possible to obtain an appropriate exposure with one photographic shot.

(2) While the plurality of PDs 104 include some PDs 104 upon which color filters 102 of green color Gr (Gb) are provided and some PDs 104 upon which color filters 102 of other colors (i.e. B and R) than green color Gr (Gb) are provided, the first monitoring sensor Gr(3,4) and the second monitoring sensor Gr(3,4) are constituted by PDs 104 upon which color filters 102 of green color Gr (Gb) are provided in the first area block 131 and the second area block 131. By using as the monitoring sensors PDs 104 upon which color filters 102 of green color are provided whose sensitivity is generally high, it is possible to obtain appropriate charge accumulation amounts.

(3) Since it is arranged to provide the first monitoring sensor Gr(3,4) and the second monitoring sensor Gr(3,4) at the approximate centers of the first area block 131 and the second area block 131, accordingly it is possible to obtain charge accumulation amounts that are based upon representative amounts of incident light for each of these blocks 131.

(4) Since, when the amount of charge accumulated by the first monitoring sensor Gr(3,4) reaches the predetermined charge accumulation amount, the control unit 70 stops charge accumulation by the PDs 104 included in the corresponding first area block 131, accordingly it is possible to control the charge accumulation time interval by the PDs 104 of this first area block 131 in an appropriate manner.

(5) Moreover since, when the amount of charge accumulated by the second monitoring sensor Gr(3,4) reaches the predetermined charge accumulation amount, the control unit 70 stops charge accumulation by the PDs 104 included in the corresponding second area block 131, accordingly it is possible to control the charge accumulation time interval by the PDs 104 of this second area block 131 in an appropriate manner.

(6) Since the control unit 70 reads out the accumulated signals from the PDs 104 that have ended accumulation of charge by units of area blocks 131, accordingly it is possible to read out the pixel signals for each area of the image in an appropriate manner corresponding to each block 131.

(7) And, since the control unit 70 starts reading out the charge accumulation amounts from the first monitoring sensor Gr(3,4) and from the second monitoring sensor Gr(3,4) according to release actuation, accordingly it is possible to detect the charge accumulation amounts in an appropriate manner after release actuation (in other words, after a command for photography has been issued).

(8) In this imaging element 100, the plurality of PDs 104 are arrayed in the image capture chip 113, and it is arranged: for it to be possible to control the charge accumulation time intervals of the PDs 104 by a plurality of area block units 131 into which the image capture chip 113 is subdivided so that a plurality of the PDs 104 are included therein; for it to be possible to read out the signals accumulated in the PDs 104 by the area block units 131; to provide at least a first monitoring sensor Gr(3,4) and a second monitoring sensor Gr(3,4) to a first area block 131 and to a second area block 131 respectively; and for it to be possible to read out charge accumulation amounts obtained by the PDs in the first area block 131 and charge accumulation amounts obtained by the PDs 131 in the second area block 131 from the first monitoring sensor Gr(3,4) and from the second monitoring sensor Gr(3,4), respectively. By employing this type of imaging element 100, it is possible to obtain an appropriate exposure for each area of the image corresponding to each block 131. For example, even in backlit photography, an adequate exposure is obtained even for the main photographic subject, without the background becoming saturated. Moreover, since an appropriate exposure is obtained with a single photographic shot, accordingly it is unnecessary to perform photographic operation for a second time.

Variant Embodiment #1

It would also be possible to arrange to provide an imaging device according to the embodiment described above to a high-functioning portable telephone or to a tablet terminal. In this case, a camera unit that is mounted to such a high-functioning portable telephone or to such a tablet terminal would be built so as to employ a laminated type imaging element of the above described type.

Variant Embodiment #2

In the embodiment described above, an example was explained in which, during still image photography, when capturing an image to be recorded after release actuation, the charge accumulation time intervals were controlled separately for each of the blocks 131. However, control of the charge accumulation time intervals separately for each of the blocks 131 is not to be considered as being limited to still image photography; such control could also be performed during photography of a live view image, or during movie image photography. For example, if capture of a movie image is being performed, then, when capturing the images of several frames, the charge accumulation time intervals for the frames may be controlled in units of the blocks 131.

According to this type of variant embodiment #2, it is possible to control the charge accumulation time interval in an appropriate manner for each frame, even during photography of a live view image and/or of a movie image.

Variant Embodiment #3

While, in the explanation given above, an example was explained in which the charge accumulation time interval was subdivided into 8 stages, it would also be acceptable to subdivide the charge accumulation time interval into 4 stages or into 16 stages, and this number of stages may be varied as appropriate.

Variant Embodiment #4

In the above explanation, an example was explained in which one green colored pixel Gr(3,4) in each block 131 was endowed with the function of acting as a monitoring sensor.

However, it would also be acceptable to arrange to provide monitoring sensors that are different from the PDs that are incorporated in the pixels.

Variant Embodiment #5

In the above explanation, it was arranged for the green colored pixel Gr(3,4) that was endowed with the function of acting as a monitoring sensor for the block 131 to have structure in common with other pixels within the same block 131. Instead of this it would also be acceptable, for pixels other than the green colored pixel Gr(3,4) that is endowed with the function of acting as a monitoring sensor, to arrange to perform charge accumulation without separating the charge accumulation time interval into a plurality of portions from the time point t1 until the time point t8, and to continue this charge accumulation until the pixel signal level from the monitoring sensor (i.e. from the green colored pixel Gr(3,4)) reaches the decision threshold value. In this case, for these pixels other than the green colored pixel Gr(3,4) that is endowed with the function of acting as a monitoring sensor, the reading out during charge accumulation and the addition processing becomes unnecessary.

Variant Embodiment #6

While an example was explained above in which a green colored pixel Gr(3,4) that was positioned at the approximate center of each of the blocks 131 was chosen as the pixel to be endowed with the function of acting as a monitoring sensor, the position of the position that is to be made to act as the monitoring sensor should not be considered as being limited to a pixel that is in the approximate center of its block; the position of the monitoring pixel within the block 131 may be varied as appropriate.

Variant Embodiment #7

While, in the embodiment described above, an example was explained in which a monitoring sensor was provided for each of the blocks 131, it would also be acceptable to provide some blocks 131 that are not equipped with any such monitoring sensor. In this case, the charge accumulation time interval for the pixels of a block that does not have any monitoring sensor may be determined on the basis of the charge accumulation amounts derived by one or a plurality of monitoring sensors of one or a plurality of neighboring blocks to which one monitor sensor or monitoring sensors are provided. It would be acceptable to arrange to determine the charge accumulation amount on the basis of the charge accumulation amount derived from a monitoring sensor for a single neighboring block 131; or it would also be acceptable to arrange to determine the change accumulation amounts on the basis of the charge accumulation amounts derived from monitoring sensors for a plurality of neighboring blocks 131 (for example eight or four blocks around the corresponding block).

Variant Embodiment #8

In the explanation given above, an example was explained in which the green colored pixels Gr were endowed with the function of acting as monitoring sensors, and were taken as being representative of other colors such as blue color and red color and so on (the green colored pixels may be Gr or Gb). Instead of this, it would also be acceptable to arrange for the pixels that are endowed with the function of acting as monitoring sensors to be provided in some other color. In other words, any of the green colored pixels Gr, the blue colored pixels B, and the red colored pixels R may function as monitoring sensors.

In a variant embodiment #8, on the basis of the charge accumulation amount obtained from a monitoring sensor that consists of a green colored pixel Gr, the charge accumulation time interval for all of the same colored (i.e. green colored) pixels Gr and Gb that are included in this block 131 may be determined. Moreover, on the basis of the charge accumulation amount obtained from a monitoring sensor that consists of a blue colored pixel B, the charge accumulation time interval for all of the same colored (i.e. blue colored) pixels B that are included in this block 131 may be determined. Yet further, on the basis of the charge accumulation amount obtained from a monitoring sensor that consists of a red colored pixel R, the charge accumulation time interval for all of the same colored (i.e. red colored) pixels R that are included in this block 131 may be determined.

The normalization processing in the case of this variant embodiment #8 is performed separately for the green colored pixels Gr and Gb, for the blue colored pixels B, and for the red colored pixels R. And, after this normalization processing has been performed for each color separately, then adjustment of the pixel signal values between the various colors is performed as white balance processing.

The above explanation relates only to examples; the present invention is not to be considered as being limited by the particular structure of any of the embodiments. Moreover, the structures of the embodiments and variant embodiments described above may be combined in any appropriate manner.

The contents of the disclosures of the following applications, upon which priority is claimed, are hereby incorporated herein by reference:
Japanese Patent Application 2013-243,946 (filed on 26 Nov. 2013); and
Japanese Patent Application 2014-7,869 (filed on 20 Jan. 2014).

What is claimed is:
1. An imaging element comprising:
a first chip that includes a first photoelectric conversion unit which converts light into an electric charge and a second photoelectric conversion unit which converts light into an electric charge;
a second chip that includes a first conversion unit which converts a first signal based on the electric charge converted by the first photoelectric conversion unit into a digital signal and a second conversion unit which converts a second signal based on the electric charge converted by the second photoelectric conversion unit into a digital signal, the first chip and the second chip being laminated together; and
a third chip that includes a first adder which performs a first addition processing on the first signal converted into the digital signal by the first conversion unit and a second adder which performs a second addition processing on the second signal converted into the digital signal by the second conversion unit, the first chip and the third chip being laminated together.
2. The imaging element according to claim 1, wherein the first chip includes:
a semiconductor layer in which the first photoelectric conversion unit and the second photoelectric conversion unit are arranged; and a wiring layer in which a first output wiring to which the first signal is output and a second output wiring to which the second signal is output are arranged, and the wiring layer is arranged between the semiconductor layer and the second chip in a direction in which the first chip and the second chip are laminated.

3. The imaging element according to claim 2, comprising:

a first conductive unit which is a connection unit that electrically connects the first chip and the second chip together and to which the first signal from the first output wiring toward the first conversion unit is output; and a second conductive unit which is a connection unit that electrically connects the first chip and the second chip together and to which the second signal from the second output wiring toward the second conversion unit is output.

4. The imaging element according to claim 3, wherein the first conductive unit and the second conductive unit include a metal member including a copper.

5. The imaging element according to claim 4, wherein the first photoelectric conversion unit and the second photoelectric conversion unit are arranged along a row direction.

6. The imaging element according to claim 4, wherein the first photoelectric conversion unit and the second photoelectric conversion unit are arranged along a column direction.

7. The imaging element according to claim 2, wherein the first adder performs the first addition processing by using a third signal based on the electric charge converted by the first photoelectric conversion unit, the third signal being a signal that is output to the first output wiring before the first signal, and the second adder performs the second addition processing by using a fourth signal based on the electric charge converted by the second photoelectric conversion unit, the fourth signal being a signal that is output to the second output wiring before the second signal.

8. The imaging element according to claim 7, wherein the third chip includes:

a first storage unit that stores a signal for which the first addition processing is performed by the first adder; and a second storage unit that stores a signal for which the second addition processing is performed by the second adder.

9. The imaging element according to claim 8, wherein the first photoelectric conversion unit and the second photoelectric conversion unit are arranged along a row direction.

10. The imaging element according to claim 8, wherein the first photoelectric conversion unit and the second photoelectric conversion unit are arranged along a column direction.

11. The imaging element according to claim 8, wherein the second chip includes:

a first calculation circuit for reading out the signal for which the first addition processing is performed from the first storage unit; and a second calculation circuit for reading out the signal for which the second addition processing is performed from the second storage unit.

12. The imaging element according to claim 8, wherein the third chip includes:

a first calculation circuit for reading out the signal for which the first addition processing is performed from the first storage unit; and a second calculation circuit for reading out the signal for which the second addition processing is performed from the second storage unit.

13. The imaging element according to claim 1, wherein the third chip includes:

a first storage unit that stores a signal for which the first addition processing is performed by the first adder; and a second storage unit that stores a signal for which the second addition processing is performed by the second adder.

14. The imaging element according to claim 13, wherein the first photoelectric conversion unit and the second photoelectric conversion unit are arranged along a row direction.

15. The imaging element according to claim 13, wherein the first photoelectric conversion unit and the second photoelectric conversion unit are arranged along a column direction.

16. The imaging element according to claim 13, wherein the second chip includes:

a first calculation circuit for reading out the signal for which the first addition processing is performed from the first storage unit; and a second calculation circuit for reading out the signal for which the second addition processing is performed from the second storage unit.

17. The imaging element according to claim 13, wherein the third chip includes:

a first calculation circuit for reading out the signal for which the first addition processing is performed from the first storage unit; and a second calculation circuit for reading out the signal for which the second addition processing is performed from the second storage unit.

18. The imaging element according to claim 1, wherein the third chip includes:

a first drive control unit that controls an accumulation time of the electric charge converted by the first photoelectric conversion unit; and a second drive control unit that controls an accumulation time of the electric charge converted by the second photoelectric conversion unit.

19. The imaging element according to claim 18, wherein the first drive control unit controls the accumulation time of the electric charge converted by the first photoelectric conversion unit based on a signal for which the first addition processing is performed by the first adder, and the second drive control unit controls the accumulation time of the electric charge converted by the second photoelectric conversion unit based on a signal for which the second addition processing is performed by the second adder.

20. The imaging element according to claim 19, wherein the first drive control unit controls the accumulation time of the electric charge converted by the first photoelectric conversion unit to be a first accumulation time, and the second drive control unit controls the accumulation time of the electric charge converted by the second photoelectric conversion unit to be a second accumulation time which is different from the first accumulation time.

21. The imaging element according to claim 19,
wherein the first photoelectric conversion unit and the second photoelectric conversion unit are arranged along a row direction.

22. The imaging element according to claim 19,
wherein the first photoelectric conversion unit and the second photoelectric conversion unit are arranged along a column direction.

23. The imaging element according to claim 18, wherein the first chip includes:
a first transfer unit for transferring the electric charge converted by the first photoelectric conversion unit; and
a second transfer unit for transferring the electric charge converted by the second photoelectric conversion unit,
the first drive control unit controls a timing when the first transfer unit transfers the electric charge converted by the first photoelectric conversion unit, and
the second drive control unit controls a timing when the second transfer unit transfers the electric charge converted by the second photoelectric conversion unit.

24. The imaging element according to claim 23, wherein
the first drive control unit controls the timing when the first transfer unit transfers the electric charge converted by the first photoelectric conversion unit based on a signal for which the first addition processing is performed by the first adder, and
the second drive control unit controls the timing when the second transfer unit transfers the electric charge converted by the second photoelectric conversion unit based on a signal for which the second addition processing is performed by the second adder.

25. The imaging element according to claim 24, wherein
the first drive control unit controls the timing when the first transfer unit transfers the electric charge converted by the first photoelectric conversion unit such that an accumulation time of the electric charge converted by the first photoelectric conversion unit becomes a first accumulation time, and
the second drive control unit controls the timing when the second transfer unit transfers the electric charge converted by the second photoelectric conversion unit such that an accumulation time of the electric charge converted by the second photoelectric conversion unit becomes a second accumulation time which is different from the first accumulation time.

26. The imaging element according to claim 24,
wherein the first photoelectric conversion unit and the second photoelectric conversion unit are arranged along a row direction.

27. The imaging element according to claim 24,
wherein the first photoelectric conversion unit and the second photoelectric conversion unit are arranged along a column direction.

28. The imaging element according to claim 23, wherein
the first drive control unit controls the timing when the first transfer unit transfers the electric charge converted by the first photoelectric conversion unit such that an accumulation time of the electric charge converted by the first photoelectric conversion unit becomes a first accumulation time, and
the second drive control unit controls the timing when the second transfer unit transfers the electric charge converted by the second photoelectric conversion unit such that an accumulation time of the electric charge converted by the second photoelectric conversion unit becomes a second accumulation time which is different from the first accumulation time.

29. The imaging element according to claim 28,
wherein the first photoelectric conversion unit and the second photoelectric conversion unit are arranged along a row direction.

30. The imaging element according to claim 28,
wherein the first photoelectric conversion unit and the second photoelectric conversion unit are arranged along a column direction.

31. The imaging element according to claim 23, wherein the first chip includes:
a first reset unit that discharges the electric charge converted by the first photoelectric conversion unit; and
a second reset unit that discharges the electric charge converted by the second photoelectric conversion unit,
the first drive control unit controls a timing when the first reset unit discharges the electric charge converted by the first photoelectric conversion unit, and
the second drive control unit controls a timing when the second reset unit discharges the electric charge converted by the second photoelectric conversion unit.

32. The imaging element according to claim 31, wherein
the first drive control unit controls the timing when the first transfer unit transfers the electric charge converted by the first photoelectric conversion unit and the timing when the first reset unit discharges the electric charge converted by the first photoelectric conversion unit based on a signal for which the first addition processing is performed by the first adder, and
the second drive control unit controls the timing when the second transfer unit transfers the electric charge converted by the second photoelectric conversion unit and the timing when the second reset unit discharges the electric charge converted by the second photoelectric conversion unit based on a signal for which the second addition processing is performed by the second adder.

33. The imaging element according to claim 32, wherein
the first drive control unit controls the timing when the first reset unit discharges the electric charge converted by the first photoelectric conversion unit and the timing when the first transfer unit transfers the electric charge converted by the first photoelectric conversion unit such that an accumulation time of the electric charge converted by the first photoelectric conversion unit becomes a first accumulation time, and
the second drive control unit controls the timing when the second reset unit discharges the electric charge converted by the second photoelectric conversion unit and the timing when the second transfer unit transfers the electric charge converted by the second photoelectric conversion unit such that an accumulation time of the electric charge converted by the second photoelectric conversion unit becomes a second accumulation time which is different from the first accumulation time.

34. The imaging element according to claim 32,
wherein the first photoelectric conversion unit and the second photoelectric conversion unit are arranged along a row direction.

35. The imaging element according to claim 32,
wherein the first photoelectric conversion unit and the second photoelectric conversion unit are arranged along a column direction.

36. The imaging element according to claim 31, wherein
the first drive control unit controls the timing when the first reset unit discharges the electric charge converted by the first photoelectric conversion unit and the timing when the first transfer unit transfers the electric charge converted by the first photoelectric conversion unit such that an accumulation time of the electric charge converted by the first photoelectric conversion unit becomes a first accumulation time, and
the second drive control unit controls the timing when the second reset unit discharges the electric charge converted by the second photoelectric conversion unit and the timing when the second transfer unit transfers the electric charge converted by the second photoelectric conversion unit such that an accumulation time of the electric charge converted by the second photoelectric conversion unit becomes a second accumulation time which is different from the first accumulation time.

37. The imaging element according to claim 36, wherein the first photoelectric conversion unit and the second photoelectric conversion unit are arranged along a row direction.

38. The imaging element according to claim 36, wherein the first photoelectric conversion unit and the second photoelectric conversion unit are arranged along a column direction.

39. The imaging element according to claim 18, wherein the first chip includes:
- a first reset unit that discharges the electric charge converted by the first photoelectric conversion unit; and
- a second reset unit that discharges the electric charge converted by the second photoelectric conversion unit, the first drive control unit controls a timing when the first reset unit discharges the electric charge converted by the first photoelectric conversion unit, and
the second drive control unit controls a timing when the second reset unit discharges the electric charge converted by the second photoelectric conversion unit.

40. The imaging element according to claim 39, wherein
the first drive control unit controls the timing when the first reset unit discharges the electric charge converted by the first photoelectric conversion unit based on a signal for which the first addition processing is performed by the first adder, and
the second drive control unit controls the timing when the second reset unit discharges the electric charge converted by the second photoelectric conversion unit based on a signal for which the second addition processing is performed by the second adder.

41. The imaging element according to claim 40, wherein
the first drive control unit controls the timing when the first reset unit discharges the electric charge converted by the first photoelectric conversion unit such that an accumulation time of the electric charge converted by the first photoelectric conversion unit becomes a first accumulation time, and
the second drive control unit controls the timing when the second reset unit discharges the electric charge converted by the second photoelectric conversion unit such that an accumulation time of the electric charge converted by the second photoelectric conversion unit becomes a second accumulation time which is different from the first accumulation time.

42. The imaging element according to claim 40, wherein the first photoelectric conversion unit and the second photoelectric conversion unit are arranged along a row direction.

43. The imaging element according to claim 40, wherein the first photoelectric conversion unit and the second photoelectric conversion unit are arranged along a column direction.

44. The imaging element according to claim 39, wherein
the first drive control unit controls the timing when the first reset unit discharges the electric charge converted by the first photoelectric conversion unit such that an accumulation time of the electric charge converted by the first photoelectric conversion unit becomes a first accumulation time, and
the second drive control unit controls the timing when the second reset unit discharges the electric charge converted by the second photoelectric conversion unit such that an accumulation time of the electric charge converted by the second photoelectric conversion unit becomes a second accumulation time which is different from the first accumulation time.

45. The imaging element according to claim 44, wherein the first photoelectric conversion unit and the second photoelectric conversion unit are arranged along a row direction.

46. The imaging element according to claim 44, wherein the first photoelectric conversion unit and the second photoelectric conversion unit are arranged along a column direction.

47. The imaging element according to claim 1, wherein
the first chip includes a third photoelectric conversion unit which converts light into an electric charge,
the second chip includes a third conversion unit which converts a third signal based on the electric charge converted by the third photoelectric conversion unit into a digital signal,
the third chip includes a third adder which performs a third addition processing on the third signal converted into the digital signal by the third conversion unit,
the second photoelectric conversion unit is arranged to be aligned with the first photoelectric conversion unit in a first direction, and
the third photoelectric conversion unit is arranged to be aligned with the first photoelectric conversion unit in a second direction that crosses the first direction.

48. The imaging element according to claim 47, wherein the first chip includes:
- a semiconductor layer in which the first photoelectric conversion unit, the second photoelectric conversion unit, and the third photoelectric conversion unit are arranged, and
- a wiring layer in which a first output wiring to which the first signal is output, a second output wiring to which the second signal is output, and a third output wiring to which the third signal is output are arranged, and the wiring layer is arranged between the semiconductor layer and the second chip in a direction in which the first chip and the second chip are laminated.

49. The imaging element according to claim 48, comprising:
- a first conductive unit which is a connection unit that electrically connects the first chip and the second chip together and to which the first signal from the first output wiring toward the first conversion unit is output;

a second conductive unit which is a connection unit that electrically connects the first chip and the second chip together and to which the second signal from the second output wiring toward the second conversion unit is output; and a third conductive unit which is a connection unit that electrically connects the first chip and the second chip together and to which the third signal from the third output wiring toward the third conversion unit is output.

50. The imaging element according to claim 49,
wherein the first conductive unit, the second conductive unit, and the third conductive unit include a metal member including a copper.

51. The imaging element according to claim 47, wherein
the first adder performs the first addition processing by using a fourth signal generated by the electric charge converted by the first photoelectric conversion unit before the first signal,
the second adder performs the second addition processing by using a fifth signal generated by the electric charge converted by the second photoelectric conversion unit before the second signal, and
the third adder performs the third addition processing by using a sixth signal generated by the electric charge converted by the third photoelectric conversion unit before the third signal.

52. The imaging element according to claim 51, wherein the third chip includes:
    a first storage unit that stores a signal for which the first addition processing is performed by the first adder;
    a second storage unit that stores a signal for which the second addition processing is performed by the second adder; and
    a third storage unit that stores a signal for which the third addition processing is performed by the third adder.

53. The imaging element according to claim 52, wherein the second chip includes:
    a first calculation circuit for reading out the signal for which the first addition processing is performed from the first storage unit;
    a second calculation circuit for reading out the signal for which the second addition processing is performed from the second storage unit; and
    a third calculation circuit for reading out the signal for which the third addition processing is performed from the third storage unit.

54. The imaging element according to claim 52, wherein the third chip includes:
    a first calculation circuit for reading out the signal for which the first addition processing is performed from the first storage unit;
    a second calculation circuit for reading out the signal for which the second addition processing is performed from the second storage unit; and
    a third calculation circuit for reading out the signal for which the third addition processing is performed from the third storage unit.

55. The imaging element according to claim 47, wherein the third chip includes:
    a first storage unit that stores a signal for which the first addition processing is performed by the first adder;
    a second storage unit that stores a signal for which the second addition processing is performed by the second adder; and
    a third storage unit that stores a signal for which the third addition processing is performed by the third adder.

56. The imaging element according to claim 55, wherein the second chip includes:
    a first calculation circuit for reading out the signal for which the first addition processing is performed from the first storage unit;
    a second calculation circuit for reading out the signal for which the second addition processing is performed from the second storage unit; and
    a third calculation circuit for reading out the signal for which the third addition processing is performed from the third storage unit.

57. The imaging element according to claim 55,
wherein the third chip includes:
    a first calculation circuit for reading out the signal for which the first addition processing is performed from the first storage unit;
    a second calculation circuit for reading out the signal for which the second addition processing is performed from the second storage unit; and
    a third calculation circuit for reading out the signal for which the third addition processing is performed from the third storage unit.

58. The imaging element according to claim 47,
wherein the third chip includes:
    a first drive control unit that controls an accumulation time of the electric charge converted by the first photoelectric conversion unit;
    a second drive control unit that controls an accumulation time of the electric charge converted by the second photoelectric conversion unit; and
    a third drive control unit that controls an accumulation time of the electric charge converted by the third photoelectric conversion unit.

59. The imaging element according to claim 58, wherein
the first drive control unit controls the accumulation time of the electric charge converted by the first photoelectric conversion unit based on a signal for which the first addition processing is performed by the first adder,
the second drive control unit controls the accumulation time of the electric charge converted by the second photoelectric conversion unit based on a signal for which the second addition processing is performed by the second adder, and
the third drive control unit controls the accumulation time of the electric charge converted by the third photoelectric conversion unit based on a signal for which the third addition processing is performed by the third adder.

60. The imaging element according to claim 59, wherein
the first drive control unit controls the accumulation time of the electric charge converted by the first photoelectric conversion unit to be a first accumulation time, and
the second drive control unit controls the accumulation time of the electric charge converted by the second photoelectric conversion unit to be a second accumulation time which is different from the first accumulation time.

61. The imaging element according to claim 60,
wherein the third drive control unit controls the accumulation time of the electric charge converted by the third photoelectric conversion unit to be a third accumulation time which is different from the first accumulation time.

62. The imaging element according to claim 58, wherein the first chip includes:
- a first transfer unit for transferring the electric charge converted by the first photoelectric conversion unit;
- a second transfer unit for transferring the electric charge converted by the second photoelectric conversion unit; and
- a third transfer unit for transferring the electric charge converted by the third photoelectric conversion unit, the first drive control unit controls a timing when the first transfer unit transfers the electric charge converted by the first photoelectric conversion unit, the second drive control unit controls a timing when the second transfer unit transfers the electric charge converted by the second photoelectric conversion unit, and the third drive control unit controls a timing when the third transfer unit transfers the electric charge converted by the third photoelectric conversion unit.

63. The imaging element according to claim 62, wherein the first drive control unit controls the timing when the first transfer unit transfers the electric charge converted by the first photoelectric conversion unit based on a signal for which the first addition processing is performed by the first adder, the second drive control unit controls the timing when the second transfer unit transfers the electric charge converted by the second photoelectric conversion unit based on a signal for which the second addition processing is performed by the second adder, and the third drive control unit controls the timing when the third transfer unit transfers the electric charge converted by the third photoelectric conversion unit based on a signal for which the third addition processing is performed by the third adder.

64. The imaging element according to claim 63, wherein the first drive control unit controls the timing when the first transfer unit transfers the electric charge converted by the first photoelectric conversion unit such that an accumulation time of the electric charge converted by the first photoelectric conversion unit becomes a first accumulation time, and the second drive control unit controls the timing when the second transfer unit transfers the electric charge converted by the second photoelectric conversion unit such that an accumulation time of the electric charge converted by the second photoelectric conversion unit becomes a second accumulation time which is different from the first accumulation time.

65. The imaging element according to claim 64,
wherein the third drive control unit controls the timing when the third transfer unit transfers the electric charge converted by the third photoelectric conversion unit such that an accumulation time of the electric charge converted by the third photoelectric conversion unit becomes a third accumulation time which is different from the first accumulation time.

66. The imaging element according to claim 62, wherein the first drive control unit controls the timing when the first transfer unit transfers the electric charge converted by the first photoelectric conversion unit such that an accumulation time of the electric charge converted by the first photoelectric conversion unit becomes a first accumulation time, and the second drive control unit controls the timing when the second transfer unit transfers the electric charge converted by the second photoelectric conversion unit such that an accumulation time of the electric charge converted by the second photoelectric conversion unit becomes a second accumulation time which is different from the first accumulation time.

67. The imaging element according to claim 66,
wherein the third drive control unit controls the timing when the third transfer unit transfers the electric charge converted by the third photoelectric conversion unit such that an accumulation time of the electric charge converted by the third photoelectric conversion unit becomes a third accumulation time which is different from the first accumulation time.

68. The imaging element according to claim 62, wherein the first chip includes:
- a first reset unit that discharges the electric charge converted by the first photoelectric conversion unit;
- a second reset unit that discharges the electric charge converted by the second photoelectric conversion unit; and
- a third reset unit that discharges the electric charge converted by the third photoelectric conversion unit, the first drive control unit controls a timing when the first reset unit discharges the electric charge converted by the first photoelectric conversion unit, the second drive control unit controls a timing when the second reset unit discharges the electric charge converted by the second photoelectric conversion unit, and the third drive control unit controls a timing when the third reset unit discharges the electric charge converted by the third photoelectric conversion unit.

69. The imaging element according to claim 68, wherein the first drive control unit controls the timing when the first transfer unit transfers the electric charge converted by the first photoelectric conversion unit and the timing when the first reset unit discharges the electric charge converted by the first photoelectric conversion unit based on a signal for which the first addition processing is performed by the first adder, the second drive control unit controls the timing when the second transfer unit transfers the electric charge converted by the second photoelectric conversion unit and the timing when the second reset unit discharges the electric charge converted by the second photoelectric conversion unit based on a signal for which the second addition processing is performed by the second adder, and the third drive control unit controls the timing when the third transfer unit transfers the electric charge converted by the third photoelectric conversion unit and the timing when the third reset unit discharges the electric charge converted by the third photoelectric conversion unit based on a signal for which the third addition processing is performed by the third adder.

70. The imaging element according to claim 69, wherein the first drive control unit controls the timing when the first reset unit discharges the electric charge converted by the first photoelectric conversion unit and the timing when the first transfer unit transfers the electric charge converted by the first photoelectric conversion unit such that an accumulation time of the electric charge converted by the first photoelectric conversion unit becomes a first accumulation time, and the second drive control unit controls the timing when the second reset unit discharges the electric charge converted by the second photoelectric conversion unit and the timing when the second transfer unit transfers the electric charge converted by the second photoelectric conversion unit such that an accumulation time of the electric charge converted by the second photoelectric conversion unit becomes a second accumulation time which is different from the first accumulation time.

71. The imaging element according to claim 70, wherein the third drive control unit controls the timing when the third reset unit discharges the electric charge converted by the third photoelectric conversion unit and the timing when the third transfer unit transfers the electric charge converted by the third photoelectric conversion unit such that an accumulation time of the electric charge converted by the third photoelectric conversion unit becomes a third accumulation time which is different from the first accumulation time.

72. The imaging element according to claim 68, wherein the first drive control unit controls the timing when the first reset unit discharges the electric charge converted by the first photoelectric conversion unit and the timing when the first transfer unit transfers the electric charge converted by the first photoelectric conversion unit such that an accumulation time of the electric charge converted by the first photoelectric conversion unit becomes a first accumulation time, and the second drive control unit controls the timing when the second reset unit discharges the electric charge converted by the second photoelectric conversion unit and the timing when the second transfer unit transfers the electric charge converted by the second photoelectric conversion unit such that an accumulation time of the electric charge converted by the second photoelectric conversion unit becomes a second accumulation time which is different from the first accumulation time.

73. The imaging element according to claim 72, wherein the third drive control unit controls the timing when the third reset unit discharges the electric charge converted by the third photoelectric conversion unit and the timing when the third transfer unit transfers the electric charge converted by the third photoelectric conversion unit such that an accumulation time of the electric charge converted by the third photoelectric conversion unit becomes a third accumulation time which is different from the first accumulation time.

74. The imaging element according to claim 58, wherein the first chip includes:
    a first reset unit that discharges the electric charge converted by the first photoelectric conversion unit;
    a second reset unit that discharges the electric charge converted by the second photoelectric conversion unit; and
    a third reset unit that discharges the electric charge converted by the third photoelectric conversion unit,
the first drive control unit controls a timing when the first reset unit discharges the electric charge converted by the first photoelectric conversion unit,
the second drive control unit controls a timing when the second reset unit discharges the electric charge converted by the second photoelectric conversion unit, and
the third drive control unit controls a timing when the third reset unit discharges the electric charge converted by the third photoelectric conversion unit.

75. The imaging element according to claim 74, wherein the first drive control unit controls the timing when the first reset unit discharges the electric charge converted by the first photoelectric conversion unit based on a signal for which the first addition processing is performed by the first adder,
the second drive control unit controls the timing when the second reset unit discharges the electric charge converted by the second photoelectric conversion unit based on a signal for which the second addition processing is performed by the second adder, and
the third drive control unit controls the timing when the third reset unit discharges the electric charge converted by the third photoelectric conversion unit based on a signal for which the third addition processing is performed by the third adder.

76. The imaging element according to claim 75, wherein the first drive control unit controls the timing when the first reset unit discharges the electric charge converted by the first photoelectric conversion unit such that an accumulation time of the electric charge converted by the first photoelectric conversion unit becomes a first accumulation time, and
the second drive control unit controls the timing when the second reset unit discharges the electric charge converted by the second photoelectric conversion unit such that an accumulation time of the electric charge converted by the second photoelectric conversion unit becomes a second accumulation time which is different from the first accumulation time.

77. The imaging element according to claim 76, wherein the third drive control unit controls the timing when the third reset unit discharges the electric charge converted by the third photoelectric conversion unit such that an accumulation time of the electric charge converted by the third photoelectric conversion unit becomes a third accumulation time which is different from the first accumulation time.

78. The imaging element according to claim 74, wherein the first drive control unit controls the timing when the first reset unit discharges the electric charge converted by the first photoelectric conversion unit such that an accumulation time of the electric charge converted by the first photoelectric conversion unit becomes a first accumulation time, and
the second drive control unit controls the timing when the second reset unit discharges the electric charge converted by the second photoelectric conversion unit such that an accumulation time of the electric charge converted by the second photoelectric conversion unit becomes a second accumulation time which is different from the first accumulation time.

79. The imaging element according to claim 78, wherein the third drive control unit controls the timing when the third reset unit discharges the electric charge converted by the third photoelectric conversion unit such that an accumulation time of the electric charge converted by the third photoelectric conversion unit becomes a third accumulation time which is different from the first accumulation time.

80. An imaging device, comprising:
the imaging element according to claim 1.
81. An imaging device, comprising:
the imaging element according to claim 2.
82. An imaging device, comprising:
the imaging element according to claim 7.
83. An imaging device, comprising:
the imaging element according to claim 13.
84. An imaging device, comprising:
the imaging element according to claim 18.
85. An imaging device, comprising:
the imaging element according to claim 19.
86. An imaging device, comprising:
the imaging element according to claim 23.

87. An imaging device, comprising:
the imaging element according to claim 39.
88. An imaging device, comprising:
the imaging element according to claim 47.
89. An imaging device, comprising:
the imaging element according to claim 48.
90. An imaging device, comprising:
the imaging element according to claim 51.
91. An imaging device, comprising:
the imaging element according to claim 55.
92. An imaging device, comprising:
the imaging element according to claim 58.

* * * * *